United States Patent [19]
Toda

[11] Patent Number: 5,973,438
[45] Date of Patent: Oct. 26, 1999

[54] ULTRASONIC SWITCHING DEVICE

[76] Inventor: Kohji Toda, 1-49-18 Futaba, Yokosuka 239, Japan

[21] Appl. No.: 09/023,192

[22] Filed: Feb. 13, 1998

[51] Int. Cl.$^6$ ............................. H03H 9/76; H01L 41/047
[52] U.S. Cl. ................................... 310/313 B; 310/313 R
[58] Field of Search ............................ 310/313 R, 313 B

[56] References Cited

U.S. PATENT DOCUMENTS

| | | | |
|---|---|---|---|
| 3,723,916 | 3/1973 | Speiser et al. | 333/30 |
| 3,931,597 | 1/1976 | Cho | 333/30 R |
| 4,028,649 | 6/1977 | Komatsu et al. | 333/72 |
| 4,081,769 | 3/1978 | Shreve | 333/72 |
| 5,453,652 | 9/1995 | Eda et al. | 310/313 R |
| 5,679,998 | 10/1997 | Toda | 310/313 R |
| 5,767,604 | 6/1998 | Toda | 310/313 R |
| 5,767,608 | 6/1998 | Toda | 310/313 R |
| 5,771,206 | 6/1998 | Toda | 367/118 |

OTHER PUBLICATIONS

Moulic, Surface Acoustic Wave Device, IBM tech. disc. bulletin, vol. 20 No. 11B, pp.4756, 4757, Apr. 1978.

*Primary Examiner*—Thomas M. Dougherty

[57] ABSTRACT

An ultrasonic switching device comprising a piezoelectric substrate, an input- and an output interdigital transducers formed on an upper end surface of the piezoelectric substrate, and a nonpiezoelectric plate, a lower end surface of the nonpiezoelectric plate being cemented on the upper end surface of the piezoelectric substrate. The output interdigital transducer has a finger-overlap zone $R_i$ (i=1), or has N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$. Each finger-overlap zone $R_i$ comprises three zones $R_{ia}$, $R_{ib}$ and $R_{im}$. The finger direction of the zones $R_{ia}$ and $R_{ib}$ runs parallel with that of the input interdigital transducer. The finger direction of the zone $R_{im}$ is slanting to that of the input interdigital transducer by an angle $\alpha$. The finger direction of the finger-overlap zone $Q_i$ is slanting to that of the input interdigital transducer by an angle $\pm\beta$. The input- and output interdigital transducers form N pairs of ultrasound propagation lanes $Z_{ia}$ and $Z_{ib}$ (i=1, 2, ..., N), on the upper end surface of the nonpiezoelectric plate. If an ultrasound on an ultrasound propagation lane $Z_{xa}$ attenuates by touching with a finger or others on the upper end surface of the nonpiezoelectric plate, an electric signal $E_{xb}$ corresponding to an ultrasound propagation lane $Z_{xb}$ is delivered at the output interdigital transducer.

34 Claims, 33 Drawing Sheets

5,973,438

ULTRASONIC SWITCHING DEVICE

BACKGROUND OF THE INVENTION

1. Field of the Invention

The present invention relates to an ultrasonic switching device delivering an electric signal by touching a surface of a nonpiezoelectric plate.

2. Description of the Prior Art

Conventional methods for exciting an acoustic vibration on a nonpiezoelectric plate generally include a wedge-shaped transducer with a bulk wave vibrator for vibrating a nonpiezoelectric plate indirectly, or a piezoelectric thin film transducer for vibrating a nonpiezoelectric plate directly. These conventional-type transducers are applied to, for example, touch panels making use of decreasing or disappearance of output electric signal in accordance with decreasing or disappearance of an acoustic wave on a nonpiezoelectric plate when touching thereon. Such touch panels cause a high voltage operation with a high power consumption, a large-scale circuit with a complicated structure, and a difficulty on remote control. Moreover, there are some problems on manufacturing and operation frequencies.

Thus, it was difficult to apply the conventional-type transducers to a switching device delivering an electric signal by touching a surface of a nonpiezoelectric plate.

SUMMARY OF THE INVENTION

An object of the present invention is to provide an ultrasonic switching device capable of delivering an electric signal by touching a surface of a nonpiezoelectric plate with a high sensitivity and a quick response time.

Another object of the present invention is to provide an ultrasonic switching device excellent in manufacturing.

Another object of the present invention is to provide an ultrasonic switching device operating under low power consumption with low voltage.

A still other object of the present invention is to provide an ultrasonic switching device having a small-sized circuit with a simple structure which is very light in weight.

A still further object of the present invention is to provide an ultrasonic switching device capable of remote control.

According to one aspect of the present invention there is provided an ultrasonic switching device including a first- or a second structure with respect to interdigital transducers.

The first structure has the input interdigital transducer with an interdigital periodicity P and an overlap length L, and the output interdigital transducer having a finger-overlap zone $R_i$ (i=1), or having N finger-overlap zones $R_i$ (i=1, 2, . . . , N) and N−1 finger-overlap zones $Q_i$ {i=1, 2, . . . , (N−1)} between two finger-overlap zones $R_i$ and $R_{(i+1)}$. Each finger-overlap zone $R_i$ comprises a first zone $R_{ia}$, a second zone $R_{ib}$, and a third zone $R_{im}$ between the zones $R_{ia}$ and $R_{ib}$. The finger direction of the zones $R_{ia}$ and $R_{ib}$, runs parallel with that of the input interdigital transducer. An interdigital periodicity of the zones $R_{ia}$ and $R_{ib}$ is equal to the interdigital periodicity P. The finger direction of the zone $R_{im}$ is slanting to that of the input interdigital transducer by an angle α. An interdigital periodicity $P_{RN}$ along the vertical direction to the finger direction of the zone $R_{im}$ is equal to the product of the interdigital periodicity P and cos α. The zone $R_{im}$ has a first overlap length $L_{RP}$ along the finger direction thereof and a second overlap length $L_{RN}$ along the finger direction of the input interdigital transducer. The overlap length $L_{RP}$ is equal to the product of the overlap length $L_{RN}$ and sec α as well as the product of half the interdigital periodicity P and cosec α. The finger direction of the finger-overlap zone $Q_i$ is slanting to that of the input interdigital transducer by an angle ±β. An interdigital periodicity $P_{QN}$ along the vertical direction to the finger direction of the finger-overlap zone $Q_i$ is equal to the product of the interdigital periodicity P and cos β. The finger-overlap zone $Q_i$ has a first overlap length $L_{QP}$ along the finger direction thereof and a second overlap length $L_{QN}$ along the finger direction of the input interdigital transducer. The overlap length $L_{QP}$ is equal to the product of the overlap length $L_{QN}$ and sec β. The overlap length $L_{QP}$ is also equal to the product of cosec β and the interdigital periodicity P divided by twice the number N of the finger-overlap zones $R_i$. For example, if N=2, the overlap length $L_{QP}$ is not only equal to the product of the overlap length $L_{QN}$ and sec β, but also equal to the product of P/4 and cosec β.

The second structure has the input interdigital transducer with N finger-overlap zones $A_i$ (i=1, 2, . . . , N) and N−1 finger-overlap zones $B_i$ {i=1, 2, . . . , (N−1)} between two finger-overlap zones $A_i$ and $A_{(i+1)}$, and the output interdigital transducer with N+1 finger-overlap zones $C_i$ {i=1, 2, . . . , (N+1)} and N finger-overlap zones $D_i$ (i=1, 2, . . . , N) between two finger-overlap zones $C_i$ and $C_{(i+1)}$. The finger direction of the finger-overlap zones $A_i$ runs parallel with that of the finger-overlap zones $C_i$. The finger direction of the finger-overlap zones $B_i$ is slanting to that of the finger-overlap zones $A_i$ by an angle −β. An interdigital periodicity $P_{BN}$ along the vertical direction to the finger direction of the finger-overlap zones $B_i$ is equal to the product of cos β and an interdigital periodicity P of the finger-overlap zones $A_i$ and $C_i$. Each finger-overlap zone $B_i$ has a first overlap length $L_{BP}$ along the finger direction thereof and a second overlap length $L_{BN}$ along the finger direction of the finger-overlap zones $A_i$. The overlap length $L_{BP}$ is equal to the product of sec β and the overlap length $L_{BN}$. The overlap length $L_{BP}$ is also equal to the product of cosec β and the interdigital periodicity P divided by twice the number N of the finger-overlap zones $A_i$. For example, if N=2, the overlap length $L_{BP}$ is not only equal to the product of the overlap length $L_{BN}$ and sec β, but also equal to the product of P/4 and cosec β. The finger direction of the finger-overlap zones $D_i$ is slanting to that of the finger-overlap zones $C_i$ by an angle α. An interdigital periodicity $P_{DN}$ along the vertical direction to the finger direction of the finger-overlap zones $D_i$ is equal to the product of cos α and the interdigital periodicity P. Each finger-overlap zone $D_i$ has a first overlap length $L_{DP}$ along the finger direction thereof and a second overlap length $L_{DN}$ along the finger direction of the finger-overlap zones $C_i$. The overlap length $L_{DP}$ is equal to the product of sec α and the overlap length $L_{DN}$ as well as the product of half the interdigital periodicity P and cosec α, that is the product of P/2 and cosec α.

According to another aspect of the present invention there is provided an ultrasonic switching device comprising a piezoelectric substrate having an upper- and a lower end surfaces running perpendicular to the direction of the thickness d thereof, an input interdigital transducer formed on the upper end surface of the piezoelectric substrate, an output interdigital transducer formed on the upper end surface of the piezoelectric substrate, and a nonpiezoelectric plate having an upper- and a lower end surfaces running perpendicular to the direction of the thickness h thereof. The lower end surface of the nonpiezoelectric plate is cemented on the upper end surface of the piezoelectric substrate through the input- and output interdigital transducers. The thickness d is larger than three times the interdigital periodicity P. The polarization axis of the piezoelectric substrate is parallel to the direction of the thickness d. The thickness h is smaller than the interdigital periodicity P. The nonpiezoelectric plate is made of a material such that the phase velocity of the surface acoustic wave traveling on the nonpiezoelectric plate alone is lower than that traveling on the piezoelectric substrate alone.

When an electric signal with a frequency approximately corresponding to the interdigital periodicity P is applied to the input interdigital transducer, a surface acoustic wave of the zeroth mode and the higher order modes is excited on an area, in contact with the input interdigital transducer, of the upper end surface of the piezoelectric substrate. The surface acoustic wave having the wavelength approximately equal to the interdigital periodicity P is transmitted to an area, in contact with the output interdigital transducer, of the upper end surface of the piezoelectric substrate, through the nonpiezoelectric plate. The phase velocity of the surface acoustic wave of the zeroth mode is approximately equal to the phase velocity of the Rayleigh wave traveling on the piezoelectric substrate alone under the electrically shorted condition, and the phase velocity of the surface acoustic wave of the higher order modes is approximately equal to the phase velocity of the Rayleigh wave traveling on the piezoelectric substrate alone under the electrically opened condition.

In case of the first structure with respect to interdigital transducers, the surface acoustic wave is transduced to electric signals $E_{ia}$ and $E_{ib}$ (i=1, 2, . . . , N), at zones $R_{ia}$ and $R_{ib}$, respectively. The sum of the electric signals $E_{ia}$ and $E_{ib}$ is zero, because that the overlap length $L_{RP}$ is equal to the product of the overlap length $L_{RN}$ and sec $\alpha$ as well as the product of P/2 and cosec $\alpha$. The input- and output interdigital transducers form N pairs of ultrasound propagation lanes $Z_{ia}$ and $Z_{ib}$ (i=1, 2, . . . , N), on the upper end surface of the nonpiezoelectric plate, corresponding to the zones $R_{ia}$ and $R_{ib}$, respectively. If an ultrasound on an ultrasound propagation lane $Z_{xa}$ of the ultrasound propagation lanes $Z_{ia}$ attenuates by touching with a finger or others on the upper end surface of the nonpiezoelectric plate, an electric signal $E_{xb}$ corresponding to an ultrasound propagation lane $Z_{xb}$ of the ultrasound propagation lanes $Z_{ib}$ is delivered at the output interdigital transducer, the ultrasound propagation lanes $Z_{xa}$ and $Z_{xb}$ making a pair. If the ultrasound on the ultrasound propagation lane $Z_{xb}$ attenuates by touching on the upper end surface of the nonpiezoelectric plate, an electric signal $E_{xa}$ corresponding to the ultrasound propagation lane $Z_{xa}$ is delivered at the output interdigital transducer. As a result, the choice of touch-positions on the upper end surface of the nonpiezoelectric plate gives the favorite output electric signal $E_{ia}$ or $E_{ib}$ at the output interdigital transducer. Thus, the ultrasonic switching device has a switching ability.

In case of the second structure with respect to interdigital transducers, the surface acoustic wave is transduced to N electric signals $E_{ia}$ (i=1, 2, . . . , N) and N electric signals $E_{ib}$ (i=1, 2, . . . , N), respectively. The sum of the electric signals $E_{ia}$ and $E_{ib}$ is zero, because that the overlap length $L_{DP}$ is equal to the product of sec $\alpha$ and the overlap length $L_{DN}$ as well as the product of P/2 and cosec $\alpha$. The input- and output interdigital transducers form N pairs of ultrasound propagation lanes $Z_{ia}$ and $Z_{ib}$ (i=1, 2, . . . , N) on the upper end surface of the nonpiezoelectric plate, an ultrasound propagation lane $Z_{ia}$ existing between the finger-overlap zones $A_i$ and $C_i$, an ultrasound propagation lane $Z_{ib}$ existing between the finger-overlap zones $A_i$ and $C_{(i+1)}$. If an ultrasound on an ultrasound propagation lane $Z_{xa}$ of the ultrasound propagation lanes $Z_{ia}$ attenuates by touching on the upper end surface of the nonpiezoelectric plate, an electric signal $E_{xb}$ corresponding to an ultrasound propagation lane $Z_{xb}$ of the ultrasound propagation lanes $Z_{ib}$ is delivered at the output interdigital transducer, the ultrasound propagation lanes $Z_{xa}$ and $Z_{xb}$ making a pair. If the ultrasound on the ultrasound propagation lane $Z_{xb}$ attenuates by touching on the upper end surface of the nonpiezoelectric plate, an electric signal $E_{xa}$ corresponding to the ultrasound propagation lane $Z_{xa}$ is delivered at the output interdigital transducer. As a result, the choice of touch-positions on the upper end surface of the nonpiezoelectric plate gives the favorite output electric signal $E_{ia}$ or $E_{ib}$ at the output interdigital transducer. Thus, the ultrasonic switching device has a switching ability.

According to another aspect of the present invention there is provided an ultrasonic switching device comprising a first piezoelectric substrate having two end surfaces running perpendicular to the direction of the thickness d thereof, a second piezoelectric substrate having two end surfaces running perpendicular to the direction of the thickness d thereof, an input interdigital transducer formed on one end surface of the first piezoelectric substrate, an output interdigital transducer formed on one end surface of the second piezoelectric substrate, and a nonpiezoelectric plate having an upper- and a lower end surfaces running perpendicular to the direction of the thickness h thereof. The first- and second piezoelectric substrates are cemented on the upper end surface of the nonpiezoelectric plate. The thickness d is smaller than the interdigital periodicity P. The polarization axis of the first- and second piezoelectric substrates are parallel to the direction of the thickness d. The thickness h is larger than three times the interdigital periodicity P. The nonpiezoelectric plate ia made of a material such that the phase velocity of the surface acoustic wave traveling on the nonpiezoelectric plate alone is higher than that traveling on the first- and second piezoelectric substrates alone.

When an electric signal is applied to the input interdigital transducer, a surface acoustic wave of the first mode and the higher order modes is excited in the first piezoelectric substrate, and transmitted to the second piezoelectric substrate through the upper end surface of the nonpiezoelectric plate. The phase velocity of the surface acoustic wave of the first mode and the higher order modes is approximately equal to the phase velocity of the Rayleigh wave traveling on the nonpiezoelectric plate alone. In case of the first structure with respect to interdigital transducers, the surface acoustic wave is transduced to electric signals $E_{ia}$ and $E_{ib}$, at zones $R_{ia}$ and $R_{ib}$, respectively. The input- and output interdigital transducers form N pairs of ultrasound propagation lanes $Z_{ia}$ and $Z_{ib}$ on the upper end surface of the nonpiezoelectric plate. In case of the second structure with respect to interdigital transducers, the surface acoustic wave is transduced to N electric signals $E_{ia}$ and N electric signals $E_{ib}$. The input- and output interdigital transducers form N pairs of ultrasound propagation lanes $Z_{ia}$ and $Z_{ib}$ on the upper end surface of the nonpiezoelectric plate. If an ultrasound on an ultrasound propagation lane $Z_{xa}$ attenuates by touching on the upper end surface of the nonpiezoelectric plate, an electric signal $E_{xb}$ is delivered at the output interdigital transducer. If the ultrasound on the ultrasound propagation lane $Z_{xb}$ attenuates, an electric signal $E_{xa}$ is delivered at the output interdigital transducer.

According to another aspect of the present invention there is provided an ultrasonic switching device comprising a first piezoelectric substrate having two end surfaces running perpendicular to the direction of the thickness d thereof, a second piezoelectric substrate having two end surfaces running perpendicular to the direction of the thickness d thereof, an input interdigital transducer formed on one end surface of the first piezoelectric substrate, an output interdigital transducer formed on one end surface of the second piezoelectric substrate, and a nonpiezoelectric plate having an upper- and a lower end surfaces running perpendicular to the direction of the thickness h thereof. The thickness d is smaller than the interdigital periodicity P. The polarization axis of the first- and second piezoelectric substrates is parallel to the direction of the thickness d. If the nonpiezoelectric plate is made of a material such that the phase velocity of the elastic wave traveling on the nonpiezoelectric plate alone is higher than that traveling on the first- and second piezoelectric substrates alone, the thickness h is smaller than the thickness d. If the nonpiezoelectric plate is made of a material such that the phase velocity of the elastic wave traveling on the nonpiezoelectric plate alone is approximately equal to that traveling on the first- and second piezoelectric substrates alone, the thickness h is approximately equal to the thickness d. If the nonpiezoelectric plate is made of a material such that the phase velocity of the elastic wave traveling on the nonpiezoelectric plate alone is lower than that traveling on the first- and second piezoelectric substrates alone, the thickness h is not only larger than the thickness d but also smaller than two times the thickness d. The first- and second piezoelectric substrates are cemented on the upper- or lower end surface of the nonpiezoelectric plate. A part, adjacent to the first piezoelectric substrate, of the nonpiezoelectric plate, and the first piezoelectric substrate form a bilayer zone $B_T$. A part, adjacent to the second piezoelectric substrate, of the nonpiezoelectric plate, and the second piezoelectric substrate form a bilayer zone $B_R$. A remaining part, between the bilayer zones $B_T$ and $B_R$, of the nonpiezoelectric plate forms a monolayer zone.

When an electric signal is applied to the input interdigital transducer, an elastic wave of the $S_0$ mode and the higher order modes is excited in the bilayer zone $B_T$, and transmitted to the bilayer zone $B_R$ through the monolayer zone. The phase velocity of the elastic wave is approximately equal to the phase velocity $V_{fd=0}$, of the $S_0$ mode elastic wave, corresponding to a condition that the product fd of the frequency f of the elastic wave and the thickness d is approximated to be zero. In case of the first structure with respect to interdigital transducers, the elastic wave is transduced to electric signals $E_{ia}$ and $E_{ib}$, at zones $R_{ia}$ and $R_{ib}$, respectively. The input- and output interdigital transducers form N pairs of ultrasound propagation lanes $Z_{ia}$ and $Z_{ib}$ in the monolayer zone. In case of the second structure with respect to interdigital transducers, the elastic wave is transduced to N electric signals $E_{ia}$ and N electric signals $E_{ib}$. The input- and output interdigital transducers form N pairs of ultrasound propagation lanes $Z_{ia}$ and $Z_{ib}$ in the monolayer zone. If an ultrasound on an ultrasound propagation lane $Z_{xa}$ attenuates by touching on an upper- or a lower end surface of the monolayer zone, an electric signal $E_{xb}$ is delivered at the output interdigital transducer. If the ultrasound on the ultrasound propagation lane $Z_{xb}$ attenuates, an electric signal $E_{xa}$ is delivered at the output interdigital transducer.

According to another aspect of the present invention there is provided an ultrasonic switching device comprising a first piezoelectric substrate having two end surfaces running perpendicular to the direction of the thickness d thereof, a second piezoelectric substrate having two end surfaces running perpendicular to the direction of the thickness d thereof, an input interdigital transducer formed on one end surface of the first piezoelectric substrate, an output interdigital transducer formed on one end surface of the second piezoelectric substrate, and a nonpiezoelectric plate having an upper- and a lower end surfaces running perpendicular to the direction of the thickness h thereof. The thickness d is smaller than the interdigital periodicity P. The thickness h is approximately equal to or smaller than the thickness d. The polarization axis of the first- and second piezoelectric substrates is parallel to the finger direction of the input interdigital transducer. The nonpiezoelectric plate is made of a material such that the shear wave velocity traveling on the nonpiezoelectric plate alone is approximately equal to or lower than that traveling on the first- and second piezoelectric substrates alone. The first- and second piezoelectric substrates are cemented on the upper- or lower end surface of the nonpiezoelectric plate through the other end surface of the first piezoelectric substrate and the other end surface of the second piezoelectric substrate, respectively. The boundary surface of the first- and second piezoelectric substrates to the nonpiezoelectric plate is under electrically opened condition. A part, adjacent to the first piezoelectric substrate, of the nonpiezoelectric plate, and the first piezoelectric substrate form a bilayer zone $B_T$. A part, adjacent to the second piezoelectric substrate, of the nonpiezoelectric plate, and the second piezoelectric substrate form a bilayer zone $B_R$. A remaining part, between the bilayer zones $B_T$ and $B_R$, of the nonpiezoelectric plate forms as a monolayer zone.

When an electric signal is applied to the input interdigital transducer, an SH wave (shear horizontal wave) of the zeroth mode and the higher order modes is excited in the bilayer zone $B_T$ along the vertical direction to the finger direction of the input interdigital transducer with at most three finger pairs, because that an SH wave has a displacement, of which direction is parallel to the upper- and the lower end surfaces of the first- and second piezoelectric substrates. The SH wave is transmitted to the bilayer zone $B_R$ through the monolayer zone. The phase velocity of the SH wave is approximately equal to the average value between the shear wave velocity traveling on the nonpiezoelectric plate alone and that traveling on the first- and second piezoelectric substrates alone. In case of the first structure with respect to interdigital transducers, the SH wave is transduced to electric signals $E_{ia}$ and $E_{ib}$, at zones $R_{ia}$ and $R_{ib}$, respectively. The input- and output interdigital transducers form N pairs of ultrasound propagation lanes $Z_{ia}$ and $Z_{ib}$ in the monolayer zone. In case of the second structure with respect to interdigital transducers, the SH wave is transduced to N electric signals $E_{ia}$ and N electric signals $E_{ib}$. The input- and output interdigital transducers form N pairs of ultrasound propagation lanes $Z_{ia}$ and $Z_{ib}$ in the monolayer zone. If an ultrasound on an ultrasound propagation lane $Z_{xa}$ attenuates by touching on an upper- or a lower end surface of the monolayer zone, an electric signal $E_{xb}$ is delivered at the output interdigital transducer. If the ultrasound on the ultrasound propagation lane $Z_{xb}$ attenuates, an electric signal $E_{xa}$ is delivered at the output interdigital transducer.

According to another aspect of the present invention there is provided an ultrasonic switching device comprising a first piezoelectric substrate having two end surfaces running perpendicular to the direction of the thickness d thereof, a second piezoelectric substrate having two end surfaces running perpendicular to the direction of the thickness d thereof, an input interdigital transducer formed on one end surface of the first piezoelectric substrate, an output interdigital transducer formed on one end surface of the second piezoelectric substrate, and a nonpiezoelectric plate having an upper- and a lower end surfaces running perpendicular to the direction of the thickness h thereof. The thickness d is smaller than the interdigital periodicity P. The thickness h is not only larger than the thickness d but also smaller than two times the thickness d. The polarization axis of the first- and second piezoelectric substrates is parallel to the finger direction of the input interdigital transducer. The nonpiezoelectric plate is made of a material such that the shear wave velocity traveling on the nonpiezoelectric plate alone is higher than that traveling on the first- and second piezoelectric substrates alone. The first- and second piezoelectric substrates are cemented on the upper end surface of the nonpiezoelectric plate through the other end surface of the first piezoelectric substrate and the other end surface of the second piezoelectric substrate, respectively. The boundary surface of the first- and second piezoelectric substrates to the nonpiezoelectric plate is under electrically shorted condition. A part, adjacent to the first piezoelectric substrate, of the nonpiezoelectric plate, and the first piezoelectric substrate form a bilayer zone $B_T$. A part, adjacent to the second piezoelectric substrate, of the nonpiezoelectric plate, and the second piezoelectric substrate form a bilayer zone $B_R$. A remaining part, between the bilayer zones $B_T$ and $B_R$, of the nonpiezoelectric plate forms as a monolayer zone.

When an electric signal is applied to the input interdigital transducer, an SH wave of the zeroth mode and the higher order modes is excited in the bilayer zone $B_T$, and transmitted to the bilayer zone $B_R$ through an upper end surface of the monolayer zone. The phase velocity of the SH wave approximates to the average value between the shear wave velocity traveling on the nonpiezoelectric plate alone and that traveling on the first- and second piezoelectric substrates alone. In case of the first structure with respect to interdigital transducers, the SH wave is transduced to electric signals $E_{ia}$ and $E_{ib}$, at zones $R_{ia}$ and $R_{ib}$, respectively. The input- and output interdigital transducers form N pairs of ultrasound propagation lanes $Z_{ia}$ and $Z_{ib}$ on the upper end surface of the monolayer zone. In case of the second structure with respect to interdigital transducers, the SH wave is transduced to N electric signals $E_{ia}$ and N electric signals $E_{ib}$. The input- and output interdigital transducers form N pairs of ultrasound propagation lanes $Z_{ia}$ and $Z_{ib}$ on the upper end surface of the monolayer zone. If an ultrasound on an ultrasound propagation lane $Z_{xa}$ attenuates by touching on the upper end surface of the monolayer zone, an electric signal $E_{xb}$ is delivered at the output interdigital transducer. If the ultrasound on the ultrasound propagation lane $Z_{xb}$ attenuates, an electric signal $E_{xa}$ is delivered at the output interdigital transducer.

According to other aspect of the present invention there is provided a condition that the electric signals $E_{ia}$ and $E_{ib}$ have radio frequencies. In this time, it is possible to radiate the electric signal $E_{ia}$ or $E_{ib}$ from the output interdigital transducer, causing a switching operation under remote control.

According to a further aspect of the present invention there is provided a piezoelectric substrate made of a piezoelectric ceramic.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
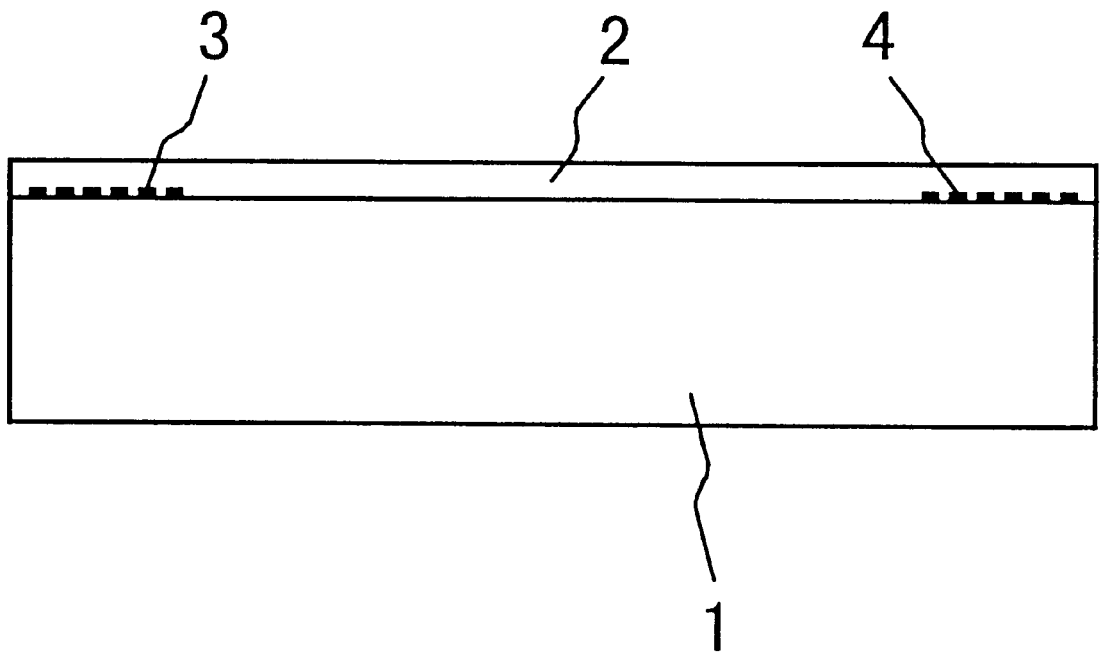
FIG. 1 shows a sectional view of an ultrasonic switching device according to a first embodiment of the present invention.

FIG. 1 shows a sectional view of an ultrasonic switching device according to a first embodiment of the present invention. The ultrasonic switching device comprises piezoelectric substrate 1 having an upper- and a lower end surfaces running perpendicular to the direction of the thickness d thereof, nonpiezoelectric plate 2 having an upper- and a lower end surfaces running perpendicular to the direction of the thickness h thereof, input interdigital transducer 3 and output interdigital transducer 4. Input interdigital transducer 3 and output interdigital transducer 4, made from aluminum thin film and having ten finger pairs, respectively, are formed on the upper end surface piezoelectric substrate 1. Piezoelectric substrate 1 is made from piezoelectric ceramic having a dimension of 1.5 mm in thickness d, the polarization axis of piezoelectric substrate 1 being parallel to the direction of the thickness d thereof. Nonpiezoelectric plate 2, made from a glass or a polymer such as acrylate resin, teflon, plastic material and so on, has a dimension of 150 μm in thickness h. The lower end surface of nonpiezoelectric plate 2 is cemented on the upper end surface of piezoelectric substrate 1 through input interdigital transducer 3 and output interdigital transducer 4. When nonpiezoelectric plate 2 is made from a glass, the glass is cemented on all over the upper end surface of piezoelectric substrate 1 through an epoxy resin with thickness of about 20 μm. When nonpiezoelectric plate 2 is made from a polymer, all over the upper end surface of piezoelectric substrate 1 is coated with the polymer directly.

Figure 2:
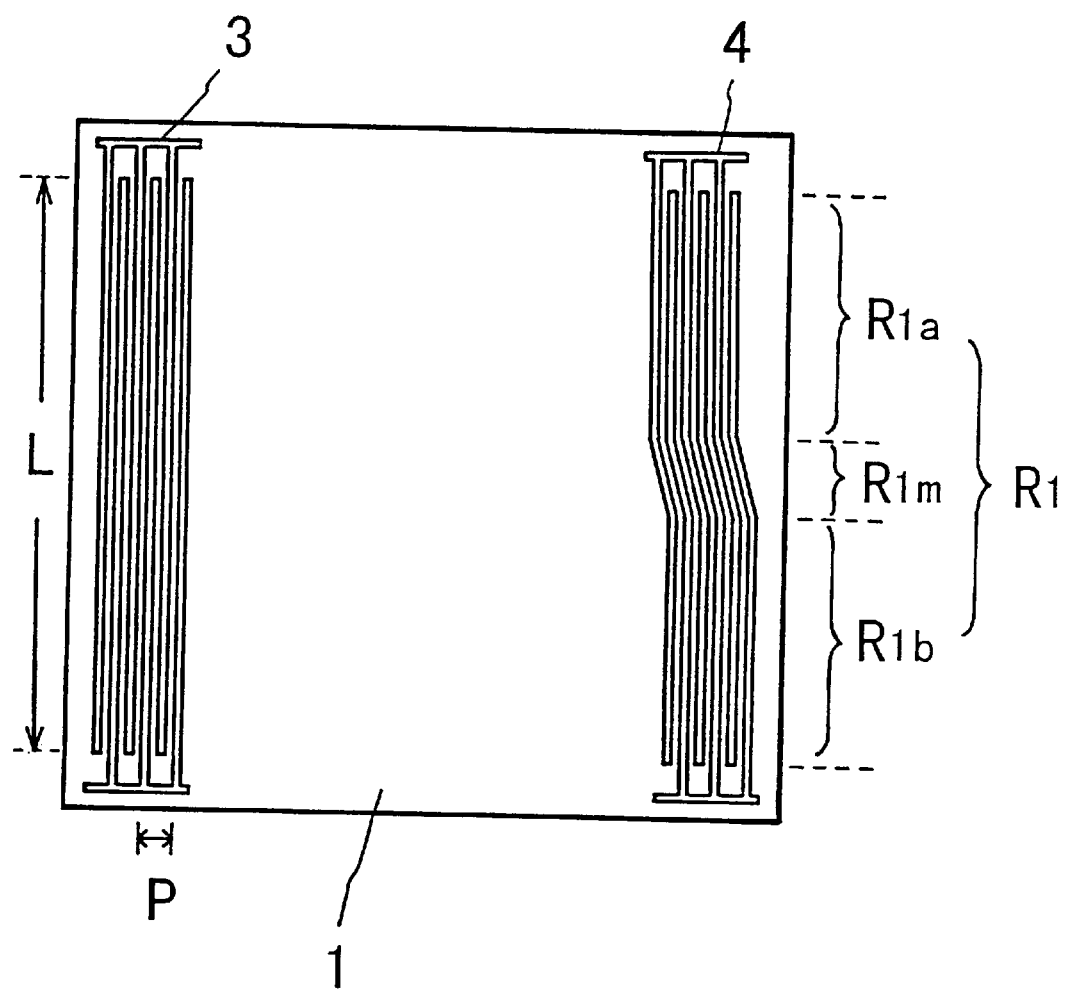
FIG. 2 shows a plan view of the ultrasonic switching device in FIG. 1.

FIG. 2 shows a plan view of the ultrasonic switching device in FIG. 1. FIG. 2 shows only piezoelectric substrate 1, input interdigital transducer 3 and output interdigital transducer 4. Input interdigital transducer 3 has an interdigital periodicity P of 400 μm and an overlap length of 15 mm. Output interdigital transducer 4 has finger-overlap zone $R_1$ comprising first zone $R_{1a}$, second zone $R_{1b}$, and third zone $R_{1m}$ between zones $R_{1a}$ and $R_{1b}$. The finger direction of zones $R_{1a}$ and $R_{1b}$ runs parallel with that of input interdigital transducer 3. An interdigital periodicity of zones $R_{1a}$ and $R_{1b}$ is equal to the interdigital periodicity P.

Figure 3:
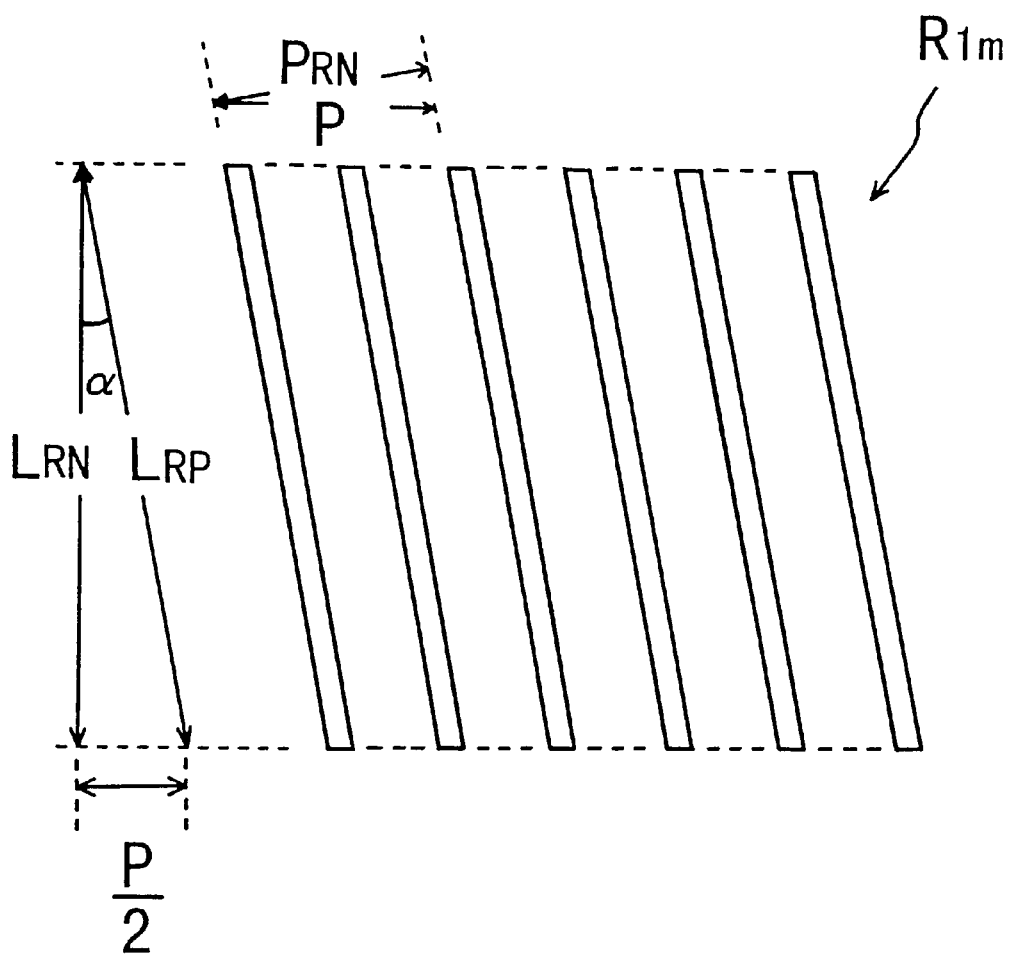
FIG. 3 shows a plan view, on an enlarged scale, of zone $R_{1m}$.

FIG. 3 shows a plan view, on an enlarged scale, of zone $R_{1m}$. The finger direction of zone $R_{1m}$ is slanting to that of input interdigital transducer 3 by an angle α. An interdigital periodicity $P_{RN}$ along the vertical direction to the finger direction of zone $R_{1m}$ is equal to the product of the interdigital periodicity P and cos α. Zone $R_{1m}$ has a first overlap length $L_{RP}$ along the finger direction thereof and a second overlap length $L_{RN}$ along the finger direction of input interdigital transducer 3. The overlap length $L_{RP}$ is equal to the product of the overlap length $L_{RN}$ and sec α as well as the product of half the interdigital periodicity P and cosec α. The sum of the overlap length (7 mm) of zone $R_{1a}$, the overlap length (7 mm) of zone $R_{1b}$ and the overlap length $L_{RN}$ (1 mm) of zone $R_{1m}$ is equal to the overlap length L (15 mm).

Figure 4:
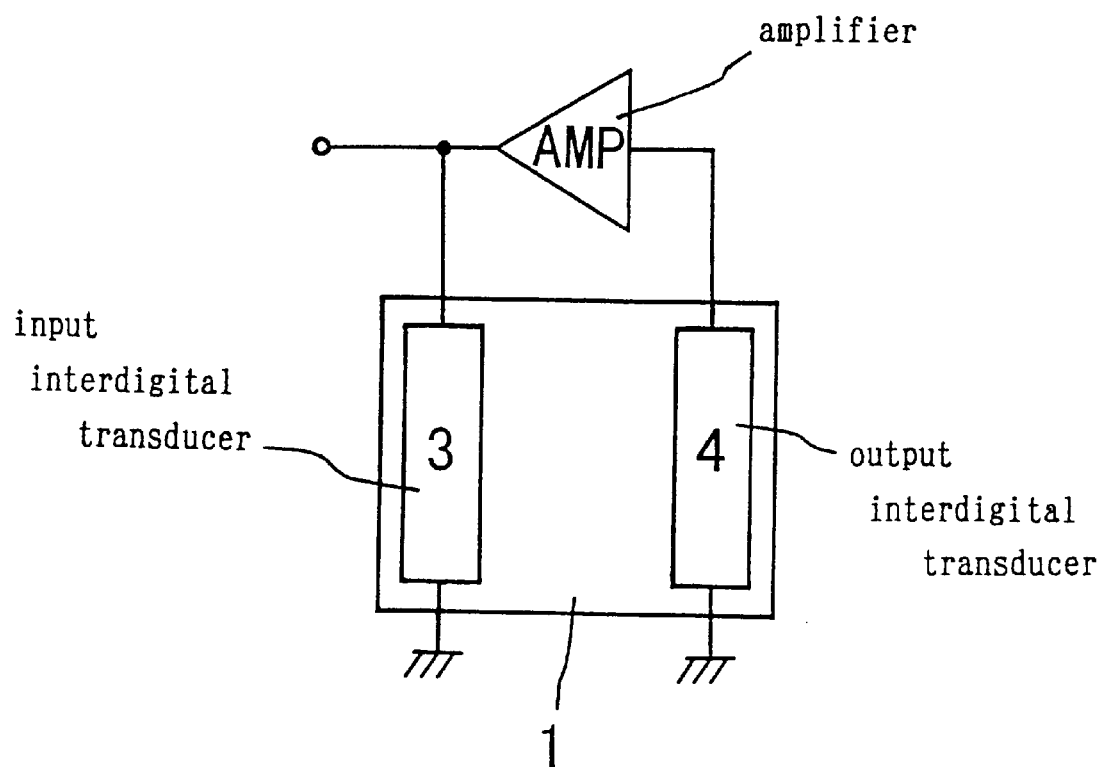
FIG. 4 shows a diagram of a circuit for the ultrasonic switching device in FIG. 1.

FIG. 4 shows a diagram of a circuit for the ultrasonic switching device in FIG. 1. The circuit includes amplifier AMP connected with an output terminal of output interdigital transducer 4. When an electric signal having a frequency approximately corresponding to the interdigital periodicity P is applied to input interdigital transducer 3, a surface acoustic wave, of the zeroth mode and the higher order modes, having the wavelength approximately equal to the interdigital periodicity P is excited on an area, in contact with input interdigital transducer 3, of the upper end surface of piezoelectric substrate 1 effectively. In this time, if the phase velocity of the zeroth mode surface acoustic wave is approximately equal to the phase velocity of the Rayleigh wave traveling on piezoelectric substrate 1 alone under electrically shorted condition, and the phase velocity of the higher order mode surface acoustic wave is approximately equal to the phase velocity of the Rayleigh wave traveling on piezoelectric substrate 1 alone under electrically opened condition, the transducing efficiency from the electric signal to the surface acoustic wave increases, and in addition, the reflection caused by the miss-matching on the acoustic impedance at the boundary surface between piezoelectric substrate 1 and nonpiezoelectric plate 2 never causes. Moreover, as piezoelectric substrate 1 is made from a piezoelectric ceramic having the polarization axis parallel to the direction of the thickness d thereof, the surface acoustic wave of the zeroth mode and the higher order modes is excited on the area of the upper end surface of piezoelectric substrate 1 effectively, and the transducing efficiency from the electric signal to the surface acoustic wave increases.

The surface acoustic wave excited on the area of the upper end surface of piezoelectric substrate 1 is transmitted to the upper end surface of nonpiezoelectric plate 2. As the thickness d of piezoelectric substrate 1 is larger than three times the interdigital periodicity P, and the thickness h of nonpiezoelectric plate 2 is smaller than the interdigital periodicity p, the transmitting efficiency of the surface acoustic wave from the upper end surface of piezoelectric substrate 1 to the upper end surface of nonpiezoelectric plate 2 increases. In addition, if using a material, as nonpiezoelectric plate 2, such that the phase velocity of the surface acoustic wave traveling on nonpiezoelectric plate 2 alone is lower than that traveling on piezoelectric substrate 1 alone, the transmitting efficiency of the surface acoustic wave from the upper end surface of piezoelectric substrate 1 to the upper end surface of nonpiezoelectric plate 2 increases without a leakage of the surface acoustic wave on the inside of piezoelectric substrate 1. Thus, it is possible to operate the ultrasonic switching device under low power consumption and low voltage.

The surface acoustic wave on the upper end surface of nonpiezoelectric plate 2 is transmitted to an area, in contact with output interdigital transducer 4, of the upper end surface of piezoelectric substrate 1, and transduced to electric signals $E_{1a}$ and $E_{1b}$ at zones $R_{1a}$ and $R_{1b}$, respectively. In this time, the sum of the electric signals $E_{1a}$ and $E_{1b}$ is zero, because that the overlap length $L_{RP}$ is equal to the product of the overlap length $L_{RN}$ and sec $\alpha$ as well as the product of P/2 and cosec $\alpha$. Input interdigital transducer 3 and output interdigital transducer 4 form two ultrasound propagation lanes $Z_{1a}$ and $Z_{1b}$, corresponding to zones $R_{1a}$ and $R_{1b}$, respectively, on the upper end surface of nonpiezoelectric plate 2, ultrasound propagation lanes $Z_{1a}$ and $Z_{1b}$ making a pair. When the surface acoustic wave on ultrasound propagation lane $Z_{1a}$ attenuates by touching with a finger or others on the upper end surface of nonpiezoelectric plate 2, the electric signal $E_{1b}$ corresponding to ultrasound propagation lane $Z_{1b}$ is delivered at output interdigital transducer 4. In the same way, when the surface acoustic wave on ultrasound propagation lane $Z_{1b}$ attenuates, the electric signal $E_{1a}$ is delivered at output interdigital transducer 4. As a result, the choice of touch-positions on the upper end surface of nonpiezoelectric plate 2 gives the favorite output electric signal $E_{1b}$ or $E_{1a}$ at output interdigital transducer 4. Thus, the ultrasonic switching device has a switching ability. In addition, if the electric signals $E_{1b}$ and $E_{1a}$ have radio frequencies, it is possible to radiate the electric signal $E_{1b}$ or $E_{1a}$ from output interdigital transducer 4. The electric signal $E_1$ or $E_{1a}$, delivered at output interdigital transducer 4 is amplified via amplifier AMP, a part of the amplified electric signal being applied to input interdigital transducer 3 again. Thus, input interdigital transducer 3, output interdigital transducer 4 and amplifier AMP form an oscillator, causing not only a low voltage operation and low power consumption, but also a small-sized circuit with a simple structure.

Figure 5:
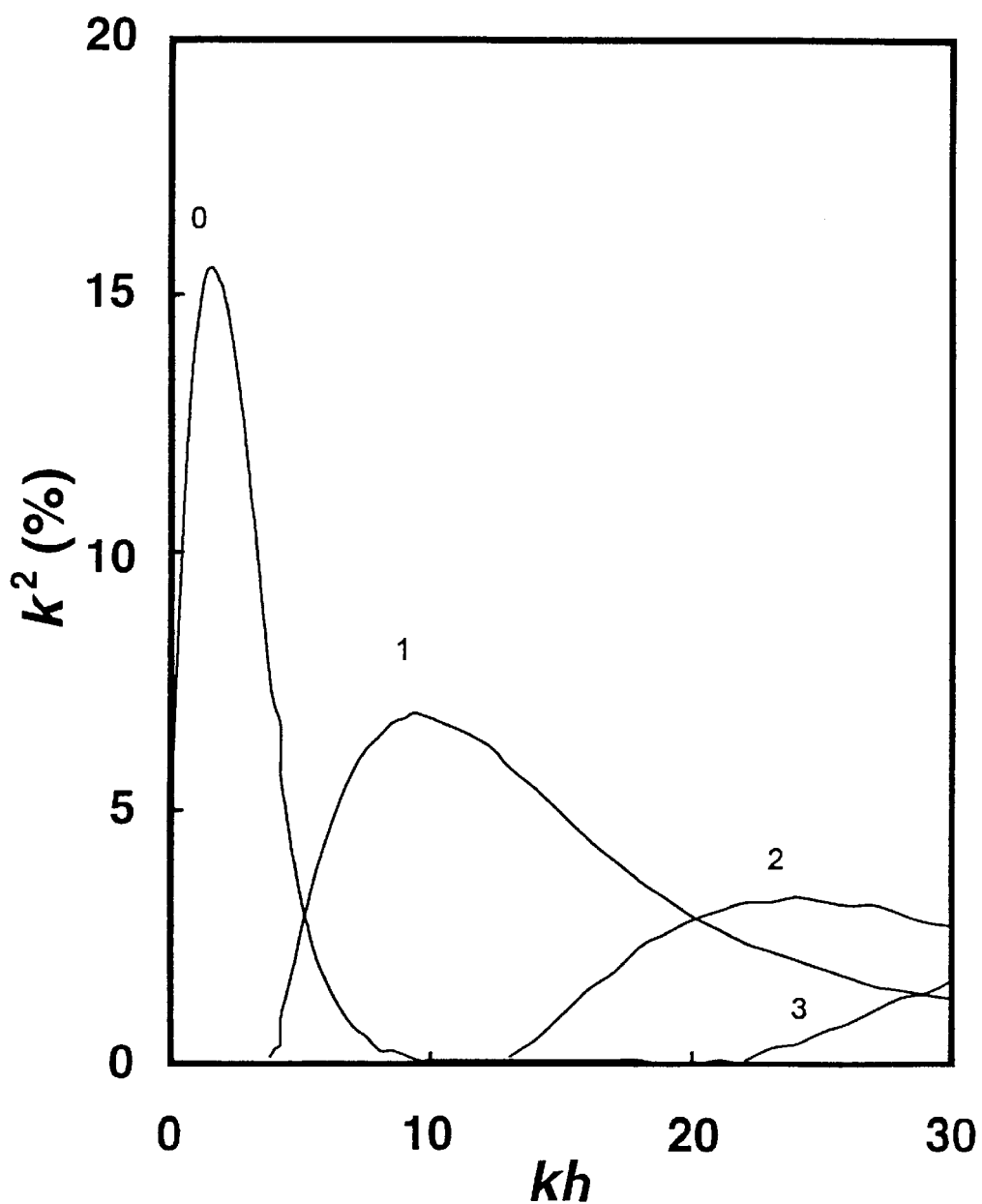
FIG. 5 shows a relationship between the $k^2$ value calculated from the difference between the phase velocity under electrically opened condition and that under electrically shorted condition of piezoelectric substrate 1, and the kh value.

FIG. 5 shows a relationship between the electromechanical coupling constant $k^2$ calculated from the difference between the phase velocity under electrically opened condition and that under electrically shorted condition of piezoelectric substrate 1, and the product kh of the wave number k of the surface acoustic wave and the thickness h of nonpiezoelectric plate 2. In FIG. 5, nonpiezoelectric plate 2 is made from a glass having a shear wave velocity of 2297 m/s and a longitudinal wave velocity of 4156 m/s traveling on the glass alone. The velocities of 2297 m/s and 4156 m/s are about 0.9 times the velocities of a shear- and a longitudinal waves, 2340 m/s and 4390 m/s, respectively, in piezoelectric substrate 1 alone. An electric energy applied to input interdigital transducer 3 is most effectively transduced to the zeroth mode surface acoustic wave when the kh value is approximately 1.6, then the $k^2$ value is approximately 15.5% being the maximum value. An electric energy applied to input interdigital transducer 3 is also transduced to the surface acoustic wave with more difficulty in proportion to the higher order modes. It is clear that the $k^2$ value of 15.5% is worthy in comparison that a crystallized $LiNbO_3$ used as a popular piezoelectric body for exciting the surface acoustic wave generally has the $k^2$ value of approximately 5%.

Figure 6:
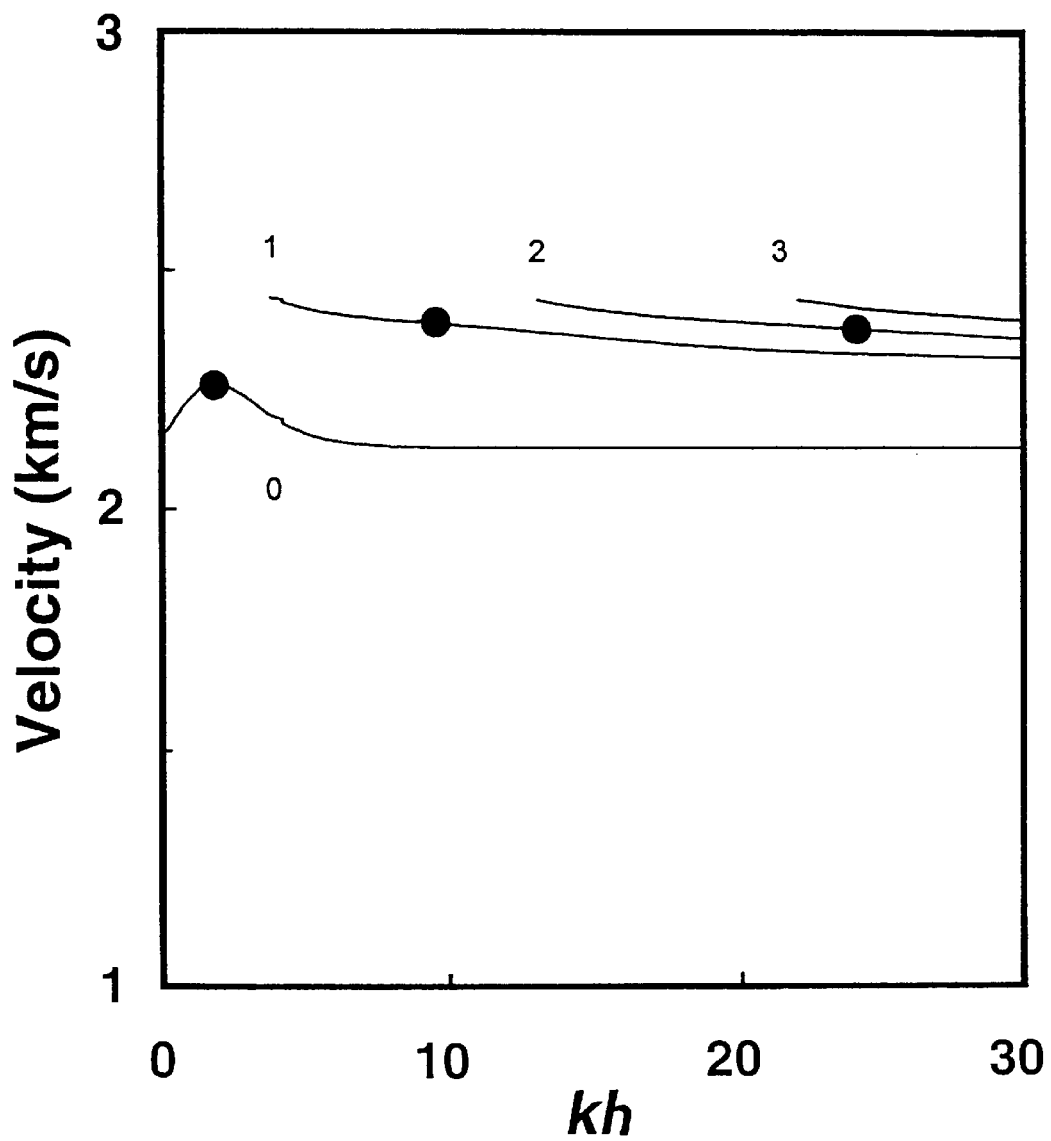
FIG. 6 shows a relationship between the phase velocity of the surface acoustic wave for each mode on the upper end surface of piezoelectric substrate 1, and the kh value.

FIG. 6 shows a relationship between the phase velocity of the surface acoustic wave for each mode on the upper end surface of piezoelectric substrate 1, and the kh value. In FIG. 6, nonpiezoelectric plate 2 is made from the same glass as FIG. 5. There is a cut-off frequency for each higher order mode, except for the zeroth mode. The kh value at each mark ● has the maximum $k^2$ value where an electric energy applied to input interdigital transducer 3 is most effectively transduced to the surface acoustic wave, the maximum $k^2$ value being obtained from FIG. 5. The phase velocity of the zeroth mode surface acoustic wave at the mark ● is 2170 m/s, which is approximately equal to the phase velocity of the Rayleigh wave traveling on piezoelectric substrate 1 alone under the electrically shorted condition, the phase velocity of the Rayleigh wave being 2150 m/s. The phase velocity of the higher order mode surface acoustic wave at the mark ● is approximately 2370 m/s, which is approximately equal to the Rayleigh wave velocity traveling on piezoelectric substrate 1 alone under the electrically opened condition, the phase velocity of the Rayleigh wave being 2340 m/s.

Figure 7:
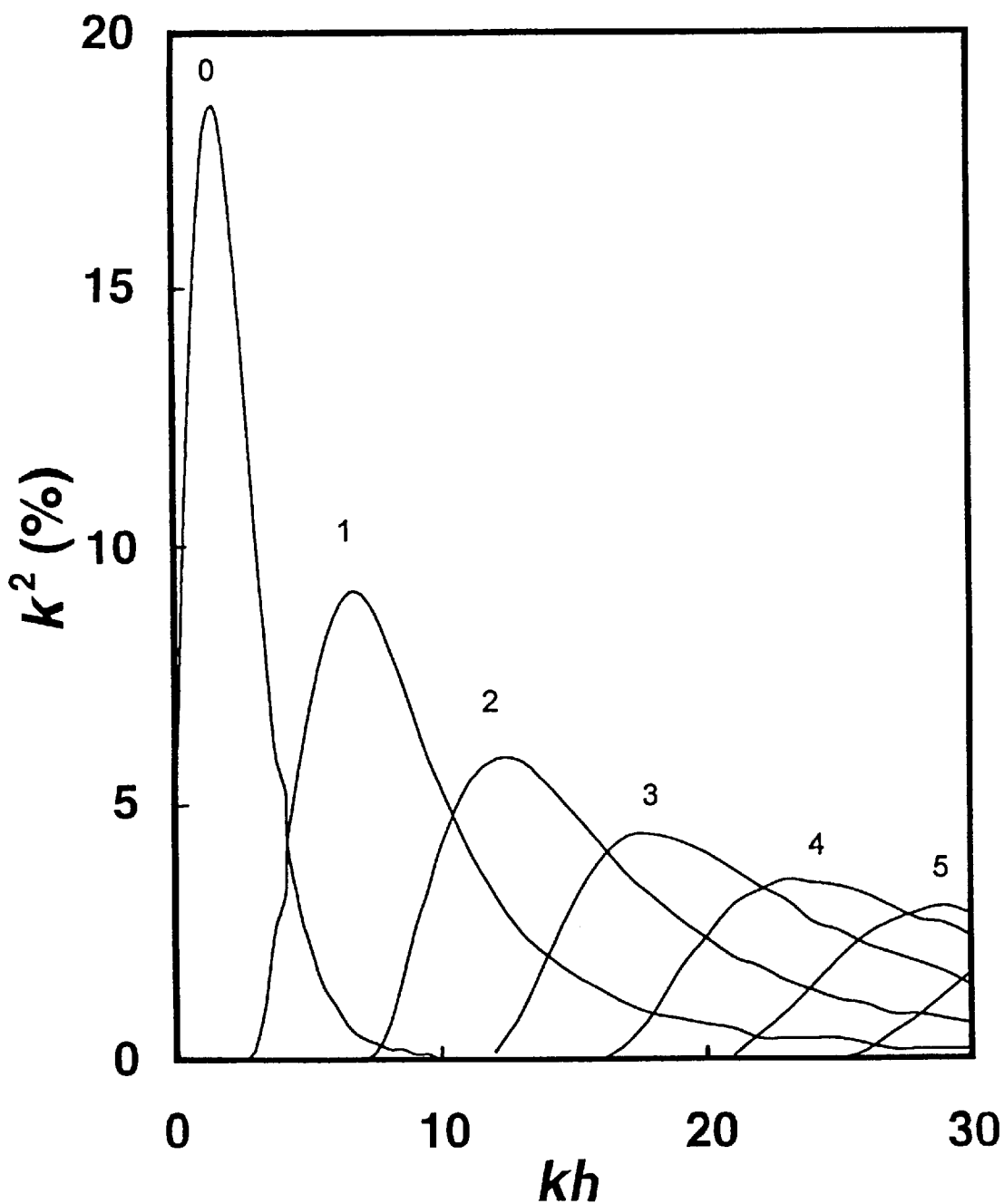
FIG. 7 shows a relationship between the $k^2$ value calculated from the difference between the phase velocity under electrically opened condition and that under electrically shorted condition of piezoelectric substrate 1, and the kh value.

FIG. 7 shows a relationship between the $k^2$ value calculated from the difference between the phase velocity under electrically opened condition and that under electrically shorted condition of piezoelectric substrate 1, and the kh value. In FIG. 7, nonpiezoelectric plate 2 is made from a glass having a shear wave velocity of 1988 m/s and a longitudinal wave velocity of 3597 m/s traveling on the glass alone. The velocities of 1988 m/s and 3597 m/s are about 0.8 times the velocities of a shear- and a longitudinal waves, 2340 m/s and 4390 m/s, respectively, in piezoelectric substrate 1 alone. An electric energy applied to input interdigital transducer 3 is most effectively transduced to the zeroth mode surface acoustic wave when the kh value is approximately 1.6, then the $k^2$ value is approximately 18.5% being the maximum value. An electric energy applied to input interdigital transducer 3 is also transduced to the surface acoustic wave with more difficulty in proportion to the higher order modes.

Figure 8:
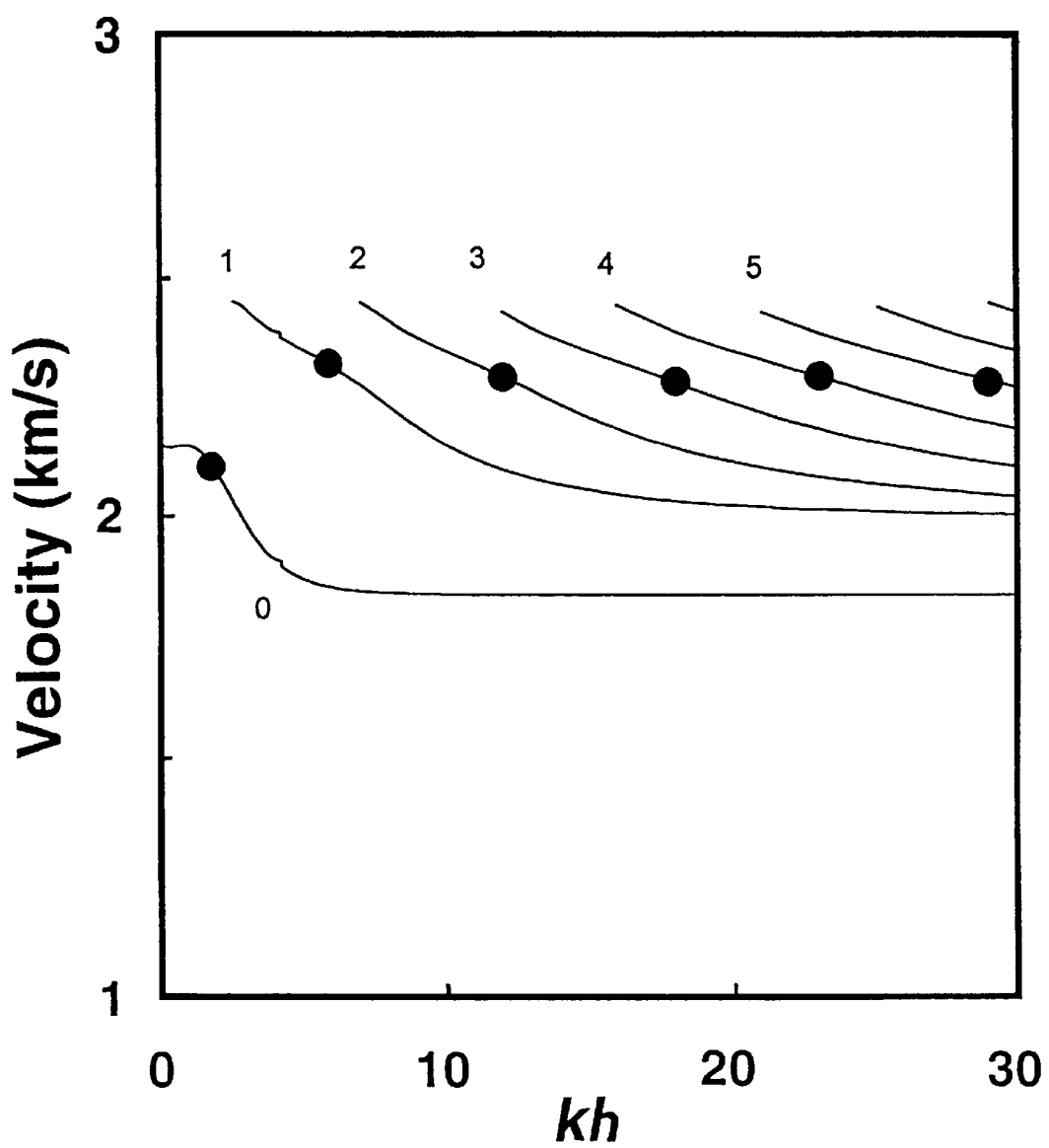
FIG. 8 shows a relationship between the phase velocity of the surface acoustic wave for each mode on the upper end surface of piezoelectric substrate 1, and the kh value.

FIG. 8 shows a relationship between the phase velocity of the surface acoustic wave for each mode on the upper end surface of piezoelectric substrate 1, and the kh value. In FIG. 8, nonpiezoelectric plate 2 is made from the same glass as FIG. 7. There is a cut-off frequency for each higher order mode, except for the zeroth mode. The kh value at each mark ● has the maximum $k^2$ value where an electric energy applied to input interdigital transducer 3 is most effectively transduced to the surface acoustic wave, the maximum $k^2$ value being obtained from FIG. 7. The phase velocity of the zeroth mode surface acoustic wave at the mark ● is 2095 m/s, which is lower than the phase velocity (2170 m/s) of the zeroth mode surface acoustic wave in FIG. 6, and is approximately equal to the phase velocity of the Rayleigh wave traveling on piezoelectric substrate 1 alone under the electrically shorted condition, the phase velocity of the Rayleigh wave being 2150 m/s. The phase velocity of the higher order mode surface acoustic wave at the mark ● is approximately 2300 m/s, which is lower than the phase velocity (2370 m/s) of the higher order mode surface acoustic wave in FIG. 6, and is approximately equal to the Rayleigh wave velocity traveling on piezoelectric substrate 1 alone under the electrically opened condition, the phase velocity of the Rayleigh wave being 2340 m/s.

It is clear from FIGS. 5~8 that an electric energy applied to input interdigital transducer 3 is most effectively transduced to the the zeroth mode surface acoustic wave having the phase velocity approximately equal to the phase velocity of the Rayleigh wave traveling on piezoelectric substrate 1 alone under the electrically shorted condition, and is transduced to the higher order mode surface acoustic wave having the phase velocity approximately equal to the phase velocity of the Rayleigh wave traveling on piezoelectric substrate 1 alone under the electrically opened condition. In addition, the velocity of the surface acoustic wave for each mode, transmitted from piezoelectric substrate 1 to nonpiezoelectric plate 2 becomes lower, when using a material, as nonpiezoelectric plate 2, where the velocity of the shear wave and the longitudinal wave traveling on the material alone is lower. In the same way, the zeroth mode surface acoustic wave having the phase velocity approximately equal to the phase velocity of the Rayleigh wave traveling on piezoelectric substrate 1 alone under the electrically shorted condition is most effectively transduced to an electric signal at output interdigital transducer 4. The higher order mode surface acoustic wave having the phase velocity approximately equal to the phase velocity of the Rayleigh wave traveling on piezoelectric substrate 1 alone under the electrically opened condition is transduced to an electric signal sufficiently.

Figure 9:
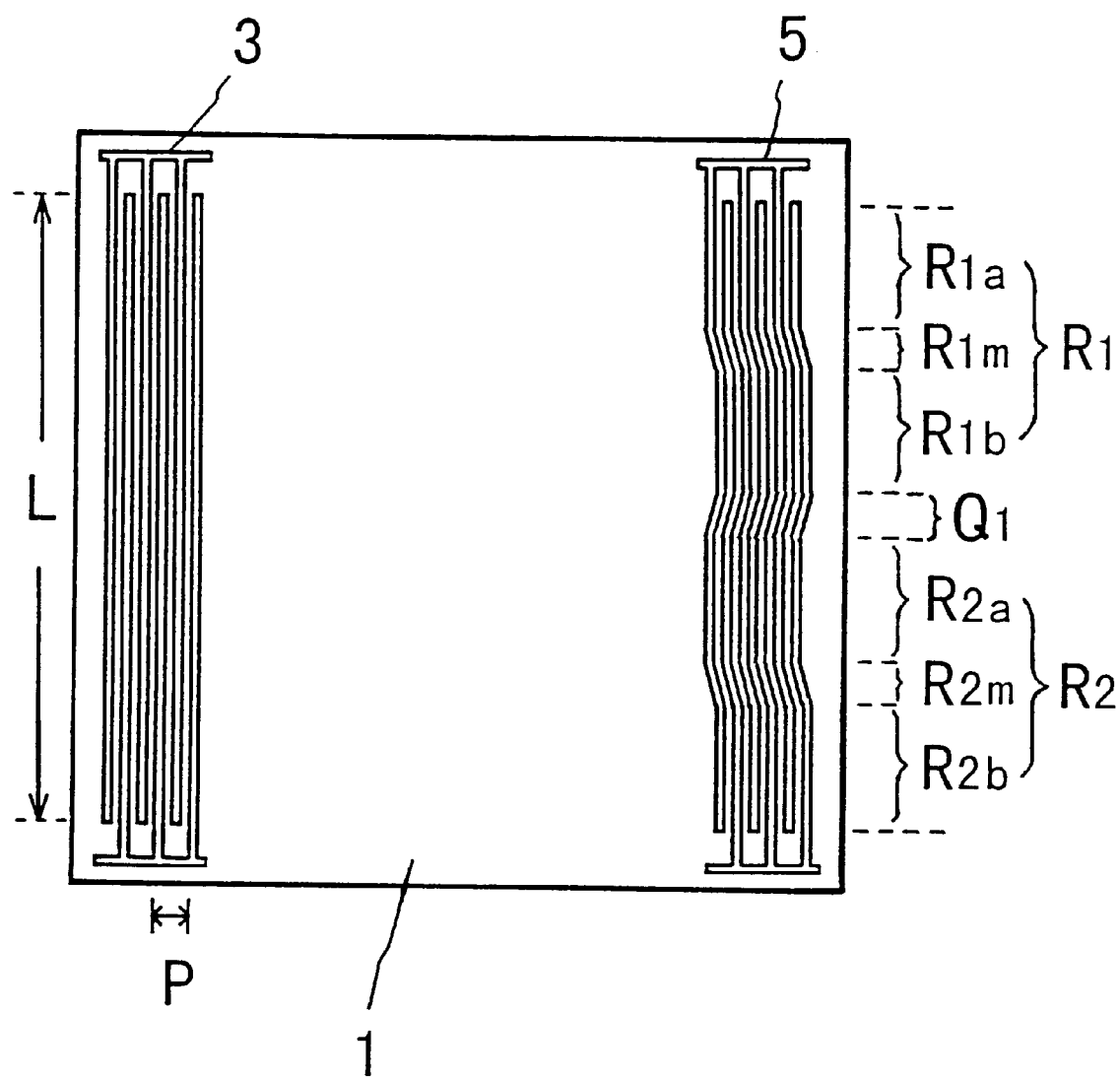
FIG. 9 shows a plan view of an ultrasonic switching device according to a second embodiment of the present invention.

FIG. 9 shows a plan view of an ultrasonic switching device according to a second embodiment of the present invention. The ultrasonic switching device has the same construction as that in FIG. 1, except for using of output interdigital transducer 5 in place of output interdigital transducer 4. FIG. 9 shows only piezoelectric substrate 1, input interdigital transducer 3 and output interdigital transducer 5. Output interdigital transducer 5 with ten finger pairs has finger-overlap zones $R_1$ and $R_2$, and finger-overlap zone $Q_1$ between finger-overlap zones $R_1$ and $R_2$. In other words, output interdigital transducer 5 has N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$, then N is two. Finger-overlap zone $R_1$ comprises first zone $R_{1a}$, second zone $R_{1b}$, and third zone $R_{1m}$ between zones $R_{1a}$ and $R_{1b}$. Finger-overlap zone $R_2$ comprises first zone $R_{2a}$, second zone $R_{2b}$, and third zone $R_{2m}$ between zones $R_{2a}$ and $R_{2b}$. The finger direction of zones $R_{1a}$, $R_{1b}$, $R_{2a}$ and $R_{2b}$, runs parallel with that of input interdigital transducer 3. An interdigital periodicity of zones $R_{1a}$, $R_{1b}$, $R_{2a}$ and $R_{2b}$, is equal to the interdigital periodicity P. A structure of zone $R_{2m}$ is the same as that of zone $R_{1m}$, zones $R_{1m}$ and $R_{2m}$ in FIG. 9 being equivalent to zone $R_{1m}$ in FIG. 3.

Figure 10:
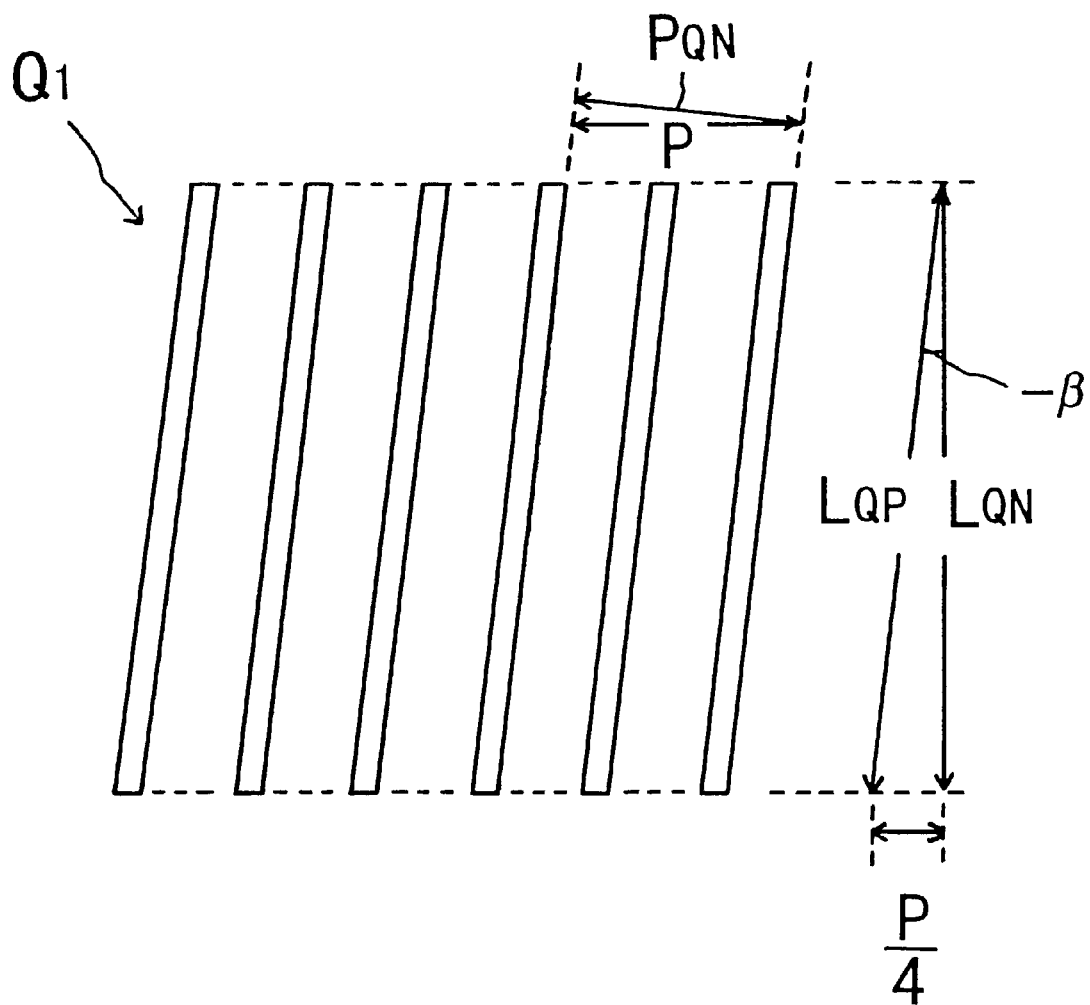
FIG. 10 shows a plan view, on an enlarged scale, of finger-overlap zone $Q_1$.

FIG. 10 shows a plan view, on an enlarged scale, of finger-overlap zone $Q_1$. The finger direction of finger-overlap zone $Q_1$ can be slanting to that of input interdigital transducer 3 by an angle $+\beta$ or $-\beta$, that is $\pm\beta$. However, in this embodiment, the finger direction of finger-overlap zone $Q_1$ is slanting to that of input interdigital transducer 3 by an angle $-\beta$. An interdigital periodicity $P_{QN}$ along the vertical direction to the finger direction of finger-overlap zone $Q_1$ is equal to the product of the interdigital periodicity P and cos $\beta$. Finger-overlap zone $Q_1$ has a first overlap length $L_{QP}$ along the finger direction thereof and a second overlap length $L_{QN}$ along the finger direction of input interdigital transducer 3. The overlap length $L_{QP}$ is equal to the product of the overlap length $L_{QN}$ and sec $\beta$. The overlap length $L_{QP}$ is also equal to the product of cosec $\beta$ and the interdigital periodicity P divided by 4, that is, the product of P/4 and cosec $\beta$. The sum of the overlap length (3 mm) of zone $R_{1a}$, the overlap length (3 mm) of zone $R_{1b}$, the overlap length (3 mm) of zone $R_{2a}$, the overlap length (3 mm) of zone $R_{2b}$, the overlap length $L_{RN}$ (1 mm) of zone $R_{1m}$, the overlap length $L_{RN}$ (1 mm) of zone $R_{2m}$, and the overlap length $L_{QN}$ (1 mm) of finger-overlap zone $Q_1$ is equal to the overlap length L (15 mm).

When operating the ultrasonic switching device according to the second embodiment, the circuit, in FIG. 4, except for using of output interdigital transducer 5 in place of output interdigital transducer 4, is available. If an electric signal is applied to input interdigital transducer 3, a surface acoustic wave is excited on an area, in contact with input interdigital transducer 3, of the upper end surface of piezoelectric substrate 1. The surface acoustic wave is transmitted to an area, in contact with output interdigital transducer 5, of the upper end surface of piezoelectric substrate 1, through nonpiezoelectric plate 2, and transduced to electric signals $E_{1a}$, $E_{1b}$, $E_{2a}$ and $E_{2b}$, at zones $R_{1a}$, $R_{1b}$, $R_{2a}$ and $R_{2b}$, respectively. In this time, the sum of the electric signals $E_{1a}$ and $E_{1b}$ is zero, and the sum of the electric signals $E_{2a}$ and $E_{2b}$ is zero, because that the overlap length $L_{RP}$ is equal to the product of the overlap length $L_{RN}$ and sec $\alpha$ as well as the product of P/2 and cosec $\alpha$. Input interdigital transducer 3 and output interdigital transducer 5 form four ultrasound propagation lanes $Z_{1a}$, $Z_{1b}$, $Z_{2a}$ and $Z_{2b}$, on the upper end surface of nonpiezoelectric plate 2, corresponding to zones $R_{1a}$, $R_{1b}$, $R_{2a}$ and $R_{2b}$, respectively, ultrasound propagation lanes $Z_{1a}$ and $Z_{1b}$ making a pair, and ultrasound propagation lanes $Z_{2a}$ and $Z_{2b}$ making a pair. When the surface acoustic wave on ultrasound propagation lane $Z_{1a}$ attenuates by touching on the upper end surface of nonpiezoelectric plate 2, the electric signal $E_{1b}$ corresponding to ultrasound propagation lane $Z_{1b}$ is delivered at output interdigital transducer 5. Thus, when the surface acoustic wave on ultrasound propagation lane $Z_{1a}$, $Z_{1b}$, $Z_{2a}$ or $Z_{2b}$ attenuates, the corresponding electric signal $E_{1b}$, $E_{1a}$, $E_{2b}$ or $E_{2a}$ is delivered at output interdigital transducer 5, respectively. As a result, the choice of touch-positions on the upper end surface of nonpiezoelectric plate 2 gives the favorite output electric signal $E_{1b}$, $E_{1a}$, $E_{2b}$ or $E_{2a}$, at output interdigital transducer 5. Thus, the ultrasonic switching device has a switching ability.

Figure 11:
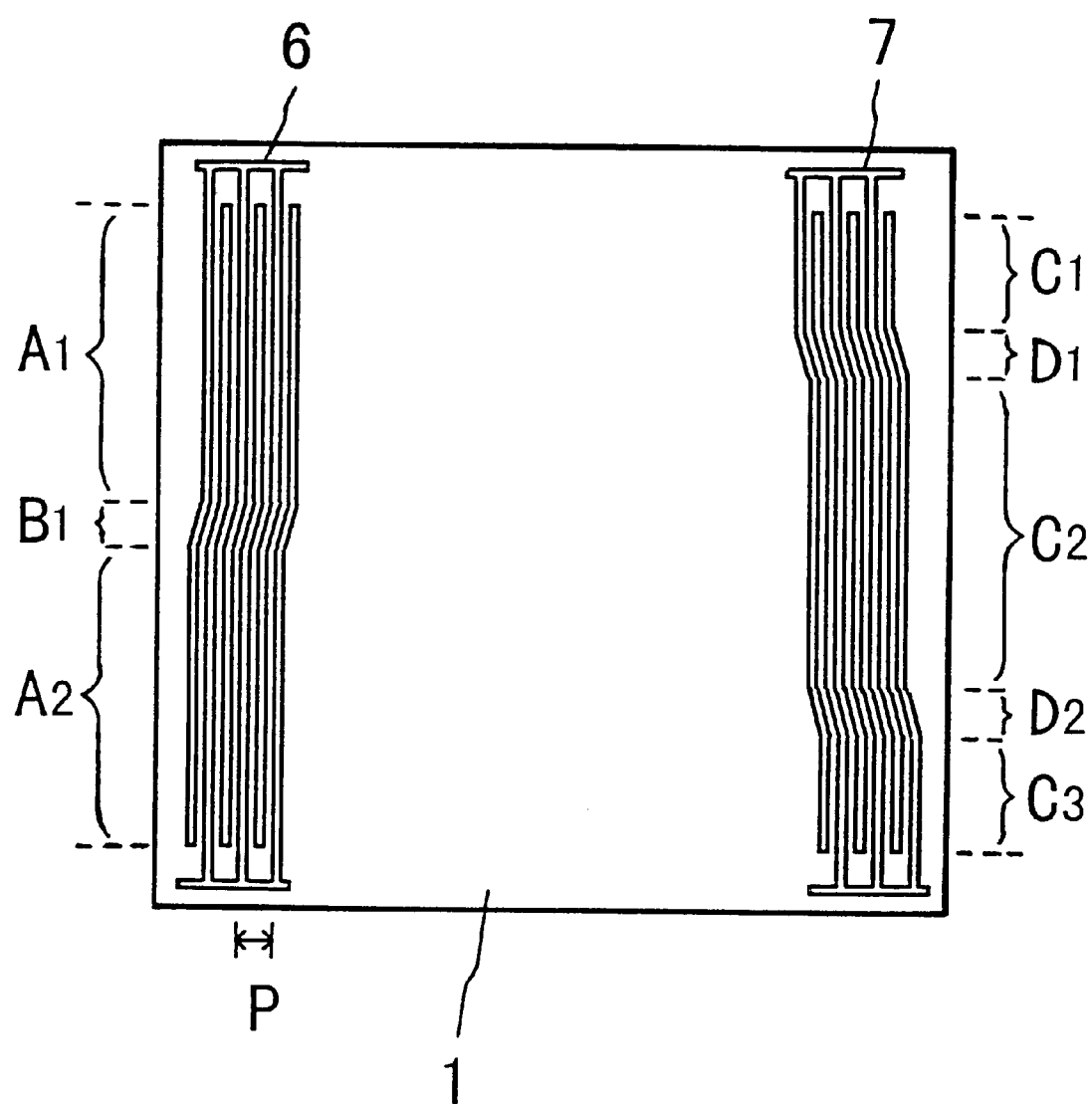
FIG. 11 shows a plan view of an ultrasonic switching device according to a third embodiment of the present invention.

FIG. 11 shows a plan view of an ultrasonic switching device according to a third embodiment of the present invention. The ultrasonic switching device has the same construction as that in FIG. 1, except for using of input interdigital transducer 6 and output interdigital transducer 7 in place of input interdigital transducer 3 and output interdigital transducer 4. FIG. 11 shows only piezoelectric substrate 1, input interdigital transducer 6 and output interdigital transducer 7. Input interdigital transducer 6 with ten finger pairs has finger-overlap zones $A_1$ and $A_2$, and finger-overlap zone $B_1$ between finger-overlap zones $A_1$ and $A_2$. Output interdigital transducer 7 with ten finger pairs has finger-overlap zones $C_1$, $C_2$ and $C_3$, finger-overlap zone $D_1$ between finger-overlap zones $C_1$ and $C_2$, and finger-overlap zone $D_2$ between finger-overlap zones $C_2$ and $C_3$. In other words, input interdigital transducer 6 has N finger-overlap zones $A_i$ (i=1, 2, ..., N) and N−1 finger-overlap zones $B_i$ {i=1, 2, ..., (N−1)}, and output interdigital transducer 7 has N+1 finger-overlap zones $C_i$ {i=1, 2, ..., (N+1)} and N finger-overlap zones $D_i$ (i=1, 2, ..., N), then N is two. The finger direction of finger-overlap zones $A_1$ and $A_2$ runs parallel with that of finger-overlap zones $C_1$, $C_2$ and $C_3$. Each of finger-overlap zones $A_1$, $A_2$, $C_1$, $C_2$ and $C_3$ has an interdigital periodicity P of 400 µm.

Figure 12:
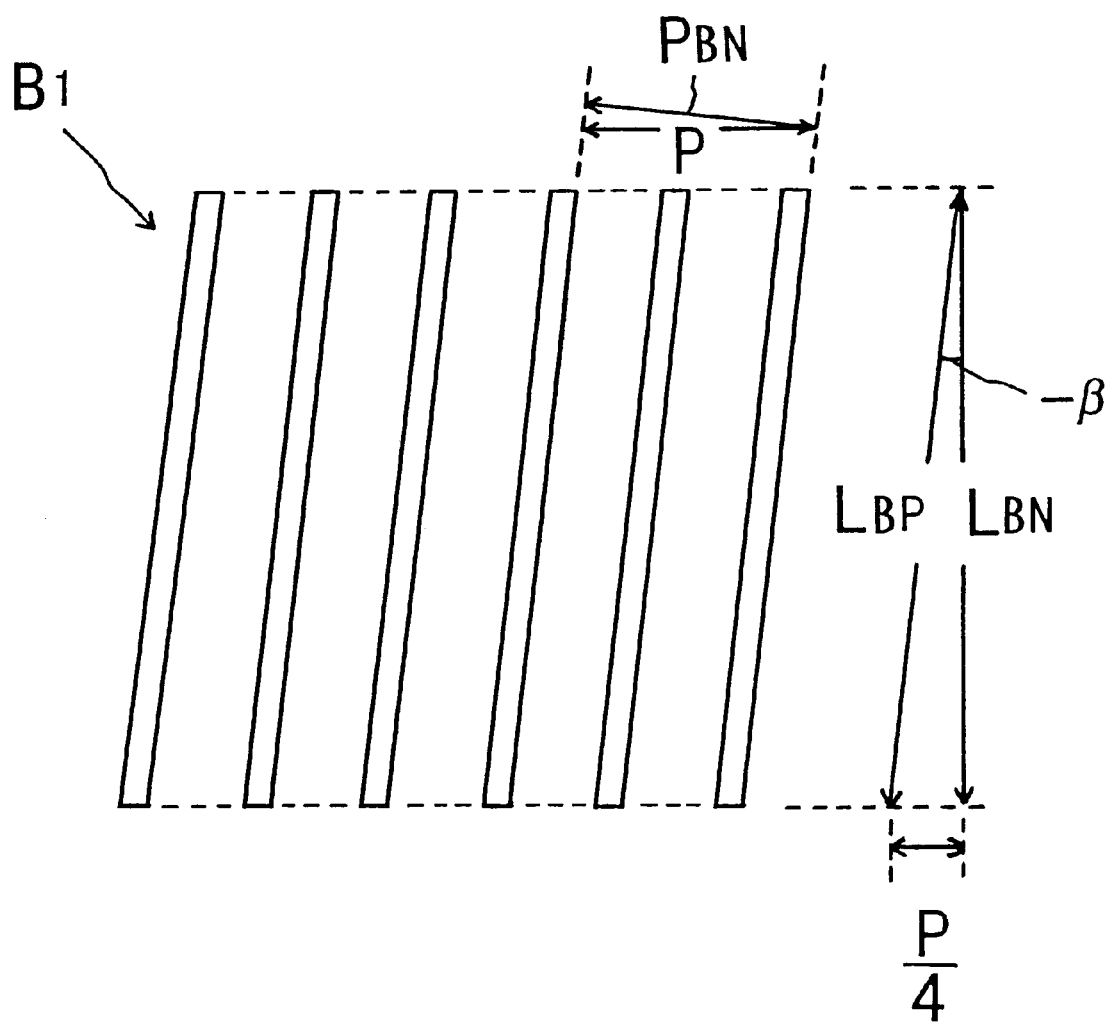
FIG. 12 shows a plan view, on an enlarged scale, of finger-overlap zone $B_1$.

FIG. 12 shows a plan view, on an enlarged scale, of finger-overlap zone $B_1$. The finger direction of finger-overlap zone $B_1$ is slanting to that of finger-overlap zones $A_1$ and $A_2$ by an angle $-\beta$. An interdigital periodicity $P_{BN}$ along the vertical direction to the finger direction of finger-overlap zone $B_1$ is equal to the product of the interdigital periodicity P and $\cos \beta$. Finger-overlap zone $B_1$ has a first overlap length $L_{BP}$ along the finger direction thereof and a second overlap length $L_{BN}$ along the finger direction of finger-overlap zones $A_1$ and $A_2$. The overlap length $L_{BP}$ is equal to the product of the overlap length $L_{BN}$ and $\sec \beta$. The overlap length $L_{BP}$ is also equal to the product of $\csc \beta$ and the interdigital periodicity P divided by 4, that is, the product of P/4 and $\csc \beta$.

Figure 13:
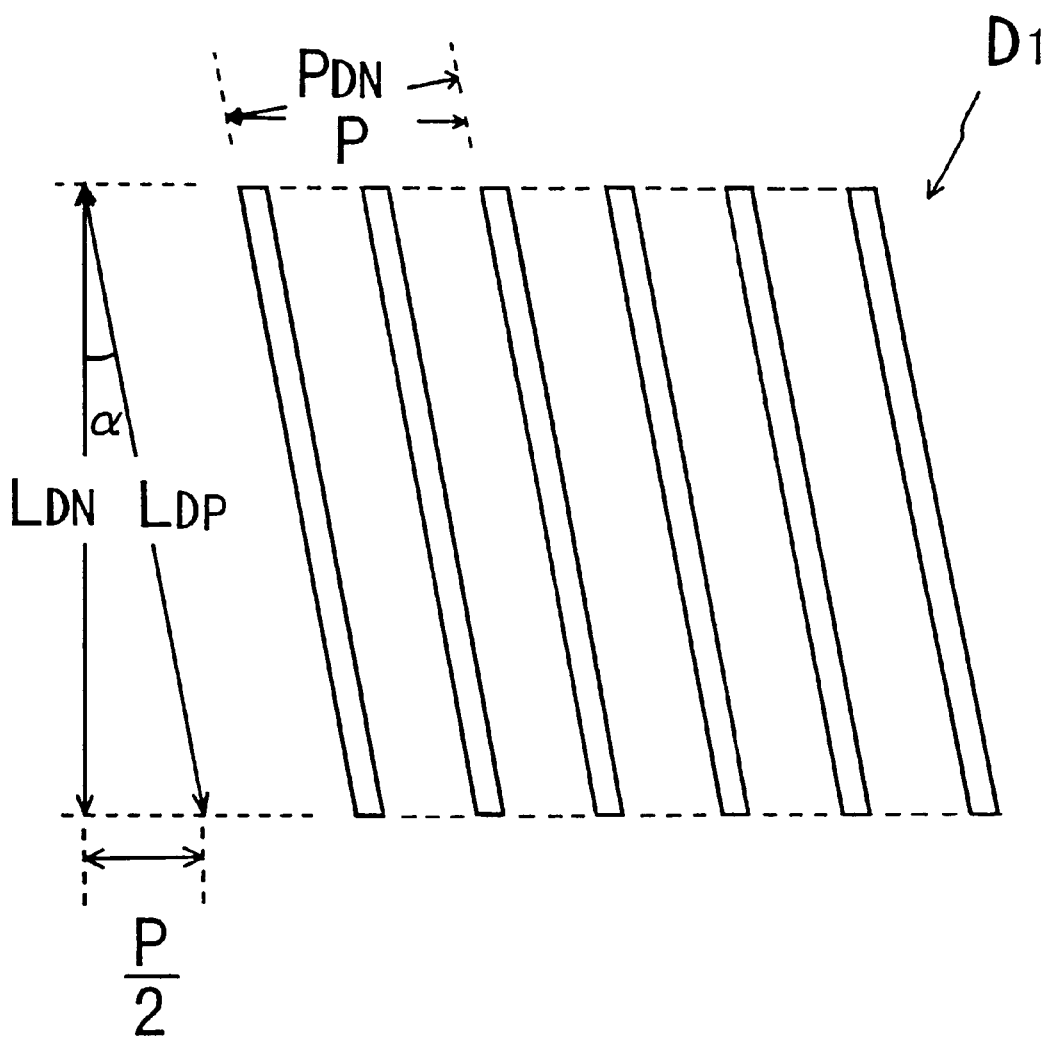
FIG. 13 shows a plan view, on an enlarged scale, of finger-overlap zone $D_1$.

FIG. 13 shows a plan view, on an enlarged scale, of finger-overlap zone $D_1$. Finger-overlap zone $D_2$ has the same construction as finger-overlap zone $D_1$. The finger direction of finger-overlap zones $D_1$ and $D_2$ is slanting to that of finger-overlap zones $C_1$, $C_2$ and $C_3$ by an angle $\alpha$. An interdigital periodicity $P_{DN}$ along the vertical direction to the finger direction of finger-overlap zone $D_1$ is equal to the product of the interdigital periodicity P and $\cos \alpha$. Finger-overlap zone $D_1$ has a first overlap length $L_{DP}$ along the finger direction thereof and a second overlap length $L_{DN}$ along the finger direction of finger-overlap zones $C_1$, $C_2$ and $C_3$. The overlap length $L_{DP}$ is equal to the product of the overlap length $L_{DN}$ and $\sec \alpha$. The overlap length $L_{DP}$ is also equal to the product of $\csc \alpha$ and the interdigital periodicity P divided by 2, that is, the product of P/2 and $\csc \alpha$. The sum of the overlap length (7 mm) of finger-overlap zone $A_1$, the overlap length (7 mm) of finger-overlap zone $A_2$ and the overlap length $L_{BN}$ (1 mm) of finger-overlap zone $B_1$ is equal to the sum of the overlap length (3 mm) of finger-overlap zone $C_1$, the overlap length (3 mm) of finger-overlap zone $C_3$, the overlap length (7 mm) of finger-overlap zone $C_2$, the overlap length $L_{DN}$ (1 mm) of finger-overlap zone $D_1$ and the overlap length $L_{DN}$ (1 mm) of finger-overlap zone $D_2$.

When operating the ultrasonic switching device according to the third embodiment, the circuit, in FIG. 4, except for using of input interdigital transducer 6 and output interdigital transducer 7 in place of input interdigital transducer 3 and output interdigital transducer 4, is available. If an electric signal is applied to input interdigital transducer 6, a surface acoustic wave is excited on an area, in contact with input interdigital transducer 6, of the upper end surface of piezoelectric substrate 1. The surface acoustic wave is transmitted to an area, in contact with output interdigital transducer 7, of the upper end surface of piezoelectric substrate 1, through nonpiezoelectric plate 2, and transduced to two electric signals $E_{1a}$ and $E_{2a}$, and two electric signals $E_{1b}$ and $E_{2b}$ at output interdigital transducer 7. In this time, the sum of the electric signals $E_{1a}$ and $E_{1b}$ is zero, and the sum of the electric signals $E_{2a}$ and $E_{2b}$ is zero, because that the overlap length $L_{DP}$ is equal to the product of the overlap length $L_{DN}$ and $\sec \alpha$ as well as the product of P/2 and $\csc \alpha$. Input interdigital transducer 6 and output interdigital transducer 7 form two ultrasound propagation lanes $Z_{1a}$ and $Z_{2a}$, and two ultrasound propagation lanes $Z_{1b}$ and $Z_{2b}$, on the upper end surface of nonpiezoelectric plate 2, ultrasound propagation lane $Z_{1a}$ existing between finger-overlap zones $A_1$ and $C_1$, ultrasound propagation lane $Z_{1b}$ existing between finger-overlap zones $A_1$ and $C_2$, ultrasound propagation lane $Z_{2a}$ existing between finger-overlap zones $A_2$ and $C_2$, ultrasound propagation lane $Z_{2b}$ existing between finger-overlap zones $A_2$ and $C_3$. When the surface acoustic wave on ultrasound propagation lane $Z_{1b}$ attenuates by touching on the upper end surface of nonpiezoelectric plate 2, the electric signal $E_{1a}$ corresponding to ultrasound propagation lane $Z_{1a}$ is delivered at output interdigital transducer 7. Thus, when the surface acoustic wave on ultrasound propagation lane $Z_{1a}$, $Z_{1b}$, $Z_{2a}$ or $Z_{2b}$ attenuates, the corresponding electric signal $E_{1b}$, $E_{1a}$, $E_{2b}$ or $E_{2a}$ is delivered at output interdigital transducer 7, respectively. In this time, a weak electric signal transduced from the surface acoustic wave at each of finger-overlap zones $D_1$ and $D_2$ is not delivered at output interdigital transducer 7, whether touching on ultrasound propagation lane $Z_{1a}$, $Z_{1b}$, $Z_{2a}$ or $Z_{2b}$, or not. As a result, the choice of touch-positions on the upper end surface of nonpiezoelectric plate 2 gives the favorite output electric signal $E_{1b}$, $E_{1a}$, $E_{2b}$ or $E_{2a}$, at output interdigital transducer 7. Thus, the ultrasonic switching device has a switching ability.

Figure 14:
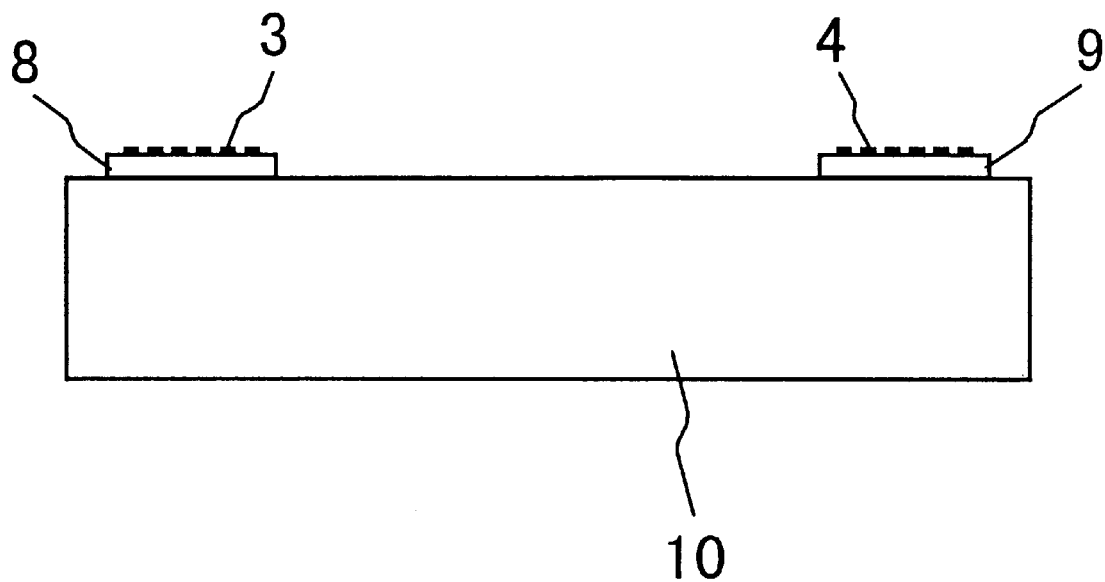
FIG. 14 shows a sectional view of an ultrasonic switching device according to a fourth embodiment of the present invention.

FIG. 14 shows a sectional view of an ultrasonic switching device according to a fourth embodiment of the present invention. The ultrasonic switching device comprises first piezoelectric substrate 8 having an upper- and a lower end surfaces running perpendicular to the direction of the thickness d thereof, second piezoelectric substrate 9 having an upper- and a lower end surfaces running perpendicular to the direction of the thickness d thereof, nonpiezoelectric plate 10 having an upper- and a lower end surfaces running perpendicular to the direction of the thickness h thereof, input interdigital transducer 3 and output interdigital transducer 4. Input interdigital transducer 3 is formed on the upper end surface of first piezoelectric substrate 8 having a dimension of 150 µm in thickness d, the polarization axis of first piezoelectric substrate 8 being parallel to the direction of the thickness d thereof. Output interdigital transducer 4 is formed on the upper end surface of second piezoelectric substrate 9 having a dimension of 150 µm in thickness d, the polarization axis of second piezoelectric substrate 9 being parallel to the direction of the thickness d thereof. First piezoelectric substrate 8 and second piezoelectric substrate 9 are cemented on the upper end surface of nonpiezoelectric plate 10 having a dimension of 1.5 mm in thickness h.

When operating the ultrasonic switching device according to the fourth embodiment, the circuit in FIG. 4 is available. If an electric signal having a frequency approximately corresponding to the interdigital periodicity P is applied to input interdigital transducer 3, a surface acoustic wave, of the first mode and the higher order modes, having the wavelength approximately equal to the interdigital periodicity P is excited in first piezoelectric substrate 8 effectively. In this time, if the phase velocity of the surface acoustic wave of the first mode and the higher order modes is approximately equal to the phase velocity of the Rayleigh wave traveling on nonpiezoelectric plate 10 alone, the transducing efficiency from the electric signal to the surface acoustic wave increases, and in addition, the reflection caused by the miss-matching on the acoustic impedance at the boundary surface between first piezoelectric substrate 8 and nonpiezoelectric plate 10 never causes. In addition, as first piezoelectric substrate 8 is made from a piezoelectric ceramic having the polarization axis parallel to the direction of the thickness d thereof, the surface acoustic wave of the first mode and the higher order modes is excited in first piezoelectric substrate 8 effectively, and the transducing efficiency from the electric signal to the surface acoustic wave increases. If using a piezoelectric polymer such as PVDF and so on, as first piezoelectric substrate 8, the surface acoustic wave of the first mode and the higher order modes is excited in first piezoelectric substrate 8 effectively, and the transducing efficiency from the electric signal to the surface acoustic wave increases.

The surface acoustic wave excited in first piezoelectric substrate 8 is transmitted to the upper end surface of nonpiezoelectric plate 10. As the thickness d of first piezoelectric substrate 8 is smaller than the interdigital periodicity P, and the thickness h of nonpiezoelectric plate 10 is larger than three times the interdigital periodicity P, the transmitting efficiency of the surface acoustic wave from first piezoelectric substrate 8 to the upper end surface of nonpiezoelectric plate 10 increases without a leakage of the surface acoustic wave on the inside of nonpiezoelectric plate 10. In addition, if using a material, as nonpiezoelectric plate 10, such that the phase velocity of the surface acoustic wave traveling on nonpiezoelectric plate 10 alone is higher than that traveling on first piezoelectric substrate 8 alone, the transmitting efficiency of the surface acoustic wave from first piezoelectric substrate 8 to the upper end surface of nonpiezoelectric plate 10 increases without a leakage of the surface acoustic wave on the inside of nonpiezoelectric plate 10. Thus, it is possible to operate the ultrasonic switching device under low power consumption and low voltage.

The surface acoustic wave on the upper end surface of nonpiezoelectric plate 10 is transmitted to second piezoelectric substrate 9, and transduced to electric signals $E_{1a}$ and $E_{1b}$ at zones $R_{1a}$ and $R_{1b}$, respectively. Input interdigital transducer 3 and output interdigital transducer 4 form two ultrasound propagation lanes $Z_{1a}$ and $Z_{1b}$ on the upper end surface of nonpiezoelectric plate 10. A switching ability of the ultrasonic switching device according to the fourth embodiment is displayed by touching on the upper end surface of nonpiezoelectric plate 10.

Figure 15:
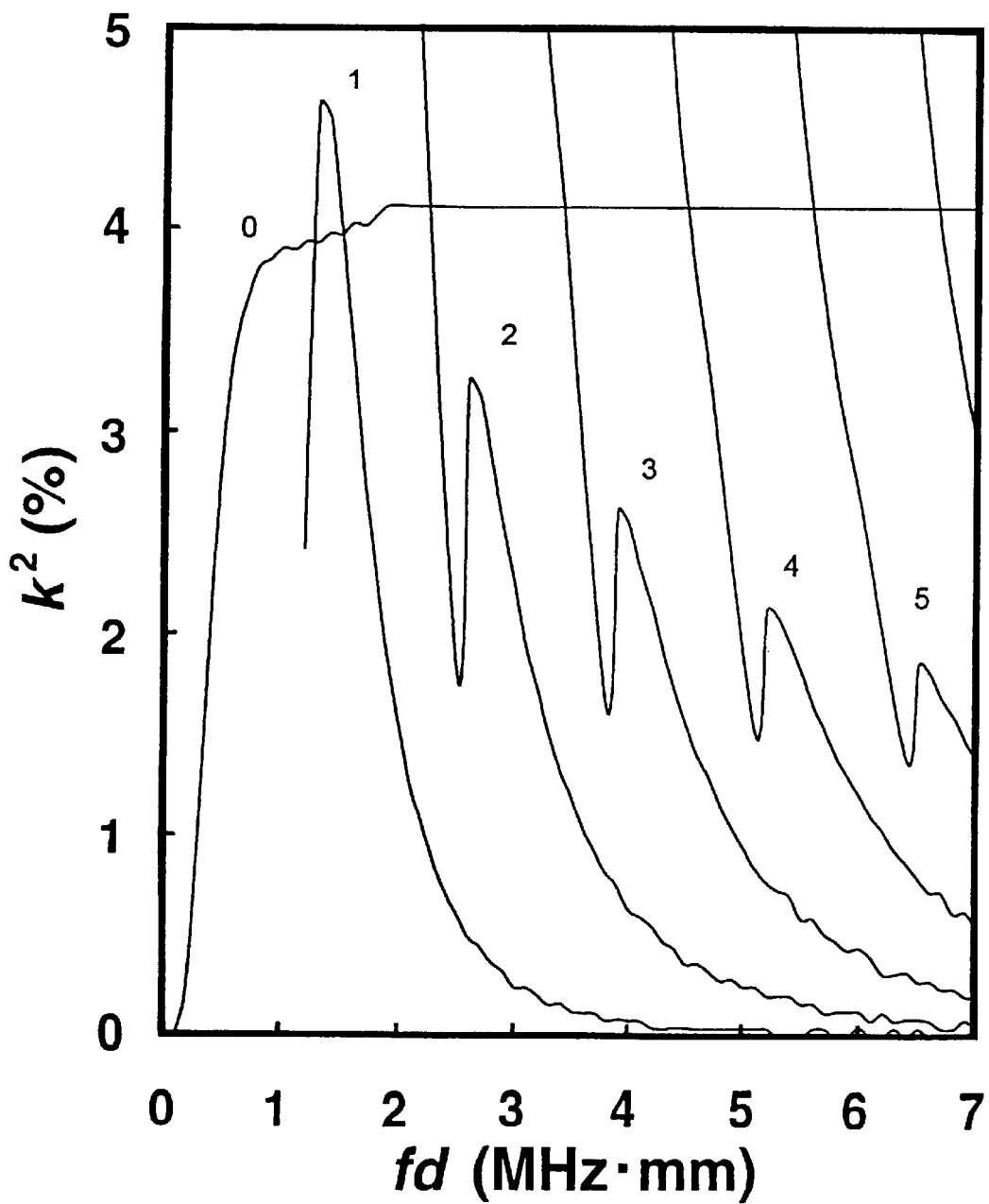
FIG. 15 shows a relationship between the $k^2$ value calculated from the difference between the phase velocity under electrically opened condition and that under electrically shorted condition of first piezoelectric substrate 8, and the fd value.

FIG. 15 shows a relationship between the $k^2$ value calculated from the difference between the phase velocity under electrically opened condition and that under electrically shorted condition of first piezoelectric substrate 8, and the product fd of the frequency f of the surface acoustic wave and the thickness d of first piezoelectric substrate 8. In FIG. 15, nonpiezoelectric plate 10 is made from a glass having a shear wave velocity of 3091 m/s and a longitudinal wave velocity of 5592 m/s traveling on the glass alone. The velocities of 3091 m/s and 5592 m/s are about 1.3 times the velocities of a shear- and a longitudinal waves, 2450 m/s and 4390 m/s, respectively, in first piezoelectric substrate 8 alone. An electric energy applied to input interdigital transducer 3 is most effectively transduced to the first mode surface acoustic wave when the fd value is approximately 1.3 MHz.mm, then the $k^2$ value is approximately 4.7% being the maximum value.

Figure 16:
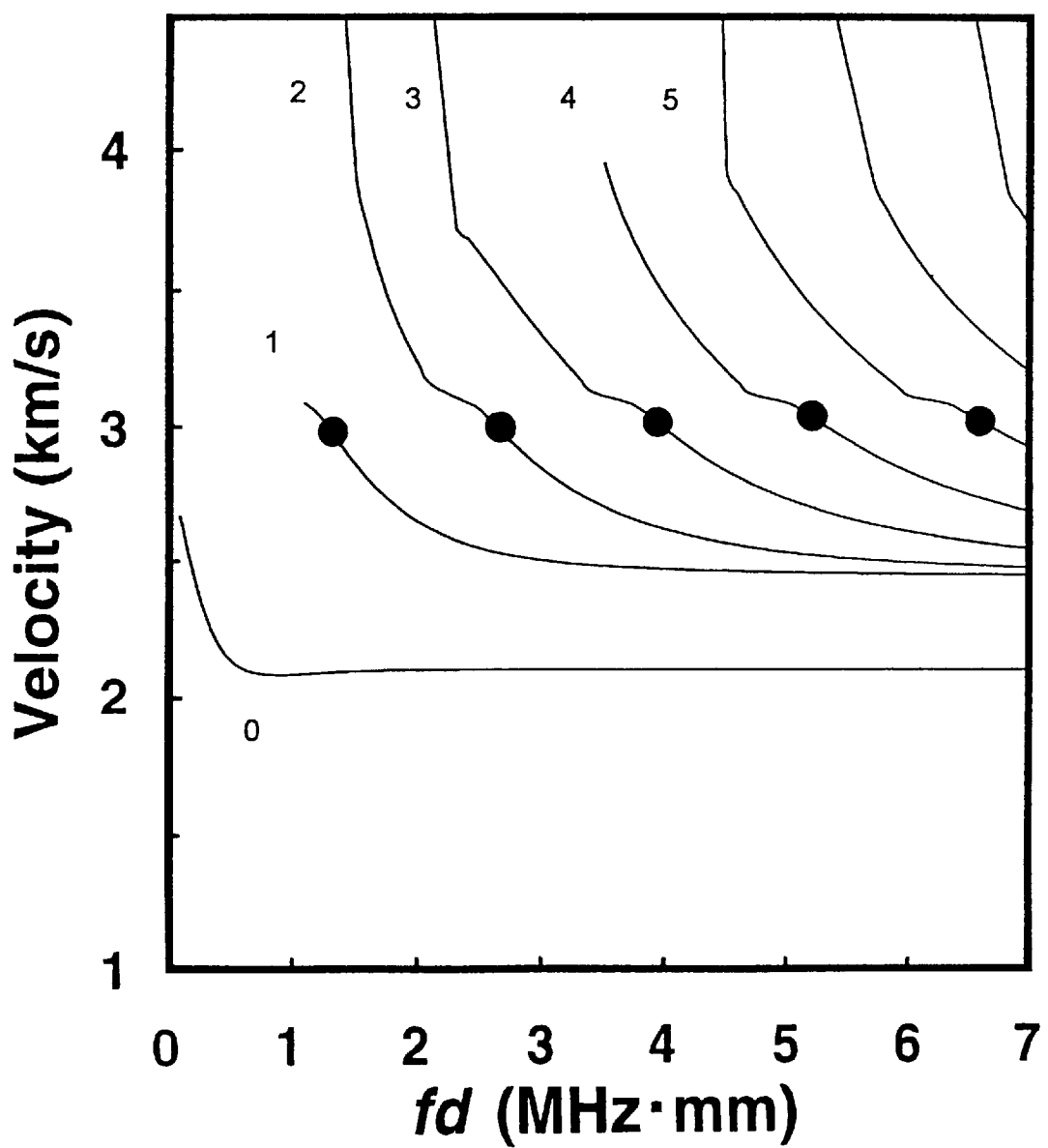
FIG. 16 shows a relationship between the phase velocity of the surface acoustic wave for each mode in first piezoelectric substrate 8, and the fd value.

FIG. 16 shows a relationship between the phase velocity of the surface acoustic wave for each mode in first piezoelectric substrate 8, and the fd value. In FIG. 16, nonpiezoelectric plate 10 is made from the same glass as FIG. 15. The fd value at each mark ● has the maximum $k^2$ value where an electric energy applied to input interdigital transducer 3 is most effectively transduced to the surface acoustic wave, the maximum $k^2$ value being obtained from FIG. 15. The phase velocity of the surface acoustic wave of the first mode and the higher order modes at the mark ● is approximately 2980 m/s, which is approximately equal to the phase velocity of the Rayleigh wave traveling on nonpiezoelectric plate 10 alone, the phase velocity of the Rayleigh wave being 2850 m/s.

Figure 17:
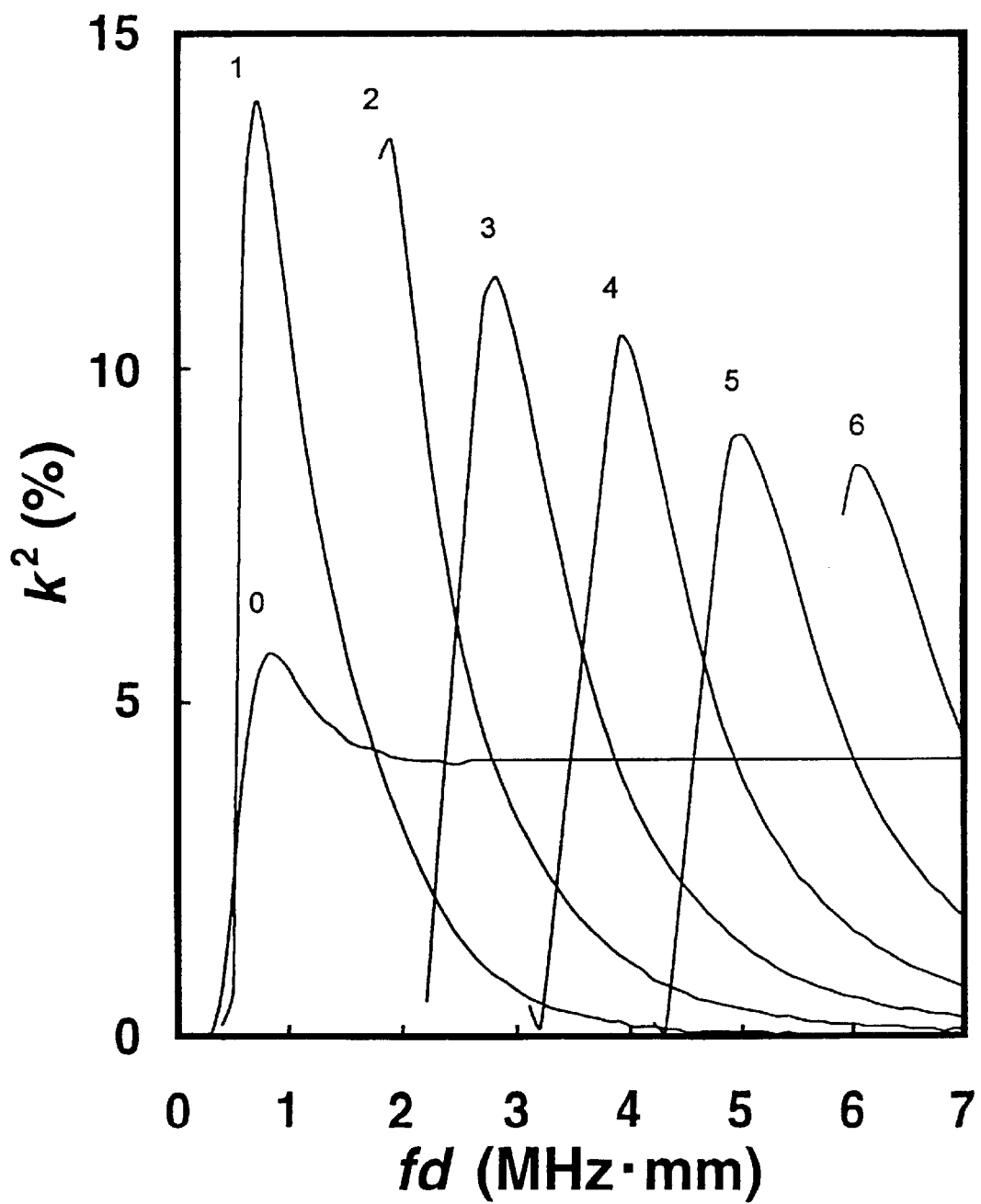
FIG. 17 shows a relationship between the $k^2$ value calculated from the difference between the phase velocity under electrically opened condition and that under electrically shorted condition of first piezoelectric substrate 8, and the fd value.

FIG. 17 shows a relationship between the $k^2$ value calculated from the difference between the phase velocity under electrically opened condition and that under electrically shorted condition of first piezoelectric substrate 8, and the fd value. In FIG. 17, nonpiezoelectric plate 10 is made from a glass having a shear wave velocity of 4203 m/s and a longitudinal wave velocity of 7604 m/s traveling on the glass alone. The velocities of 4203 m/s and 7604 m/s are about 1.7 times the velocities of a shear- and a longitudinal waves, 2450 m/s and 4390 m/s, respectively, in first piezoelectric substrate 8 alone. An electric energy applied to input interdigital transducer 3 is most effectively transduced the first mode surface acoustic wave when the fd value is approximately 0.7 MHz.mm, then the $k^2$ value is approximately 14.0% being the maximum value.

Figure 18:
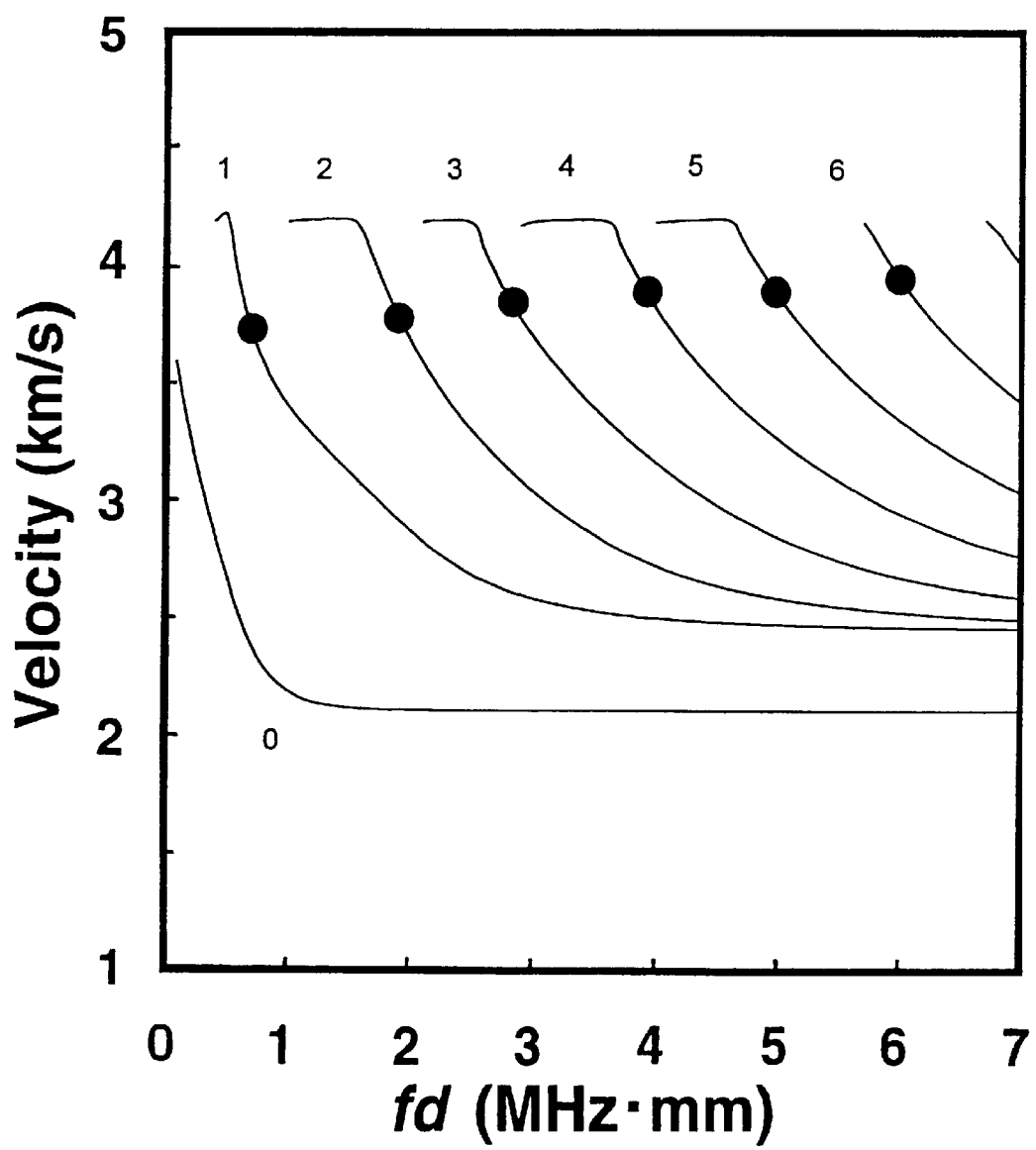
FIG. 18 shows a relationship between the phase velocity of the surface acoustic wave with each mode in first piezoelectric substrate 8, and the fd value.

FIG. 18 shows a relationship between the phase velocity of the surface acoustic wave with each mode in first piezoelectric substrate 8, and the fd value. In FIG. 18, nonpiezoelectric plate 10 is made from the same glass as FIG. 8. The fd value at each mark ● has the maximum $k^2$ value where an electric energy applied to input interdigital transducer 3 is most effectively transduced to the surface acoustic wave, the maximum $k^2$ value being obtained from FIG. 17. The phase velocity of the surface acoustic wave of the first mode and the higher order modes at the mark ● is approximately 3800 m/s, which is approximately equal to the phase velocity of the Rayleigh wave traveling on nonpiezoelectric plate 10 alone, the phase velocity of the Rayleigh wave being 3860 m/s.

It is clear from FIGS. 15~18 that an electric energy applied to the input interdigital transducer 3 is most effectively transduced to the surface acoustic wave of the first mode and the higher order modes having the phase velocity approximately equal to the phase velocity of the Rayleigh wave traveling on nonpiezoelectric plate 10 alone. In the same way, the surface acoustic wave, of the first mode and the higher order modes, having the phase velocity approximately equal to the phase velocity of the Rayleigh wave traveling on nonpiezoelectric plate 10 alone, is most effectively transduced to an electric signal at output interdigital transducer 4.

In addition, it is possible not only to use output interdigital transducer 5 in place of output interdigital transducer 4, but also to use input interdigital transducer 6 and output interdigital transducer 7 in place of input interdigital transducer 3 and output interdigital transducer 4 in the ultrasonic switching device according to the fourth embodiment in FIG. 14.

Figure 19:
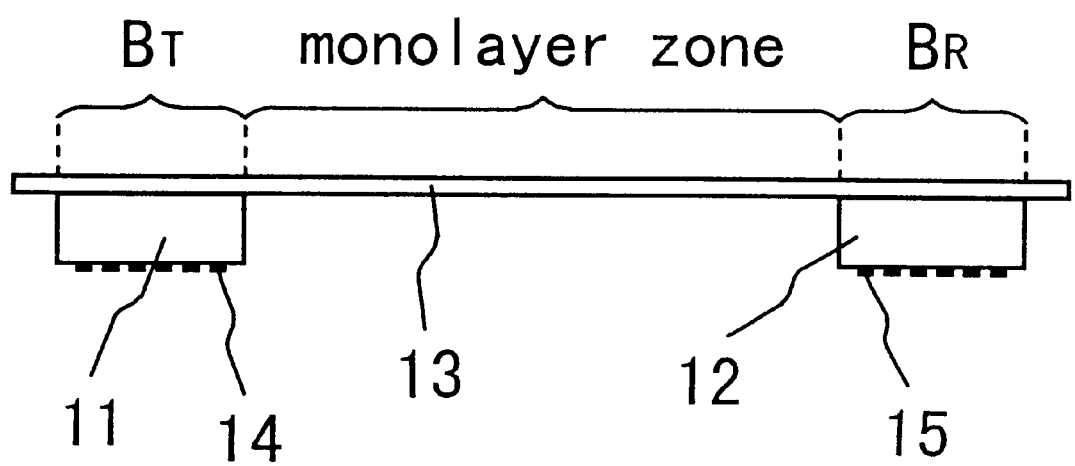
FIG. 19 shows a sectional view of an ultrasonic switching device according to a fifth embodiment of the present invention.

FIG. 19 shows a sectional view of an ultrasonic switching device according to a fifth embodiment of the present invention. The ultrasonic switching device comprises first piezoelectric substrate 11 having an upper- and a lower end surfaces running perpendicular to the direction of the thickness d thereof, second piezoelectric substrate 12 having an upper- and a lower end surfaces running perpendicular to the direction of the thickness d thereof, nonpiezoelectric plate 13 having an upper- and a lower end surfaces running perpendicular to the direction of the thickness h thereof, input interdigital transducer 14 with ten finger pairs, and output interdigital transducer 15 with ten finger pairs. Input interdigital transducer 14 has the same construction as input interdigital transducer 3, except for the value of the interdigital periodicity P, and is formed at the lower end surface of first piezoelectric substrate 11 having a dimension of 1 mm in thickness d, the polarization axis of first piezoelectric substrate 11 being parallel to the direction of the thickness d thereof. Output interdigital transducer 15 has the same construction as output interdigital transducer 4, except for the value of the interdigital periodicity, and is formed at the lower end surface of second piezoelectric substrate 12 having a dimension of 1 mm in thickness d, the polarization axis of second piezoelectric substrate 12 being parallel to the direction of the thickness d thereof. First piezoelectric substrate 11 and second piezoelectric substrate 12 are cemented at the lower end surface of nonpiezoelectric plate 13 having a dimension of 150 μm in thickness h. A part, adjacent to first piezoelectric substrate 11, of nonpiezoelectric plate 13, and first piezoelectric substrate 11 form a bilayer zone $B_T$. A part, adjacent to second piezoelectric substrate 12, of nonpiezoelectric plate 13, and second piezoelectric substrate 12 form a bilayer zone $B_R$, a remaining part, between the bilayer zones $B_T$ and $B_R$, of nonpiezoelectric plate 13 forms a monolayer zone. The relative positions of input interdigital transducer 14 and output interdigital transducer 15 in the ultrasonic switching device according to the fifth embodiment are substantially the same as those of input interdigital transducer 3 and output interdigital transducer 4 shown in FIG. 2. Input interdigital transducer 14 has an interdigital periodicity P of 1.6 mm and an overlap length L of 15 mm.

When operating the ultrasonic switching device according to the fifth embodiment, the circuit, in FIG. 4, except for using of input interdigital transducer 14 and output interdigital transducer 15 in place of input interdigital transducer 3 and output interdigital transducer 4, is available. If an electric signal having a frequency approximately corresponding to the interdigital periodicity P is applied to input interdigital transducer 14, an elastic wave, of the $S_0$ mode and the higher order modes, having the wavelength approximately equal to the interdigital periodicity P is excited in the bilayer zone $B_T$ effectively. In this time, if the phase velocity of the elastic wave of the $S_0$ mode and the higher order modes is approximately equal to the phase velocity $V_{fd=0}$, of the $S_0$ mode elastic wave, corresponding to a condition that the product fd of the frequency f of the elastic wave and the thickness d is approximated to be zero, the transducing efficiency from the electric signal to the elastic wave increases, and in addition, the reflection caused by the miss-matching on the acoustic impedance at the boundary surface between first piezoelectric substrate 11 and nonpiezoelectric plate 13 never causes. In addition, as piezoelectric substrate 11 is made from a piezoelectric ceramic having the polarization axis parallel to the direction of the thickness d thereof, the elastic wave of the $S_0$ mode and the higher order modes is excited in the bilayer zone $B_T$ effectively, and the transducing efficiency from the electric signal to the elastic wave increases. If using a piezoelectric polymer such as PVDF and so on, as piezoelectric substrate 11, the elastic wave of the $S_0$ mode and the higher order modes is excited in the bilayer zone $B_T$ effectively, and the transducing efficiency from the electric signal to the elastic wave increases. In addition, it is possible to operate the ultrasonic switching device under low power consumption and low voltage.

The elastic wave excited in the bilayer zone $B_T$ is transmitted to the bilayer zone $B_R$ through the monolayer zone. As the thickness d of first piezoelectric substrate 11 and second piezoelectric substrate 12 is smaller than the interdigital periodicity P, and the thickness h of nonpiezoelectric plate 13 is smaller than the thickness d, it is possible to increase the transmitting efficiency of the elastic wave from the bilayer zone $B_T$ to the bilayer zone $B_R$ on condition that nonpiezoelectric plate 13 is made of a material such that the phase velocity of the elastic wave traveling on nonpiezoelectric plate 13 alone is higher than that traveling on first piezoelectric substrate 11 alone and second piezoelectric substrate 12 alone.

The elastic wave transmitted to the bilayer zone $B_R$ is transduced to electric signals $E_{1a}$ and $E_{1b}$ at zones $R_{1a}$ and $R_{1b}$, respectively. Input interdigital transducer 14 and output interdigital transducer 15 form two ultrasound propagation lanes $Z_{1a}$ and $Z_{1b}$ in the monolayer zone. A switching ability of the ultrasonic switching device according to the fifth embodiment is displayed by touching on an upper- or a lower end surface of the monolayer zone.

Figure 20:
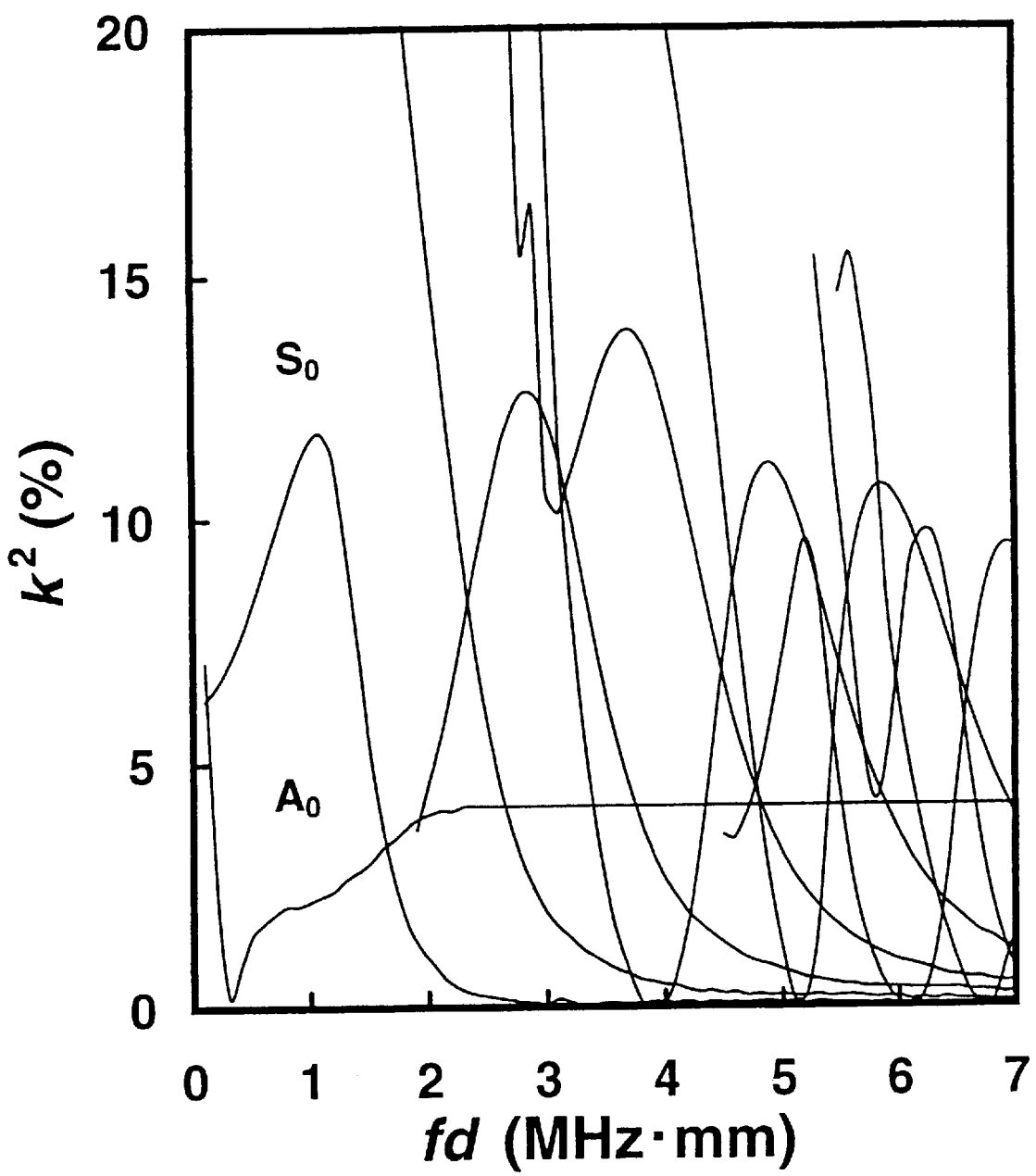
FIG. 20 shows a relationship between the $k^2$ value calculated from the difference between the phase velocity under electrically opened condition and that under electrically shorted condition of first piezoelectric substrate 11 of the bilayer zone $B_T$ in FIG. 19, and the fd value.

FIG. 20 shows a relationship between the $k^2$ value calculated from the difference between the phase velocity under electrically opened condition and that under electrically shorted condition of first piezoelectric substrate 11 of the bilayer zone $B_T$ in FIG. 19, and the product fd of the frequency f of the elastic wave and the thickness d of first piezoelectric substrate 11. In FIG. 20, nonpiezoelectric plate 13 is made from a glass having a shear wave velocity of 4203 m/s and a longitudinal wave velocity of 7604 m/s traveling on the glass alone. The velocities of 4203 m/s and 7604 m/s are about 1.7 times the velocities of a shear- and a longitudinal waves, 2450 m/s and 4390 m/s, respectively, in first piezoelectric substrate 11 alone. The $A_0$ mode elastic wave has the $k^2$ value under 5%. Accordingly, it is clear that the elastic wave of all the modes, except for the $A_0$ mode, that is the elastic wave of the $S_0$ mode and the higher order modes, is excited in the bilayer zone $B_T$ effectively. An electric energy applied to input interdigital transducer 14 is most effectively transduced, for example to the $A_2$ mode elastic wave when the fd value is approximately 3.8 MHz.mm, then the $k^2$ value is approximately 14% being the maximum value.

Figure 21:
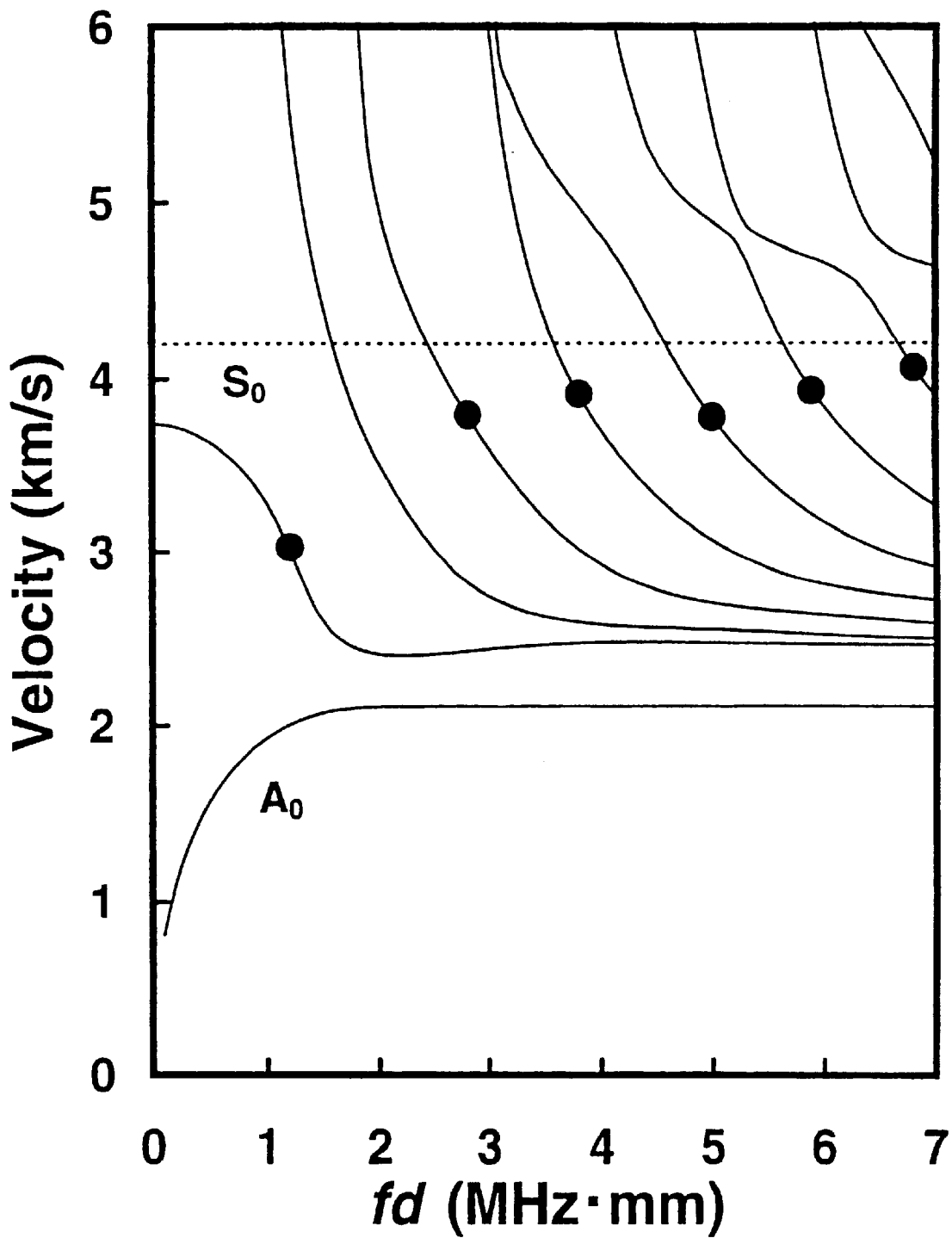
FIG. 21 shows a relationship between the phase velocity of the elastic wave for each mode in the bilayer zone $B_T$ in FIG. 19, and the fd value.

FIG. 21 shows a relationship between the phase velocity of the elastic wave for each mode in the bilayer zone $B_T$ in FIG. 19, and the fd value. In FIG. 21, nonpiezoelectric plate 13 is made from the same glass as FIG. 20. The fd value at each mark ● has the maximum $k^2$ value where an electric energy applied to input interdigital transducer 14 is most effectively transduced the elastic wave, the maximum $k^2$ value being obtained from FIG. 20. The $V_{fd=0}$ value is approximately 3750 m/s, the $V_{fd=0}$ value showing the phase velocity of the $S_0$ mode elastic wave, corresponding to a condition that the product fd of the frequency f of the elastic wave excited in the bilayer zone $B_T$ and the thickness d of first piezoelectric substrate 11 is approximated to be zero. The phase velocity at each mark ● is approximately equal to the $V_{fd=0}$ value. Thus, the fd value, in which the phase velocity of the elastic wave in the bilayer zone $B_T$ is approximately equal to the $V_{fd=0}$ value, gives the maximum $k^2$ value.

In addition, it is possible to use output interdigital transducer 16 in place of output interdigital transducer 15 in the ultrasonic switching device according to the fifth embodiment in FIG. 19. Output interdigital transducer 16 has the same construction as output interdigital transducer 5, except for the value of the interdigital periodicity. When using output interdigital transducer 16, the relative positions of input interdigital transducer 14 and output interdigital transducer 16 in the ultrasonic switching device according to the fifth embodiment are substantially the same as those of input interdigital transducer 3 and output interdigital transducer 5 shown in FIG. 9. Moreover, it is possible to use input interdigital transducer 17 and output interdigital transducer 18 in place of input interdigital transducer 14 and output interdigital transducer 15 in the ultrasonic switching device according to the fifth embodiment. Input interdigital transducer 17 has the same construction as input interdigital transducer 6, except for the value of the interdigital periodicity. Output interdigital transducer 18 has the same construction as output interdigital transducer 7, except for the value of the interdigital periodicity. When using input interdigital transducer 17 and output interdigital transducer 18, the relative positions of input interdigital transducer 17 and output interdigital transducer 18 in the ultrasonic switching device according to the fifth embodiment are substantially the same as those of input interdigital transducer 6 and output interdigital transducer 7 shown in FIG. 11.

Figure 22:
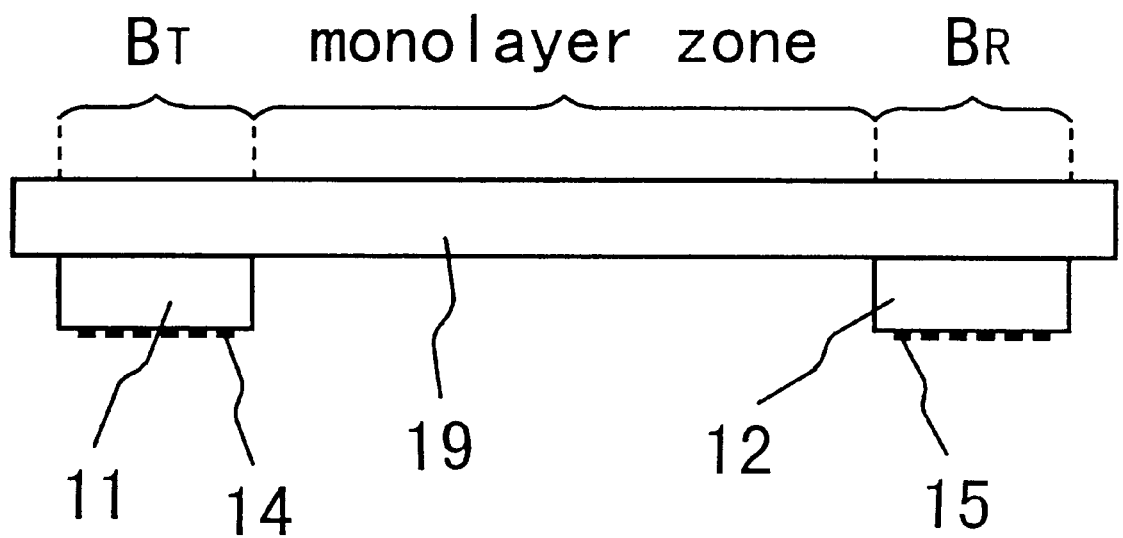
FIG. 22 shows a sectional view of an ultrasonic switching device according to a sixth embodiment of the present invention.

FIG. 22 shows a sectional view of an ultrasonic switching device according to a sixth embodiment of the present invention. The ultrasonic switching device has the same construction as that in FIG. 19, except for using of nonpiezoelectric plate 19 in place of nonpiezoelectric plate 13. Nonpiezoelectric plate 19, having an upper- and a lower end surfaces running perpendicular to the direction of the thickness h thereof, has a dimension of 150 $\mu$m in thickness h. The ultrasonic switching device according to the sixth embodiment, where the thickness d of first piezoelectric substrate 11 and second piezoelectric substrate 12 is smaller than the interdigital periodicity P, and the thickness h of nonpiezoelectric plate 19 is equal to the thickness d, is operated in the same way as that according to the fifth embodiment, and has the same function as that according to the fifth embodiment. Thus, it is possible to increase the transmitting efficiency of the elastic wave from the bilayer zone $B_T$ to the bilayer zone $B_R$ on condition that nonpiezoelectric plate 19 is made of a material such that the phase velocity of the elastic wave traveling on nonpiezoelectric plate 19 alone is equal to that traveling on first piezoelectric substrate 11 alone and second piezoelectric substrate 12 alone.

Figure 23:
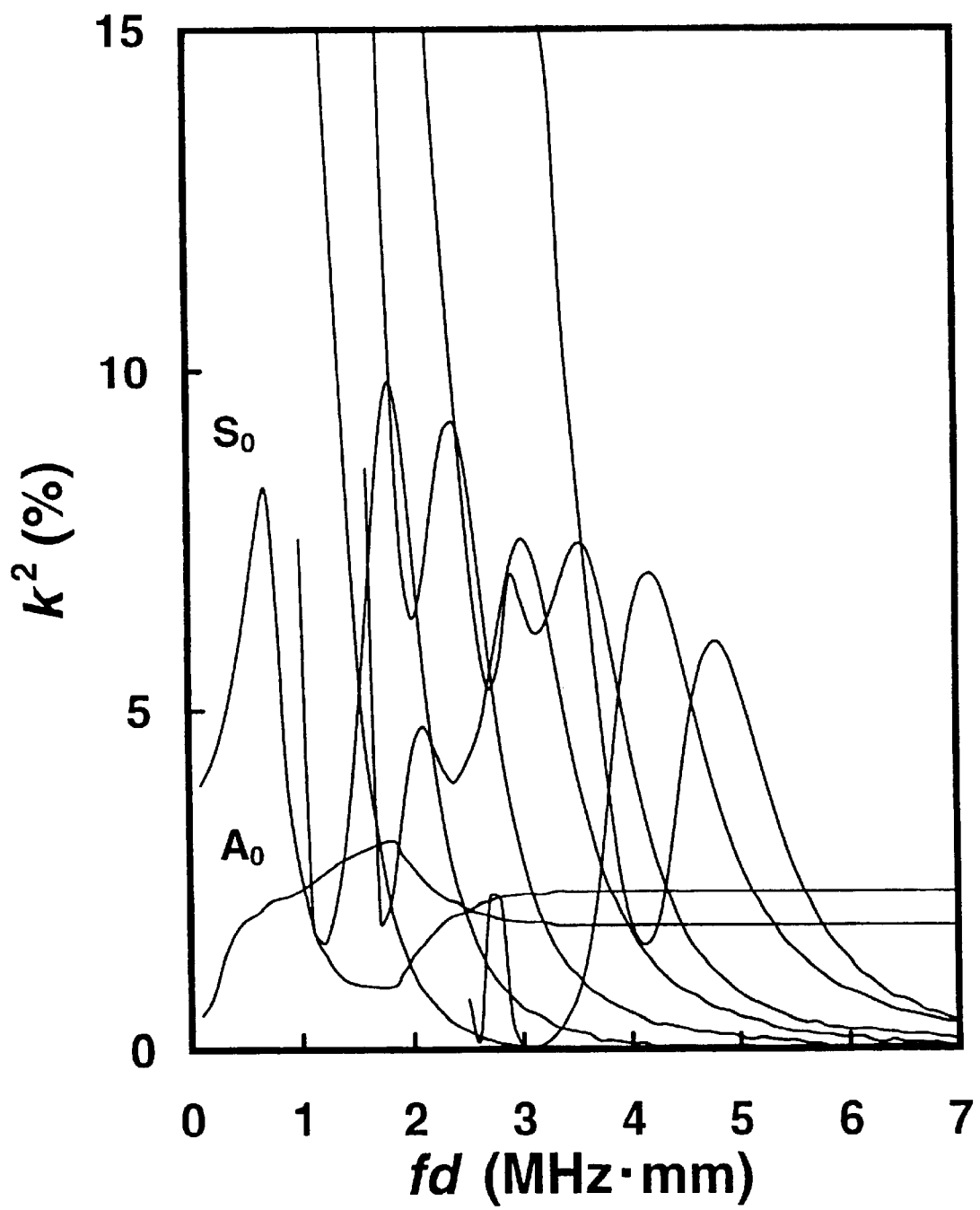
FIG. 23 shows a relationship between the $k^2$ value calculated from the difference between the phase velocity under electrically opened condition and that under electrically shorted condition of first piezoelectric substrate 11 of the bilayer zone $B_T$ in FIG. 22, and the fd value.

FIG. 23 shows a relationship between the $k^2$ value calculated from the difference between the phase velocity under electrically opened condition and that under electrically shorted condition of first piezoelectric substrate 11 of the bilayer zone $B_T$ in FIG. 22, and the fd value. In FIG. 23 nonpiezoelectric plate 19 is made from a glass having a shear wave velocity of 2297 m/s and a longitudinal wave velocity of 4155 m/s traveling the glass alone. The velocities of 2297 m/s and 4155 m/s are approximately equal to the velocities of a shear- and a longitudinal waves, 2450 m/s and 4390 m/s, respectively, in first piezoelectric substrate 11 alone. The $A_0$ mode elastic wave has the $k^2$ value under 5%. Accordingly, it is clear that the elastic wave of all the modes, except for the $A_0$ mode, that is the elastic wave of the $S_0$ mode and the higher order modes, is excited in the bilayer zone $B_T$ effectively. An electric energy applied to input interdigital transducer 14 is most effectively transduced, for example to the $S_1$ mode elastic wave when the fd value is approximately 1.8 MHz.mm, then the $k^2$ value is approximately 9.5% being the maximum value.

Figure 24:
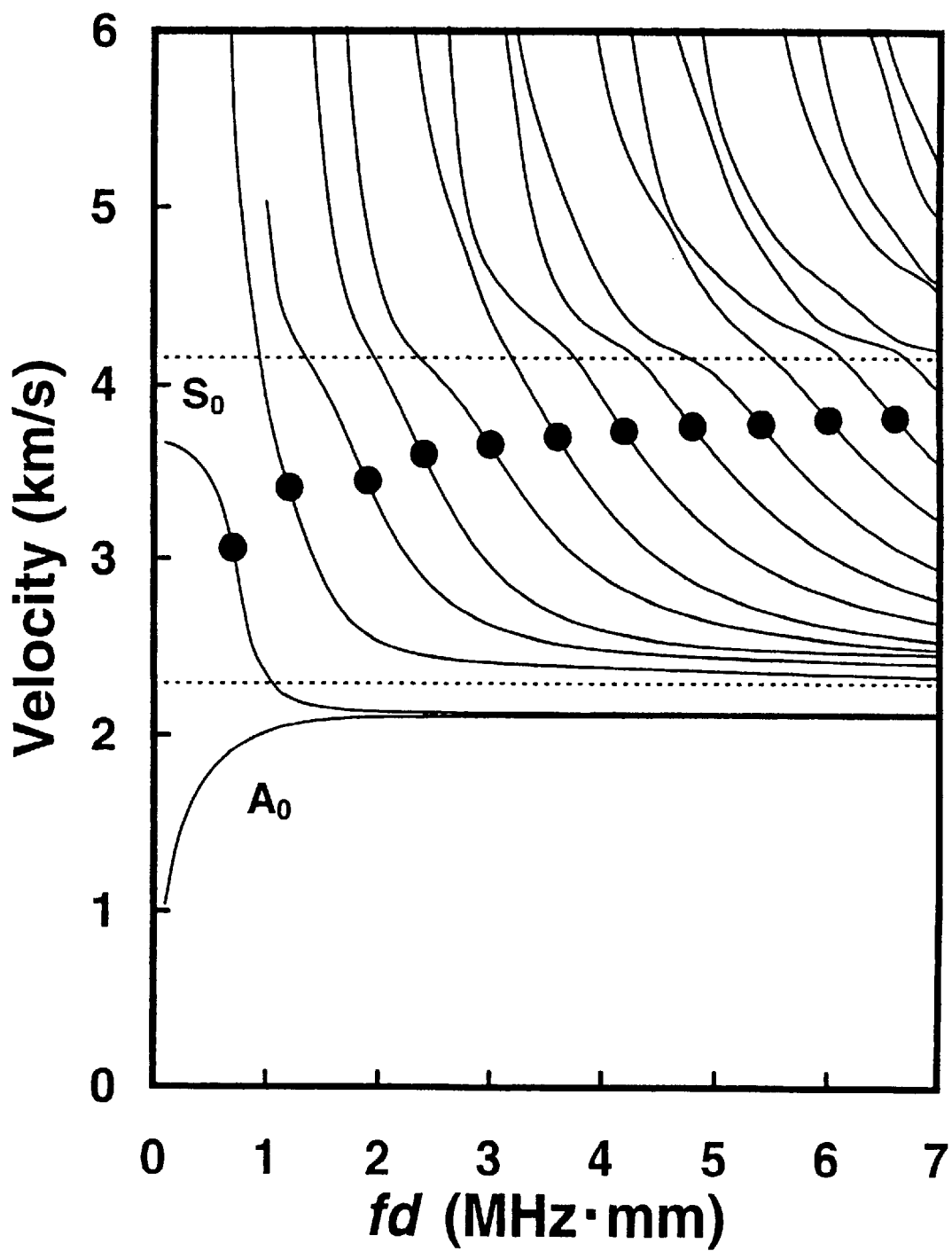
FIG. 24 shows a relationship between the phase velocity of the elastic wave for each mode in the bilayer zone $B_T$ in FIG. 22, and the fd value.

FIG. 24 shows a relationship between the phase velocity of the elastic wave for each mode in the bilayer zone $B_T$ in FIG. 22, and the fd value. In FIG. 24, nonpiezoelectric plate 19 is made from the same glass as FIG. 23. The fd value at each mark ● has the maximum $k^2$ value where an electric energy applied to input interdigital transducer 14 is most effectively transduced to the elastic wave, the maximum $k^2$ value being obtained from FIG. 23. The $V_{fd=0}$ value is approximately 3670 m/s. The phase velocity at each mark ● is approximately equal to the $V_{fd=0}$ value. Thus, the fd value, in which the phase velocity of the elastic wave in the bilayer zone $B_T$ is approximately equal to the $V_{fd=0}$ value, gives the maximum $k^2$ value.

In addition, it is possible not only to use output interdigital transducer 16 in place of output interdigital transducer 15, but also to use input interdigital transducer 17 and output interdigital transducer 18 in place of input interdigital transducer 14 and output interdigital transducer 15 in the ultrasonic switching device according to the sixth embodiment in FIG. 22.

Figure 25:
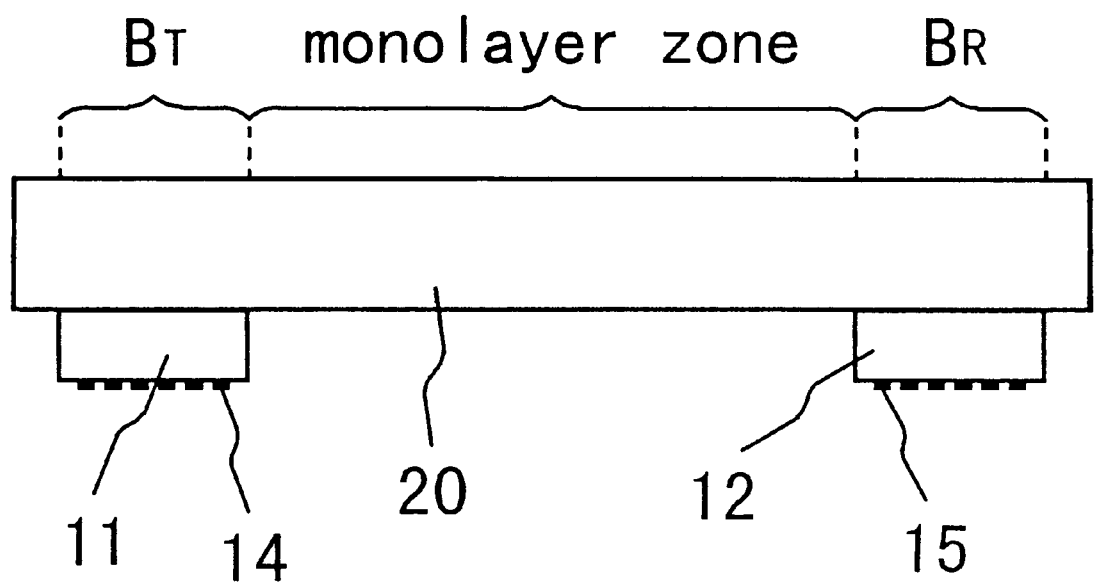
FIG. 25 shows a sectional view of an ultrasonic switching device according to a seventh embodiment of the present invention.

FIG. 25 shows a sectional view of an ultrasonic switching device according to a seventh embodiment of the present invention. The ultrasonic switching device has the same construction as that in FIG. 19, except for using of nonpiezoelectric plate 20 in place of nonpiezoelectric plate 13. Nonpiezoelectric plate 20, having an upper- and a lower end surfaces running perpendicular to the direction of the thickness h thereof, has a dimension of 1.5 mm in thickness h. The ultrasonic switching device according to the seventh embodiment, where the thickness d of first piezoelectric substrate 11 and second piezoelectric substrate 12 is smaller than the interdigital periodicity P, and the thickness h of nonpiezoelectric plate 20 is larger than the thickness d, is operated in the same way as that according to the fifth embodiment, and has the same function as that according to the fifth embodiment. Thus, it is possible to increase the transmitting efficiency of the elastic wave from the bilayer zone $B_T$ to the bilayer zone $B_R$ on condition that nonpiezoelectric plate 20 is made of a material such that the phase velocity of the elastic wave traveling on nonpiezoelectric plate 20 alone is lower than that traveling on first piezoelectric substrate 11 alone and second piezoelectric substrate 12 alone.

Figure 26:
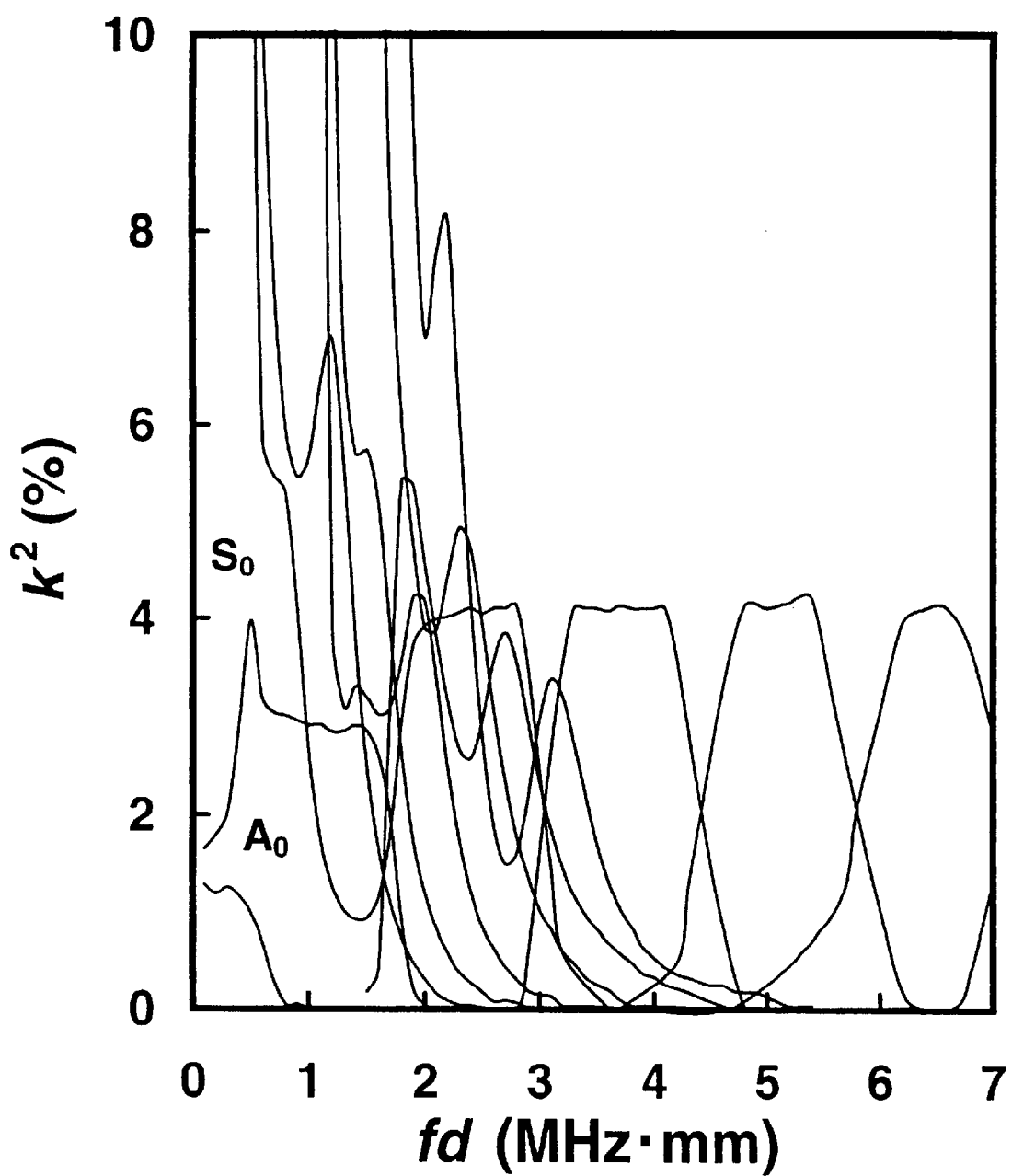
FIG. 26 shows a relationship between the $k^2$ value calculated from the difference between the phase velocity under electrically opened condition and that under electrically shorted condition of first piezoelectric substrate 11 of the bilayer zone $B_T$ in FIG. 25, and the product fd.

FIG. 26 shows a relationship between the $k^2$ value calculated from the difference between the phase velocity under electrically opened condition and that under electrically shorted condition of first piezoelectric substrate 11 of the bilayer zone $B_T$ in FIG. 25, and the fd value. In FIG. 26, nonpiezoelectric plate 20 is made from a glass having a shear wave velocity of 1988 m/s and a longitudinal wave velocity of 3597 m/s traveling on the glass alone. The velocities of 1988 m/s and 3597 m/s are about 0.8 times the velocities of a shear- and a longitudinal waves, 2450 m/s and 4390 m/s, respectively, in first piezoelectric substrate 11 alone. The $A_0$ mode elastic wave has the $k^2$ value under 5%. Accordingly, it is clear that the elastic wave of all the modes, except for the $A_0$ mode, that is the elastic wave of the $S_0$ mode and the higher order modes, is excited in the bilayer zone $B_T$ effectively.

Figure 27:
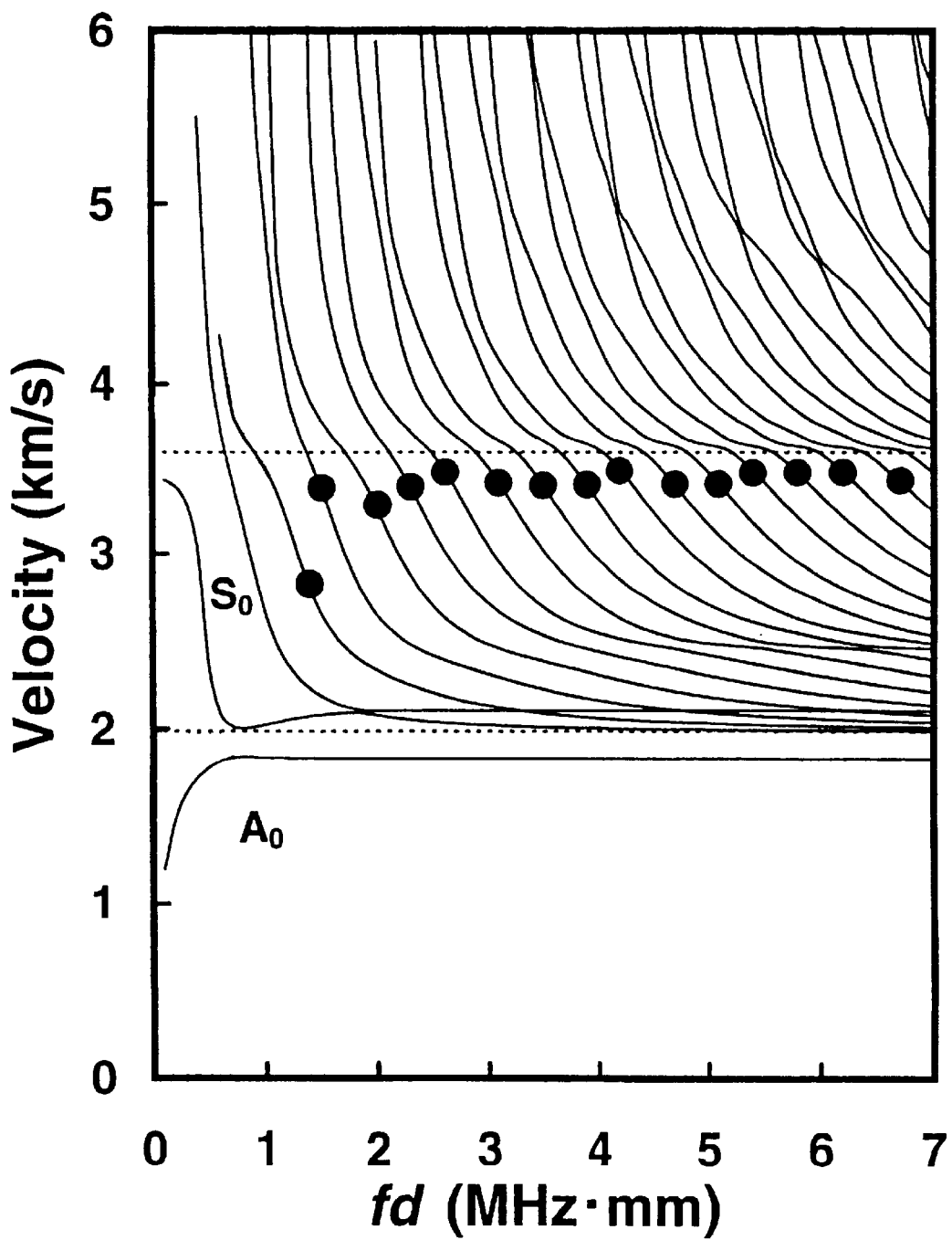
FIG. 27 shows a relationship between the phase velocity of the elastic wave for each mode in the bilayer zone $B_T$ in FIG. 25, and the fd value.

FIG. 27 shows a relationship between the phase velocity of the elastic wave for each mode in the bilayer zone $B_T$ in FIG. 25, and the fd value. In FIG. 27, nonpiezoelectric plate 20 is made from the same glass as FIG. 26. The fd value at each mark ● has the maximum $k^2$ value where an electric energy applied to input interdigital transducer 14 is most effectively transduced to the elastic wave, the maximum $k^2$ value being obtained from FIG. 26. The $V_{fd=0}$ value is approximately 3500 m/s. The phase velocity at each mark ● is approximately equal to the $V_{fd=0}$ value. Thus, the fd value, in which the phase velocity of the elastic wave in the bilayer zone $B_T$ is approximately equal to the $V_{fd=0}$ value, gives the maximum $k^2$ value.

In addition, it is possible not only to use output interdigital transducer 16 in place of output interdigital transducer 15, but also to use input interdigital transducer 17 and output interdigital transducer 18 in place of input interdigital transducer 14 and output interdigital transducer 15 in the ultrasonic switching device according to the seventh embodiment in FIG. 25.

Figure 28:
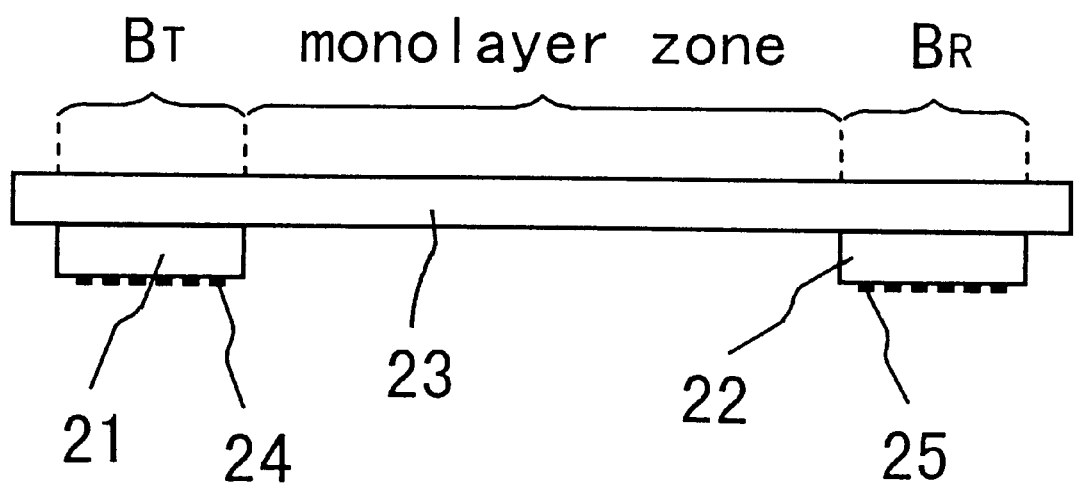
FIG. 28 shows a sectional view of an ultrasonic switching device according to a eighth embodiment of the present invention.

FIG. 28 shows a sectional view of an ultrasonic switching device according to an eighth embodiment of the present invention. The ultrasonic switching device comprises first piezoelectric substrate 21 having an upper- and a lower end surfaces running perpendicular to the direction of the thickness d thereof, second piezoelectric substrate 22 having an upper- and a lower end surfaces running perpendicular to the direction of the thickness d thereof, nonpiezoelectric plate 23, input interdigital transducer 24 with three finger pairs, and output interdigital transducer 25 with three finger pairs. Input interdigital transducer 24 has the same construction as input interdigital transducer 3, except for the value of the interdigital periodicity P and the number of finger pairs, and is formed at the lower end surface of first piezoelectric substrate 21 having a dimension of 200 $\mu$m in thickness d, the polarization axis of first piezoelectric substrate 21 being parallel to the finger direction of input interdigital transducer 24. Output interdigital transducer 25 has the same construction as output interdigital transducer 4, except for the value of the interdigital periodicity and the number of finger pairs, and is formed at the lower end surface of second piezoelectric substrate 22 having a dimension of 200 $\mu$m in thickness d, the polarization axis of second piezoelectric substrate 22 being parallel to the finger direction of output interdigital transducer 25. First piezoelectric substrate 21 and second piezoelectric substrate 22 are cemented at the lower end surface of nonpiezoelectric plate 23 having a dimension of 200 $\mu$m in thickness h. Both the boundary surface of first piezoelectric substrate 21 and nonpiezoelectric plate 23, and that of second piezoelectric substrate 22 and nonpiezoelectric plate 23 are under electrically opened condition. The relative positions of input interdigital transducer 24 and output interdigital transducer 25 in the ultrasonic switching device according to the eighth embodiment are substantially the same as those of input interdigital transducer 3 and output interdigital transducer 4 shown in FIG. 2. Input interdigital transducer 24 has an interdigital periodicity P of 290 $\mu$m and an overlap length L of 15 mm.

When operating the ultrasonic switching device according to the eighth embodiment, the circuit, in FIG. 4, except for using of input interdigital transducer 24 and output interdigital transducer 25 in place of input interdigital transducer 3 and output interdigital transducer 4, is available. If an electric signal having a frequency approximately corresponding to the interdigital periodicity P is applied to input interdigital transducer 24, an SH wave of the zeroth mode and the higher order modes is excited in the bilayer zone $B_T$. In this time, the SH wave having the wavelength approximately equal to the interdigital periodicity P can be excited effectively by employing input interdigital transducer 24 with only three finger pairs. If the phase velocity of the SH wave is approximately equal to the average value between the shear wave velocity traveling on nonpiezoelectric plate 23 alone and that traveling on first piezoelectric substrate 21 alone, the transducing efficiency from the electric signal to the SH wave is very large. In addition, it is possible to operate the ultrasonic switching device under low power consumption and low voltage.

The SH wave excited in the bilayer zone $B_T$ is transmitted, along the direction vertical to the finger direction of input interdigital transducer 24, to the bilayer zone $B_R$ through the monolayer zone, because the polarization axis of first piezoelectric substrate 21 is parallel to the finger direction of input interdigital transducer 24. As the thickness d of first piezoelectric substrate 21 and second piezoelectric substrate 22 is smaller than the interdigital periodicity P, and the thickness h of nonpiezoelectric plate 23 is approximately equal to or smaller than the thickness d, it is possible to increase the transmitting efficiency of the SH wave from the bilayer zone $B_T$ to the bilayer zone $B_R$ on condition that nonpiezoelectric plate 23 is made of a material such that the shear wave velocity traveling on nonpiezoelectric plate 23 alone is approximately equal to or lower than that traveling on first piezoelectric substrate 21 alone and second piezoelectric substrate 22 alone.

The SH wave transmitted to the bilayer zone $B_R$ is transduced to electric signals $E_{1a}$ and $E_{1b}$, at zones $R_{1a}$ and $R_{1b}$, respectively. Input interdigital transducer 24 and output interdigital transducer 25 form two ultrasound propagation lanes $Z_{1a}$ and $Z_{1b}$ in the monolayer zone. A switching ability of the ultrasonic switching device according to the eighth embodiment is displayed by touching on the upper- or lower end surface of the monolayer zone.

Figure 29:
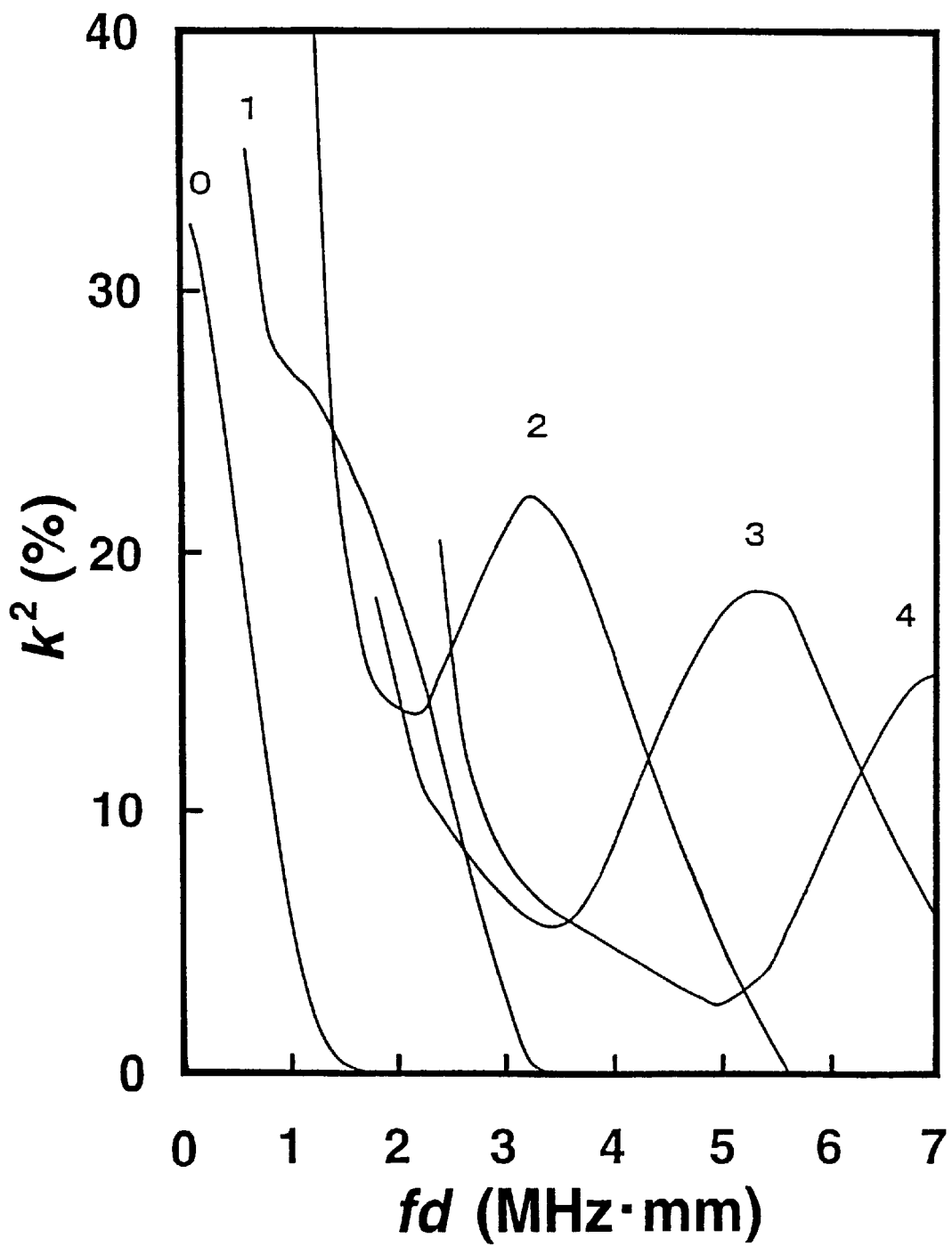
FIG. 29 shows a relationship between the $k^2$ value calculated from the difference between the phase velocity under electrically opened condition and that under electrically shorted condition of first piezoelectric substrate 21 of the bilayer zone $B_T$ in FIG. 28, and the fd value.

FIG. 29 shows a relationship between the $k^2$ value calculated from the difference between the phase velocity under electrically opened condition and that under electrically shorted condition of first piezoelectric substrate 21 of the bilayer zone $B_T$ in FIG. 28, and the product fd of the frequency f of the SH wave and the thickness d of first piezoelectric substrate 21. In FIG. 29, nonpiezoelectric plate 23 is made from a glass having a shear wave velocity of 1988 m/s and a longitudinal wave velocity of 3597 m/s traveling on the glass alone. The velocities of 1988 m/s and 3597 m/s are about 0.8 times the velocities of a shear- and a longitudinal waves, 2450 m/s and 4390 m/s, respectively, in first piezoelectric substrate 21 alone. It is clear that the zeroth mode SH wave and the higher order mode SH waves have large $k^2$ values. An electric energy applied to input interdigital transducer 24 is most effectively transduced, for example, to the second mode SH wave when the fd value is approximately 3.3 MHz.mm, then the $k^2$ value is approximately 22.5% being the maximum value.

Figure 30:
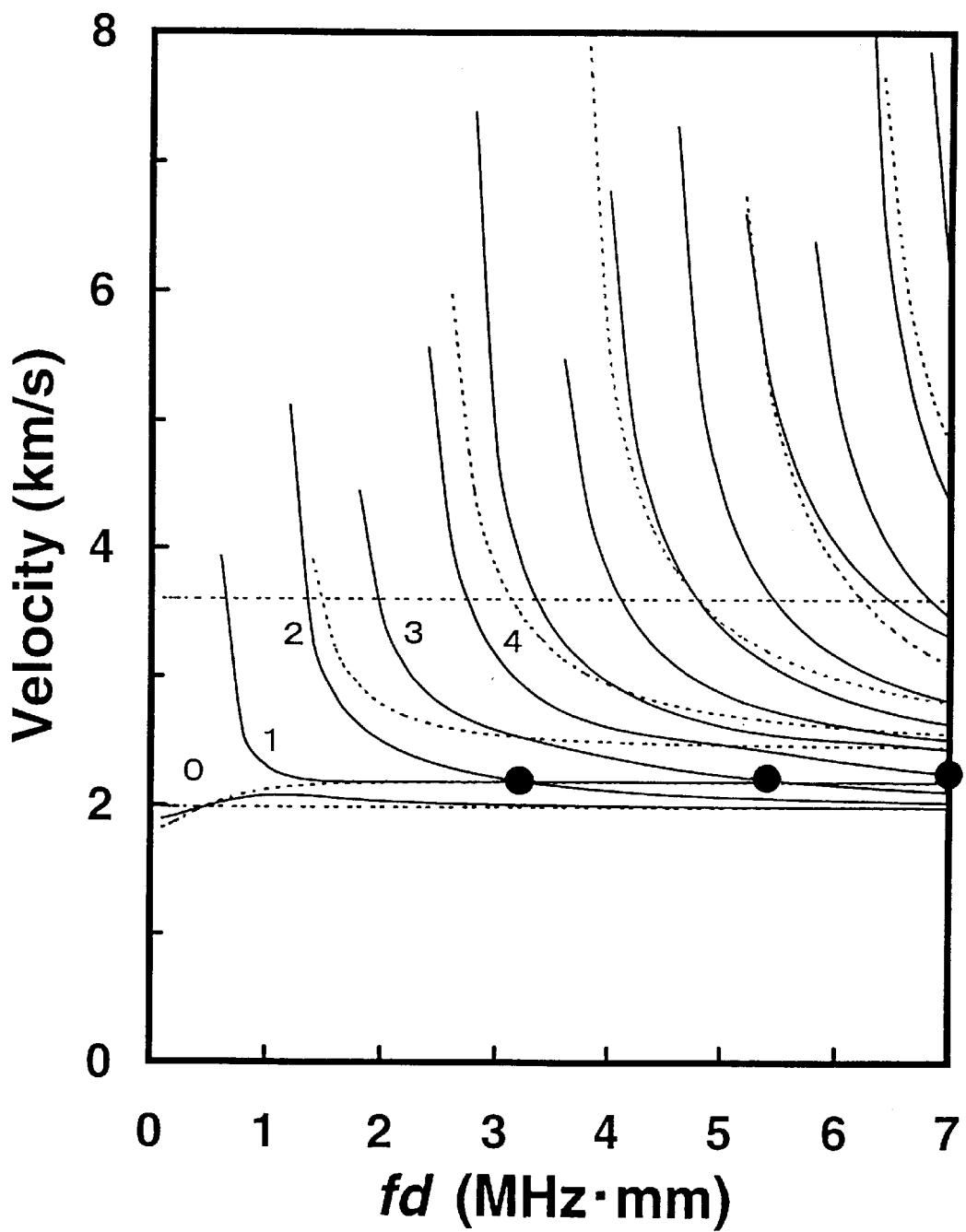
FIG. 30 shows a relationship between the phase velocity of the SH wave for each mode in the bilayer zone $B_T$ in FIG. 28, and the fd value.

FIG. 30 shows a relationship between the phase velocity of the SH wave for each mode in the bilayer zone $B_T$ in FIG. 28, and the fd value. In FIG. 30, nonpiezoelectric plate 23 is made from the same glass as FIG. 29. The fd value at each mark ● has the maximum $k^2$ value where an electric energy applied to input interdigital transducer 24 is most effectively transduced to the SH wave, the maximum $k^2$ value being obtained from FIG. 29. It is clear that the phase velocity at each mark ● is approximately equal to the average velocity (2219 m/s) between the shear wave velocity traveling on nonpiezoelectric plate 23 alone and that traveling on first piezoelectric substrate 21 alone. Thus, the fd value, at which the phase velocity of the SH wave excited in the bilayer zone $B_T$ is approximately equal to the average value between the shear wave velocity traveling on nonpiezoelectric plate 23 alone and that traveling on first piezoelectric substrate 21 alone, gives the maximum $k^2$ value.

In addition, it is possible to use output interdigital transducer 26 in place of output interdigital transducer 25 in the ultrasonic switching device according to the eighth embodiment in FIG. 28. Output interdigital transducer 26 with three finger pairs has the same construction as output interdigital transducer 5, except for the value of the interdigital periodicity and the number of finger pairs. When using output interdigital transducer 26, the relative positions of input interdigital transducer 24 and output interdigital transducer 26 in the ultrasonic switching device according to the eighth embodiment are substantially the same as those of input interdigital transducer 3 and output interdigital transducer 5 shown in FIG. 9. Moreover, it is possible to use input interdigital transducer 27 and output interdigital transducer 28 in place of input interdigital transducer 24 and output interdigital transducer 25 in the ultrasonic switching device according to the eighth embodiment. Input interdigital transducer 27 with three finger pairs has the same construction as input interdigital transducer 6, except for the value of the interdigital periodicity and the number of finger pairs. Output interdigital transducer 28 with three finger pairs has the same construction as output interdigital transducer 7, except for the value of the interdigital periodicity and the number of finger pairs. When using input interdigital transducer 27 and output interdigital transducer 28, the relative positions of input interdigital transducer 27 and output interdigital transducer 28 in the ultrasonic switching device according to the eighth embodiment are substantially the same as those of input interdigital transducer 6 and output interdigital transducer 7 shown in FIG. 11.

Figure 31:
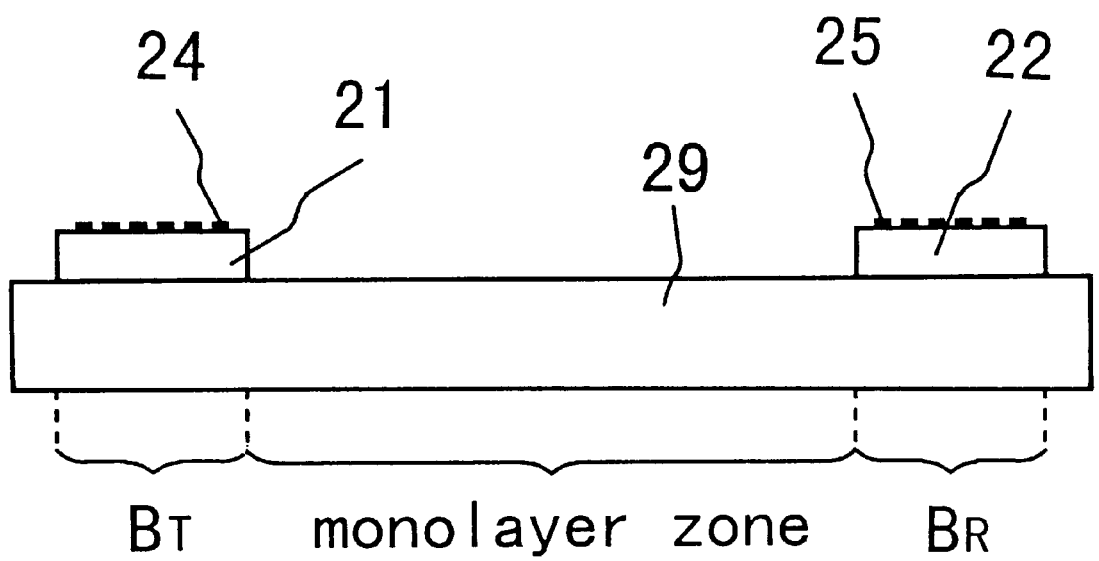
FIG. 31 shows a sectional view of an ultrasonic switching device according to a ninth embodiment of the present invention.

FIG. 31 shows a sectional view of an ultrasonic switching device according to a ninth embodiment of the present invention. The ultrasonic switching device comprises first piezoelectric substrate 21, second piezoelectric substrate 22, nonpiezoelectric plate 29, input interdigital transducer 24 and output interdigital transducer 25. Input interdigital transducer 24 is formed on the upper end surface of first piezoelectric substrate 21, of which the polarization axis is parallel to the finger direction of input interdigital transducer 24. Output interdigital transducer 25 is formed on the upper end surface of second piezoelectric substrate 22, of which the polarization axis is parallel to the finger direction of output interdigital transducer 25. First piezoelectric substrate 21 and second piezoelectric substrate 22 are cemented on the upper end surface of nonpiezoelectric plate 29 having a dimension of 400 μm in thickness h. Both the boundary surface of first piezoelectric substrate 21 and nonpiezoelectric plate 29, and that of second piezoelectric substrate 22 and nonpiezoelectric plate 29 are under electrically shorted condition. The relative positions of input interdigital transducer 24 and output interdigital transducer 25 in the ultrasonic switching device according to the ninth embodiment are substantially the same as those of input interdigital transducer 3 and output interdigital transducer 4 shown in FIG. 2.

When operating the ultrasonic switching device according to the ninth embodiment, the circuit, in FIG. 4, except for using of input interdigital transducer 24 and output interdigital transducer 25 in place of input interdigital transducer 3 and output interdigital transducer 4, is available. If an electric signal having a frequency approximately corresponding to the interdigital periodicity P is applied to input interdigital transducer 24, an SH wave of the zeroth mode and the higher order modes is excited in the bilayer zone $B_T$. In this time, the SH wave having the wavelength approximately equal to the interdigital periodicity P can be excited effectively by employing input interdigital transducer 24 with only three finger pairs. If the phase velocity of the SH wave approximates to the average value between the shear wave velocity traveling on nonpiezoelectric plate 29 alone and that traveling on first piezoelectric substrate 21 alone, the transducing efficiency from the electric signal to the SH wave is very large. In addition, it is possible to operate the ultrasonic switching device under low power consumption and low voltage.

The SH wave excited in the bilayer zone $B_T$ is transmitted, along the direction vertical to the finger direction of input interdigital transducer 24, to the bilayer zone $B_R$ through the upper end surface of the monolayer zone, because the polarization axis of first piezoelectric substrate 21 is parallel to the finger direction of input interdigital transducer 24. As the thickness d of first piezoelectric substrate 21 and second piezoelectric substrate 22 is smaller than the interdigital periodicity P, and the thickness h of nonpiezoelectric plate 29 is larger than the thickness d, it is possible to increase the transmitting efficiency of the SH wave from the bilayer zone $B_T$ to the bilayer zone $B_R$ on condition that nonpiezoelectric plate 29 is made of a material such that the shear wave velocity traveling on nonpiezoelectric plate 29 alone is higher than that traveling on first piezoelectric substrate 21 alone and second piezoelectric substrate 22 alone.

The SH wave transmitted to the bilayer zone $B_R$ is transduced to electric signals $E_{1a}$ and $E_{1b}$, at zones $R_{1a}$ and $R_{1b}$, respectively. Input interdigital transducer 24 and output interdigital transducer 25 form two ultrasound propagation lanes $Z_{1a}$ and $Z_{1b}$ on the upper end surface of the monolayer zone. A switching ability of the ultrasonic switching device according to the ninth embodiment is displayed by touching on the upper end surface of the monolayer zone.

Figure 32:
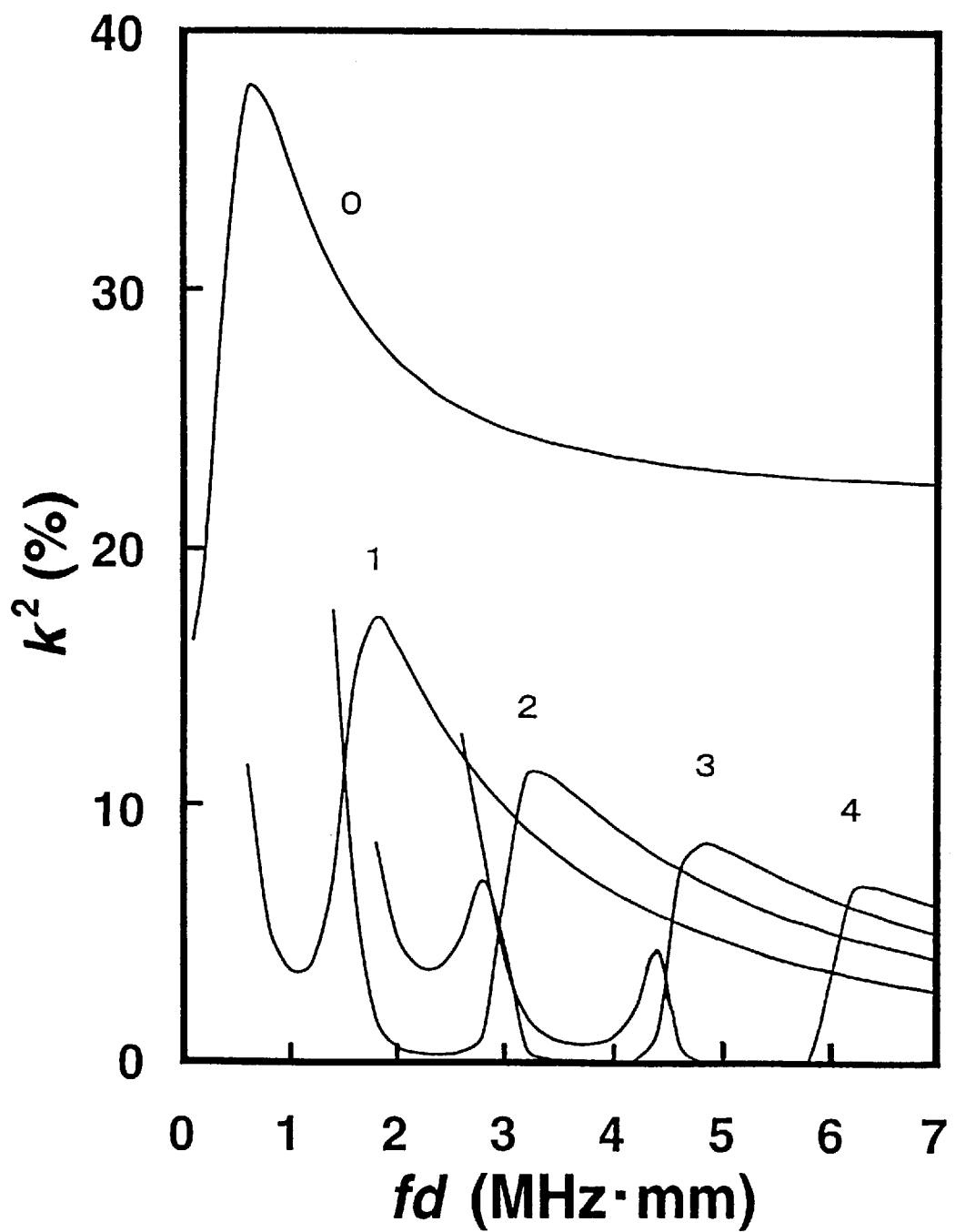
FIG. 32 shows a relationship between the $k^2$ value calculated from the difference between the phase velocity under electrically opened condition and that under electrically shorted condition of first piezoelectric substrate 21 of the bilayer zone $B_T$ in FIG. 31, and the fd value.

FIG. 32 shows a relationship between the $k^2$ value calculated from the difference between the phase velocity under electrically opened condition and that under electrically shorted condition of first piezoelectric substrate 21 of the bilayer zone $B_T$ in FIG. 31, and the fd value. In FIG. 32, nonpiezoelectric plate 29 is made from a glass having a shear wave velocity of 4203 m/s and a longitudinal wave velocity of 7604 m/s traveling on the glass alone. The velocities of 4203 m/s and 7604 m/s are about 1.7 times the velocities of a shear- and a longitudinal waves, 2450 m/s and 4390 m/s, respectively, in first piezoelectric substrate 21 alone. It is clear that the zeroth mode SH wave and the higher order mode SH waves have large $k^2$ values. An electric energy applied to input interdigital transducer 24 is most effectively transduced, for example, to the zeroth mode SH wave when the fd value is approximately 0.6 MHz.mm, then the $k^2$ value is approximately 33.8% being the maximum value.

Figure 33:
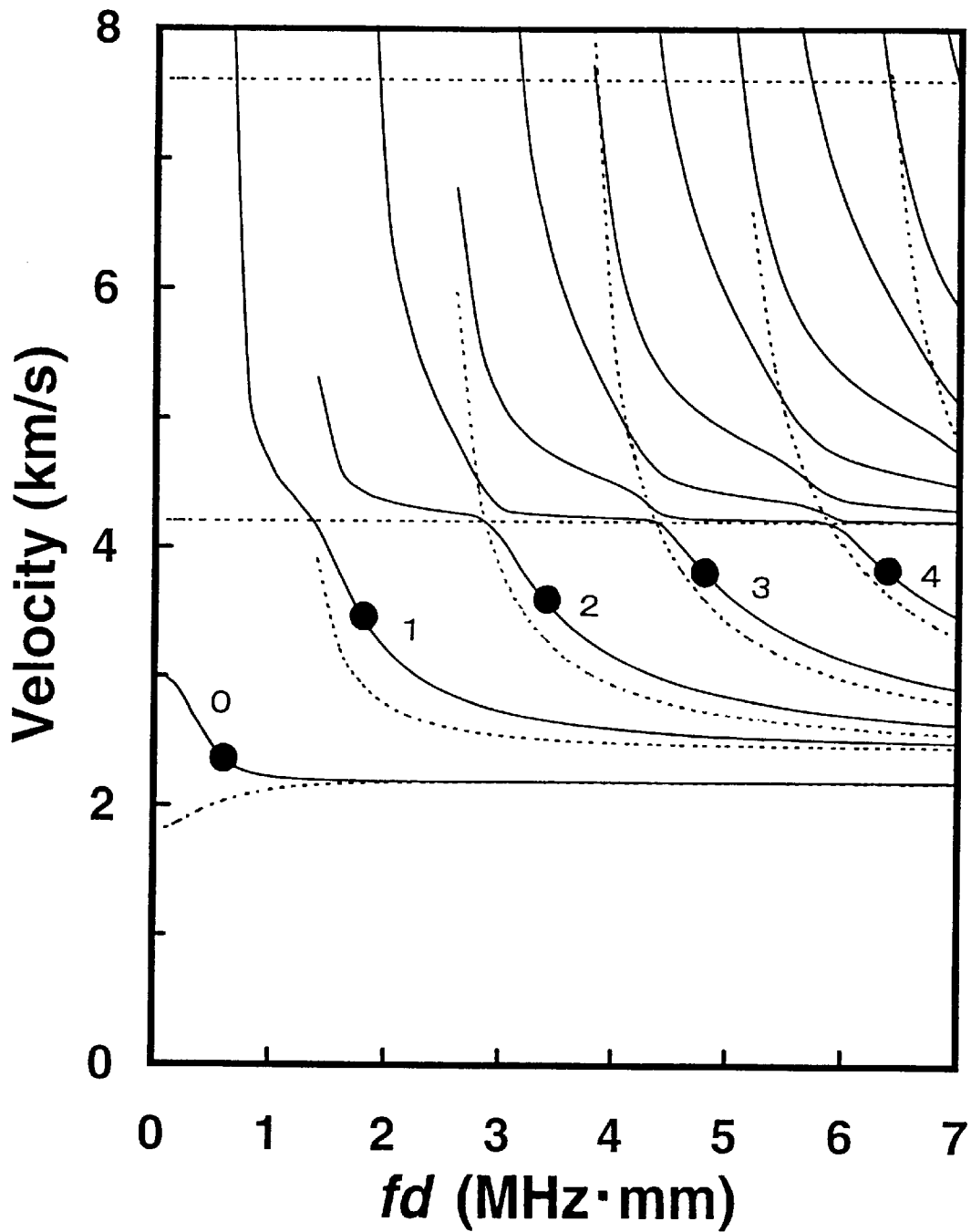
FIG. 33 shows a relationship between the phase velocity of the SH wave for each mode in the bilayer zone $B_T$ in FIG. 31, and the fd value.

FIG. 33 shows a relationship between the phase velocity of the SH wave for each mode in the bilayer zone $B_T$ in FIG. 31, and the fd value. In FIG. 33, nonpiezoelectric plate 29 is made from the same glass as FIG. 32. The fd value at each mark ● has the maximum $k^2$ value where an electric energy applied to input interdigital transducer 24 is most effectively transduced to the SH wave, the maximum $k^2$ value being obtained from FIG. 32. It is clear that the phase velocity at each mark ● is approximately equal to the average velocity (3327 m/s) between the shear wave velocity traveling on nonpiezoelectric plate 29 alone and that traveling on first piezoelectric substrate 21 alone. Thus, the fd value, at which the phase velocity of the SH wave excited in the bilayer zone $B_T$ is approximately equal to the average value between the shear wave velocity traveling on nonpiezoelectric plate 29 alone and that traveling on first piezoelectric substrate 21 alone, gives the maximum $k^2$ value.

In addition, it is possible not only to use output interdigital transducer 26 in place of output interdigital transducer 25, but also to use input interdigital transducer 27 and output interdigital transducer 28 in place of input interdigital transducer 24 and output interdigital transducer 25 in the ultrasonic switching device according to the ninth embodiment in FIG. 31.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic switching device comprising:

a piezoelectric substrate, made of a piezoelectric ceramic, having an upper- and a lower end surfaces running perpendicular to the direction of the thickness d thereof;

an input interdigital transducer formed on said upper end surface of said piezoelectric substrate and having an interdigital periodicity P and an overlap length L;

an output interdigital transducer formed on said upper end surface of said piezoelectric substrate, said output interdigital transducer having N finger-overlap zones $R_i$ (i= 1, 2, . . . , N) and N−1 finger-overlap zones $Q_i$ {i=1, 2, . . . ,(N−1)} between two finger-overlap zones $R_i$ and $R_{(i+1)}$, each finger-overlap zone $R_i$ comprising a first zone $R_{ia}$, a second zone $R_{ib}$ and a third zone $R_{im}$ between said zones $R_{ia}$ and $R_{ib}$, the finger direction of said zones $R_{ia}$ and $R_{ib}$, running parallel with that of said input interdigital transducer, an interdigital periodicity of said zones $R_{ia}$ and $R_{ib}$, being equal to said interdigital periodicity P, the finger direction of said zone $R_{im}$ being slanting to that of said input interdigital transducer by an angle α, said zone $R_{im}$ having an interdigital periodicity $P_{RN}$, which is vertical to said finger direction of said zone $R_{im}$ and equal to the product of said interdigital periodicity P and cos α, said zone $R_{im}$ having a first overlap length $L_{RP}$ along the finger direction thereof and a second overlap length $L_{RN}$ along the finger direction of said input interdigital transducer.

said overlap length $L_{RP}$ being equal to the product of said overlap length $L_{RN}$ and sec α as well as the product of half said interdigital periodicity P and cosec α, the finger direction of said finger-overlap zone $Q_i$ being slanting to that of said input interdigital transducer by an angle ±β, said finger-overlap zone $Q_i$ having an interdigital periodicity $P_{QN}$, which is vertical to said finger direction of said finger-overlap zone $Q_i$ and equal to the product of said interdigital periodicity P and cos β, said finger-overlap zone $Q_i$ having a first overlap length $L_{QP}$ along the finger direction thereof and a second overlap length $L_{QN}$ along the finger direction of said input interdigital transducer, said overlap length $L_{QP}$ being equal to the product of said overlap length $L_{QN}$ and sec β, and also being equal to the product of cosec β and said interdigital periodicity P divided by twice the number N of said finger-overlap zones $R_i$; and a nonpiezoelectric plate having an upper- and a lower end surfaces running perpendicular to the direction of the thickness h thereof, said lower end surface of said nonpiezoelectric plate being cemented on said upper end surface of said piezoelectric substrate through said input- and output interdigital transducers, said input interdigital transducer receiving an electric signal with a frequency approximately corresponding to said interdigital periodicity P, exciting a surface acoustic wave of the zeroth mode and the higher order modes on an area, in contact with said input interdigital transducer, of said upper end surface of said piezoelectric substrate, and transmitting said surface acoustic wave having the wavelength approximately equal to said interdigital periodicity P to an area, in contact with said output interdigital transducer, of said upper end surface of said piezoelectric substrate, through said nonpiezoelectric plate, said zones $R_{ia}$ and $R_{ib}$ transducing said surface acoustic wave to electric signals $E_{ia}$ and $E_{ib}$ (i=1, 2, . . . , N), respectively, the sum of said electric signals $E_{ia}$ and $E_{ib}$ being zero, said electric signals $E_{ia}$ and $E_{ib}$ having radio frequencies, said input- and output interdigital transducers forming N pairs of ultrasound propagation lanes $Z_{ia}$ and $Z_{ib}$ (i=1, 2, . . . , N), on said upper end surface of said nonpiezoelectric plate, corresponding to said zones $R_{ia}$ and $R_{ib}$, respectively, said output interdigital transducer delivering said electric signal $E_{ib}$ only when touching with a human finger or others on said lane $Z_{ia}$, and delivering said electric signal $E_{ia}$ only when touching on said lane $Z_{ib}$, said thickness d being larger than three times said interdigital periodicity P, the polarization axis of said piezoelectric substrate being parallel to the direction of said thickness d, said thickness h being smaller than said interdigital periodicity P, said nonpiezoelectric plate being made of a material such that the phase velocity of the surface acoustic wave traveling on said nonpiezoelectric plate alone is lower than that traveling on said piezoelectric substrate alone, the phase velocity of said surface acoustic wave of said zeroth mode being approximately equal to the phase velocity of the Rayleigh wave traveling on said piezoelectric substrate alone under the electrically shorted condition, the phase velocity of said surface acoustic wave of said higher order modes being approximately equal to the phase velocity of the Rayleigh wave traveling on said piezoelectric substrate alone under the electrically opened condition.

2. An ultrasonic switching device comprising:

a piezoelectric substrate having an upper- and a lower end surfaces running perpendicular to the direction of the thickness d thereof;

an input interdigital transducer formed on said upper end surface of said piezoelectric substrate and having N finger-overlap zones $A_i$ (i=1, 2, . . . , N) and N−1 finger-overlap zones $B_i$ {i=1, 2, . . . , (N−1)} between two finger-overlap zones $A_i$ and $A_{(i+1)}$;

an output interdigital transducer formed on said upper end surface of said piezoelectric substrate and having N+1 finger-overlap zones $C_i$ {i=1, 2, . . . , (N+1)} and N finger-overlap zones $D_i$ (i=1, 2, . . . , N) between two finger-overlap zones $C_i$ and $C_{(i+1)}$, the finger direction of said finger-overlap zones $A_i$ running parallel with that of said finger-overlap zones $C_i$, the finger direction of said finger-overlap zones $B_i$ being slanting to that of said finger-overlap zones $A_i$ by an angle −β, each finger-overlap zone $B_i$ having an interdigital periodicity $P_{BN}$, which is vertical to the finger direction of said finger-overlap zone $B_i$ and equal to the product of cos β and an interdigital periodicity P of said finger-overlap zones $A_i$ and $C_i$, each finger-overlap zone $B_i$ having a first overlap length $L_{BP}$ along the finger direction thereof and a second overlap length $L_{BN}$ along the finger direction of said finger-overlap zones $A_i$, said overlap length $L_{BP}$ being equal to the product of sec β and said overlap length $L_{BN}$, the finger direction of said finger-overlap zones $D_i$ being slanting to that of said finger-overlap zones $C_i$ by an angle α, each finger-overlap zone $D_i$ having an interdigital periodicity $P_{DN}$, which is vertical to the finger direction of said finger-overlap zone $D_i$ and equal to the product of cos α and said interdigital periodicity P, each finger-overlap zone $D_i$ having a first overlap length $L_{DP}$ along the finger direction thereof and a second overlap length $L_{DN}$ along the finger direction of said finger-overlap zones $C_i$, said overlap length $L_{DP}$ being equal to the product of sec α and said overlap length $L_{DN}$ as well as the product of half said interdigital periodicity P and cosec α; and a nonpiezoelectric plate having an upper- and a lower end surfaces running perpendicular to the direction of the thickness h thereof, said lower end surface of said nonpiezoelectric plate being cemented on said upper end surface of said piezoelectric substrate through said input- and output interdigital transducers, said input interdigital transducer receiving an electric signal with a frequency approximately corresponding to said interdigital periodicity P, exciting a surface acoustic wave of the zeroth mode and the higher order modes on an area, in contact with said input interdigital transducer, of said upper end surface of said piezoelectric substrate, and transmitting said surface acoustic wave having the wavelength approximately equal to said interdigital periodicity P to an area, in contact with said output interdigital transducer, of said upper end surface of said piezoelectric substrate, through said nonpiezoelectric plate, said output interdigital transducer transducing said surface acoustic wave to N electric signals $E_{ia}$ (i=1, 2, ..., N) and N electric signals $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N) on said upper end surface of said nonpiezoelectric plate, an ultrasound propagation lane $Z_{ia}$ existing between said finger-overlap zones $A_i$ and $C_i$, an ultrasound propagation lane $Z_{ib}$ existing between said finger-overlap zones $A_i$ and $C_{(i+1)}$, said output interdigital transducer delivering said electric signal $E_{ib}$ only when touching with a human finger or others on said lane $Z_{ia}$, and delivering said electric signal $E_{ia}$ only when touching on said lane $Z_{ib}$.

3. An ultrasonic switching device as defined in claim 2, wherein said overlap length $L_{BP}$ is equal to the product of cosec β and said interdigital periodicity P divided by twice the number N of said finger-overlap zones $A_i$.

4. An ultrasonic switching device as defined in claim 2, wherein said piezoelectric substrate is made of a piezoelectric ceramic.

5. An ultrasonic switching device as defined in claim 2, wherein said electric signals $E_{ia}$ and $E_{ib}$ have radio frequencies.

6. An ultrasonic switching device as defined in claim 2, wherein said thickness d is larger than three times said interdigital periodicity P, the polarization axis of said piezoelectric substrate being parallel to the direction of said thickness d, said thickness h being smaller than said interdigital periodicity P, said nonpiezoelectric plate being made of a material such that the phase velocity of the surface acoustic wave traveling on said nonpiezoelectric plate alone is lower than that traveling on said piezoelectric substrate alone, the phase velocity of said surface acoustic wave of said zeroth mode being approximately equal to the phase velocity of the Rayleigh wave traveling on said piezoelectric substrate alone under the electrically shorted condition, the phase velocity of said surface acoustic wave of said higher order modes being approximately equal to the phase velocity of the Rayleigh wave traveling on said piezoelectric substrate alone under the electrically opened condition.

7. An ultrasonic switching device comprising:

a first piezoelectric substrate having two end surfaces running perpendicular to the direction of the thickness d thereof;

a second piezoelectric substrate having two end surfaces running perpendicular to the direction of the thickness d thereof;

an input interdigital transducer formed on one end surface of said first piezoelectric substrate and having an interdigital periodicity P and an overlap length L;

an output interdigital transducer formed on one end surface of said second piezoelectric substrate, said output interdigital transducer having N finger-overlap zones $R_i$ (i=1, 2, ..., N), and N−1 finger-overlap zones $Q_i$ {i=1, 2, ..., (N−1)} between two finger-overlap zones $R_i$ and $R_{(i+1)}$, each finger-overlap zone $R_i$ comprising a first zone $R_{ia}$, a second zone $R_{ib}$, and a third zone $R_{im}$ between said zones $R_{ia}$ and $R_{ib}$, the finger direction of said zones $R_{ia}$ and $R_{ib}$ running parallel with that of said input interdigital transducer, an interdigital periodicity of said zones $R_{ia}$ and $R_{ib}$ being equal to said interdigital periodicity P, the finger direction of said zone $R_{im}$ being slanting to that of said input interdigital transducer by an angle α, said zone $R_{im}$ having an interdigital periodicity $P_{RN}$, which is vertical to said finger direction of said zone $R_{im}$ and equal to the product of said interdigital periodicity P and cos α, said zone $R_{im}$ having a first overlap length $L_{RP}$ along the finger direction thereof and a second overlap length $L_{RN}$ along the finger direction of said input interdigital transducer, said overlap length $L_{RP}$ being equal to the product of said overlap length $L_{RN}$ and sec α as well as the product of half said interdigital periodicity P and cosec α, the finger direction of said finger-overlap zone $Q_i$ being slanting to that of said input interdigital transducer by an angle ±β, said finger-overlap zone $Q_i$ having an interdigital periodicity $P_{QN}$, which is vertical to said finger direction of said finger-overlap zone $Q_i$ and equal to the product of said interdigital periodicity P and cos β, said finger-overlap zone $Q_i$ having a first overlap length $L_{QP}$ along the finger direction thereof and a second overlap length $L_{QN}$ along the finger direction of said input interdigital transducer, said overlap length $L_{QP}$ being equal to the product of said overlap length $L_{QN}$ and sec β; and a nonpiezoelectric plate having an upper- and a lower end surfaces running perpendicular to the direction of the thickness h thereof, said first- and second piezoelectric substrates being cemented on said upper end surface of said nonpiezoelectric plate, said input interdigital transducer receiving an electric signal with a frequency approximately corresponding to said interdigital periodicity P, exciting a surface acoustic wave of the first mode and the higher order modes in said first piezoelectric substrate, and transmitting said surface acoustic wave having the wavelength approximately equal to said interdigital periodicity P to said second piezoelectric substrate through said upper end surface of said nonpiezoelectric plate, said zones $R_{ia}$ and $R_{ib}$ transducing said surface acoustic wave to electric signals $E_{ia}$ and $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N), on said upper end surface of said nonpiezoelectric plate, corresponding to said zones $R_{ia}$ and $R_{ib}$, respectively, said output interdigital transducer delivering said electric signal $E_{ib}$ only when touching with a human finger or others on said lane $Z_{ia}$, and delivering said electric signal $E_{ia}$ only when touching on said lane $Z_{ib}$.

8. An ultrasonic switching device as defined in claim 7, wherein said overlap length $L_{QP}$ is equal to the product of cosec β and said interdigital periodicity P divided by twice the number N of said finger-overlap zones $R_i$.

9. An ultrasonic switching device as defined in claim 7, wherein said first- and second piezoelectric substrates are made of a piezoelectric ceramic, respectively.

10. An ultrasonic switching device as defined in claim 7, wherein said electric signals $E_{ia}$ and $E_{ib}$ have radio frequencies.

11. An ultrasonic switching device as defined in claim 7, wherein said thickness d is smaller than said interdigital periodicity P, the polarization axis of said first- and second piezoelectric substrates being parallel to the direction of said thickness d, said thickness h being larger than three times said interdigital periodicity P, said nonpiezoelectric plate being made of a material such that the phase velocity of the surface acoustic wave traveling on said nonpiezoelectric plate alone is higher than that traveling on said first- and second piezoelectric substrates alone, the phase velocity of said surface acoustic wave of said first mode and said higher order modes being approximately equal to the phase velocity of the Rayleigh wave traveling on said nonpiezoelectric plate alone.

12. An ultrasonic switching device comprising:

a first piezoelectric substrate having two end surfaces running perpendicular to the direction of the thickness d thereof;

a second piezoelectric substrate having two end surfaces running perpendicular to the direction of the thickness d thereof;

an input interdigital transducer formed on one end surface of said first piezoelectric substrate and having N finger-overlap zones $A_i$ (i=1, 2, ..., N) and N−1 finger-overlap zones $B_i$ {i=1, 2, ..., (N−1)} between two finger-overlap zones $A_i$ and $A_{(i+1)}$;

an output interdigital transducer formed on one end surface of said second piezoelectric substrate and having N+1 finger-overlap zones $C_i$ (i=1, 2, ..., (N+1) and N finger-overlap zones $D_i$ (i=1, 2, ..., N) between two finger-overlap zones $C_i$ and $C_{(i+1)}$;

the finger direction of said zones $A_i$ running parallel with that of said finger-overlap zones $C_i$, the finger direction of said finger-overlap zones $B_i$ being slanting to that of said finger-overlap zones $A_i$ by and angle −β, each finger-overlap zone $B_i$ having an interdigital periodicity $P_{BN}$, which is vertical to the finger direction of said finger-overlap zone $B_i$ and equal to the product of cos β and an interdigital periodicity P of said finger-overlap zones $A_i$ and $C_i$, each finger-overlap zone $B_i$ having a first overlap length $L_{BP}$ along the finger direction thereof and a second overlap length $L_{BN}$ along the finger direction of said finger-overlap zones $A_i$, said overlap length $L_{BP}$ being equal to the product of sec β and said overlap length $L_{BN}$, the finger direction of said finger-overlap zones $D_i$ being slanting to that of said finger-overlap zones $C_i$ by an angle α, each finger-overlap zone $D_i$ having an interdigital periodicity $P_{DN}$, which is vertical to the finger direction of said finger-overlap zone $D_i$ and equal to the product of cos α and said interdigital periodicity P, each finger-overlap zone $D_i$ having a first overlap length $L_{DP}$ along the finger direction thereof and a second overlap length $L_{DN}$ along the finger direction of said finger-overlap zones $C_i$, said overlap length $L_{DP}$ being equal to the product of sec α and said overlap length $L_{DN}$ as well as the product of half said interdigital periodicity P and cosec α; and a nonpiezoelectric plate having an upper- and a lower end surfaces running perpendicular to the direction of the thickness h thereof, said first- and second piezoelectric substrates being cemented on said upper end surface of said nonpiezoelectric plate, said input interdigital transducer receiving an electric signal with a frequency approximately corresponding to said interdigital periodicity P, exciting a surface acoustic wave of the first mode and the higher order modes in said first piezoelectric substrate, and transmitting said surface acoustic wave having the wavelength approximately equal to said interdigital periodicity P to said second piezoelectric substrate through said upper end surface of said nonpiezoelectric plate, said output interdigital transducer transducing said surface acoustic wave to N electric signals $E_{ia}$ (i=1, 2, ..., N), and N electric signals $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N), on said upper end surface of said nonpiezoelectric plate, an ultrasound propagation lane $Z_{ia}$ existing between said finger-overlap zones $A_i$ and $C_i$, an ultrasound propagation lane $Z_{ib}$ existing between said finger-overlap zones $A_i$ and $C_{(i+1)}$, said output interdigital transducer delivering said electric signal $E_{ib}$ only when touching with a human finger or others on said lane $Z_{ia}$, and delivering said electric signal $E_{ia}$ only when touching on said lane $Z_{ib}$.

13. An ultrasonic switching device as defined in claim 12, wherein said overlap length $L_{BP}$ is equal to the product of cosec β and said interdigital periodicity P divided by twice the number N of said finger-overlap zones $A_i$.

14. An ultrasonic switching device as defined in claim 12, wherein said first- and second piezoelectric substrates are made of a piezoelectric ceramic, respectively.

15. An ultrasonic switching device as defined in claim 12, wherein said electric signals $E_{ia}$ and $E_{ib}$ have radio frequencies.

16. An ultrasonic switching device as defined in claim 12, wherein said thickness d is smaller than said interdigital periodicity P, the polarization axis of said first- and second piezoelectric substrates being parallel to the direction of said thickness d, said thickness h being larger than three times said interdigital periodicity P, said nonpiezoelectric plate being made of a material such that the phase velocity of the surface acoustic wave traveling on said nonpiezoelectric plate alone is higher than that traveling on said first- and second piezoelectric substrates alone, the phase velocity of said surface acoustic wave of said first mode and said higher order modes being approximately equal to the phase velocity of the Rayleigh wave traveling on said nonpiezoelectric plate alone.

17. An ultrasonic switching device comprising:

a first piezoelectric substrate having two end surfaces running perpendicular to the direction of the thickness d thereof;

a second piezoelectric substrate having two end surfaces running perpendicular to the direction of the thickness d thereof;

an input interdigital transducer formed on one end surface of said first piezoelectric substrate and having an interdigital periodicity P and an overlap length L, said thickness d being smaller than said interdigital periodicity P;

an output interdigital transducer formed on one end surface of said second piezoelectric substrate, said output interdigital transducer having N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$, each finger-overlap zone $R_i$ comprising a first zone $R_{ia}$, a second zone $R_{ib}$, and a third zone $R_{im}$ between said zones $R_{ia}$ and $R_{ib}$, the finger direction of said zones $R_{ia}$ and $R_{ib}$, running parallel with that of said input interdigital transducer, an interdigital periodicity of said zones $R_{ia}$ and $R_{ib}$, being equal to said interdigital periodicity P, the finger direction of said zone $R_{im}$ being slanting to that of said input interdigital transducer by an angle α, said zone $R_{im}$ having an interdigital periodicity $P_{RN}$, which is vertical to said finger direction of said zone $R_{im}$ and equal to the product of said interdigital periodicity P and cos α, said zone $R_{im}$ having a first overlap length $L_{RP}$ along the finger direction thereof and a second overlap length $L_{RN}$ along the finger direction of said input interdigital transducer, said overlap length $L_{RP}$ being equal to the product of said overlap length $L_{RN}$ and sec α as well as the product of half said interdigital periodicity P and cosec α, the finger direction of said finger-overlap zone $Q_i$ being slanting to that of said input interdigital transducer by an angle ±β, said finger-overlap zone $Q_i$ having an interdigital periodicity $P_{QN}$, which is vertical to said finger direction of said finger-overlap zone $Q_i$ and equal to the product of said interdigital periodicity P and cos β, said finger-overlap zone $Q_i$ having a first overlap length $L_{QP}$ along the finger direction thereof and a second overlap length $L_{QN}$ along the finger direction of said input interdigital transducer, said overlap length $L_{QP}$ being equal to the product of said overlap length $L_{QN}$ and sec β; and a nonpiezoelectric plate having an upper, and a lower end surfaces running perpendicular to the direction of the thickness h thereof, said first- and second piezoelectric substrates being cemented on said upper- or lower end surface of said nonpiezoelectric plate, a part, adjacent to said first piezoelectric substrate, of said nonpiezoelectric plate, and said first piezoelectric substrate forming a bilayer zone $B_T$, a part, adjacent to said second piezoelectric substrate, of said nonpiezoelectric plate, and said second piezoelectric substrate forming a bilayer zone $B_R$, a remaining part, between said bilayer zones $B_T$ and $B_R$, of said nonpiezoelectric plate forming a monolayer zone, said input interdigital transducer receiving an electric signal with a frequency approximately corresponding to said interdigital periodicity P, exciting an ultrasound in said bilayer zone $B_T$, and transmitting said ultrasound to said bilayer zone $B_R$ through said monolayer zone, said zones $R_{ia}$ and $R_{ib}$ transducing said ultrasound to electric signals $E_{ia}$ and $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N), in said monolayer zone, corresponding to said zones $R_{ia}$ and $R_{ib}$, respectively, said output interdigital transducer delivering said electric signal $E_{ib}$ only when touching with a human finger or others on said lane $Z_{ia}$ of an upper- or a lower end surface of said monolayer zone, and delivering said electric signal $E_{ia}$ only when touching on said lane $Z_{ib}$ of said upper- or lower end surface of said monolayer zone.

18. An ultrasonic switching device as defined in claim 17, wherein said overlap length $L_{QP}$ is equal to the product of cosec β and said interdigital periodicity P divided by twice the number N of said finger-overlap zones $R_i$.

19. An ultrasonic switching device as defined in claim 17, wherein said first- and second piezoelectric substrates are made of a piezoelectric ceramic, respectively.

20. An ultrasonic switching device as defined in claim 17, wherein said electric signals $E_{ia}$ and $E_{ib}$ have radio frequencies.

21. An ultrasonic switching device as defined in claim 17, wherein the polarization axis of said first- and second piezoelectric substrates is parallel to the direction of said thickness d, said thickness h being smaller than said thickness d, said nonpiezoelectric plate being made of a material such that the phase velocity of the elastic wave traveling on said nonpiezoelectric plate alone is higher than that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

22. An ultrasonic switching device as defined in claim 17, wherein the polarization axis of said first- and second piezoelectric substrates is parallel to the direction of said thickness d, said thickness h being approximately equal to said thickness d, said nonpiezoelectric plate being made of a material such that the phase velocity of the elastic wave traveling on said nonpiezoelectric plate alone is approximately equal to that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

23. An ultrasonic switching device as defined in claim 17, wherein the polarization axis of said first- and second piezoelectric substrates is parallel to the direction of said thickness d, said thickness h being not only larger than said thickness d but also smaller than two times said thickness d, said nonpiezoelectric plate being made of a material such that the phase velocity of the elastic wave traveling on said nonpiezoelectric plate alone is lower than that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

24. An ultrasonic switching device as defined in claim 17, wherein said first- and second piezoelectric substrates are cemented on said upper- or lower end surface of said nonpiezoelectric plate through the other end surface of said first piezoelectric substrate and the other end surface of said second piezoelectric substrate, respectively, the boundary surface of said first- and second piezoelectric substrates to said nonpiezoelectric plate being not covered with a metal film, the polarization axis of said first- and second piezoelectric substrates being parallel to the finger direction of said input interdigital transducer, said thickness h being approximately equal to or smaller than said thickness d, said nonpiezoelectric plate being made of a material such that the shear wave velocity traveling on said nonpiezoelectric plate alone is approximately equal to or lower than that traveling on said first- and second piezoelectric substrates alone, said input interdigital transducer receiving an electric signal with a frequency approximately corresponding to said interdigital periodicity P, exciting an SH wave of the zeroth mode and the higher order modes in said bilayer zone $B_T$, and transmitting said SH wave, having the wavelength approximately equal to said interdigital periodicity P, to said bilayer zone $B_R$ through said monolayer zone, the phase velocity of said SH wave being approximately equal to the average value between the shear wave velocity traveling on said nonpiezoelectric plate alone and that traveling on said first- and second piezoelectric substrates alone.

25. An ultrasonic switching device as defined in claim 17, wherein said first- and second piezoelectric substrates are cemented on said upper end surface of said nonpiezoelectric plate through the other end surface of said first piezoelectric substrate and the other end surface of said second piezoelectric substrate, respectively, the boundary surface of said first- and second piezoelectric substrates to said nonpiezoelectric plate being covered with a metal film, the polarization axis of said first- and second piezoelectric substrates being parallel to the finger direction of said input interdigital transducer, said thickness h being not only larger than said thickness d but also smaller than two times said thickness d, said nonpiezoelectric plate being made of a material such that the shear wave velocity traveling on said nonpiezoelectric plate alone is higher than that traveling on said first- and second piezoelectric substrates alone, said input interdigital transducer receiving an electric signal with a frequency approximately corresponding to said interdigital periodicity P, exciting an SH wave of the zeroth mode and the higher order modes in said bilayer zone $B_T$, and transmitting said SH wave, having the wavelength approximately equal to said interdigital periodicity P, to said bilayer zone $B_R$ through an upper end surface of said monolayer zone, the phase velocity of said SH wave approximating to the average value between the shear wave velocity traveling on said nonpiezoelectric plate alone and that traveling on said first- and second piezoelectric substrates alone, said input- and output interdigital transducers forming N pairs of ultrasound propagation lanes $Z_{ia}$ and $Z_{ib}$ (i=1, 2, . . . , N), on said upper end surface of said monolayer zone, said output interdigital transducer delivering said electric signal $E_{ib}$ only when touching on said lane $Z_{ia}$, and delivering said electric signal $E_{ia}$ only when touching on said lane $Z_{ib}$.

26. An ultrasonic switching device comprising:

a first piezoelectric substrate having two end surfaces running perpendicular to the direction of the thickness d thereof;

a second piezoelectric substrate having two end surfaces running perpendicular to the direction of the thickness d thereof;

an input interdigital transducer formed on one end surface of said first piezoelectric substrate and having N finger-overlap zones $A_i$ (i=1, 2, ..., N) and N−1 finger-overlap zones $B_i$ {i=1, 2, ..., (N−1)} between two finger-overlap zones $A_i$ and $A_{(i+1)}$;

an output interdigital transducer formed on one end surface of said second piezoelectric substrate and having N+1 finger-overlap zones $C_i$ {i=1, 2, ..., (N+1)} and N finger-overlap zones $D_i$ (i=1, 2, ..., N) between two finger-overlap zones $C_i$ and $C_{(i+1)}$, the finger direction of said finger-overlap zones $A_i$ running parallel with that of said finger-overlap zones $C_i$, the finger direction of said finger-overlap zones $B_i$ being slanting to that of said finger-overlap zones $A_i$ by an angle $-\beta$, each finger-overlap zone $B_i$ having an interdigital periodicity $P_{BN}$, which is vertical to the finger direction of said finger-overlap zone $B_i$ and equal to the product of $\cos \beta$ and an interdigital periodicity P of said finger-overlap zones $A_i$ and $C_i$, each finger-overlap zone $B_i$ having a first overlap length $L_{BP}$ along the finger direction thereof and a second overlap length $L_{BN}$ along the finger direction of said finger-overlap zones $A_i$, said overlap length $L_{BP}$ being equal to the product of $\sec \beta$ and said overlap length $L_{BN}$, the finger direction of said finger-overlap zones $D_i$ being slanting to that of said finger-overlap zones $C_i$ by an angle $\alpha$, each finger-overlap zone $D_i$ having an interdigital periodicity $P_{DN}$, which is vertical to the finger direction of said finger-overlap zone $D_i$ and equal to the product of $\cos \alpha$ and said interdigital periodicity P, each finger-overlap zone $D_i$ having a first overlap length $L_{DP}$ along the finger direction thereof and a second overlap length $L_{DN}$ along the finger direction of said finger-overlap zones $C_i$, said overlap length $L_{DP}$ being equal to the product of $\sec \alpha$ and said overlap length $L_{DN}$ as well as the product of half said interdigital periodicity P and $\operatorname{cosec} \alpha$, said thickness d being smaller than said interdigital periodicity P;

and a nonpiezoelectric plate having an upper- and a lower end surfaces running perpendicular to the direction of the thickness h thereof, said first- and second piezoelectric substrates being cemented on said upper- or lower end surface of said nonpiezoelectric plate, a part, adjacent to said first piezoelectric substrate, of said nonpiezoelectric plate, and said first piezoelectric substrate forming a bilayer zone $B_T$, a part, adjacent to said second piezoelectric substrate, of said nonpiezoelectric plate, and said second piezoelectric substrate forming a bilayer zone $B_R$, a remaining part, between said bilayer zones $B_T$ and $B_R$, of said nonpiezoelectric plate forming a monolayer zone, said input interdigital transducer receiving an electric signal with a frequency approximately corresponding to said interdigital periodicity P, exciting an ultrasound in said bilayer zone $B_T$, and transmitting said ultrasound to said bilayer zone $B_R$ through said monolayer zone, said output interdigital transducer transducing said ultrasound to N electric signals $E_{ia}$ (i=1, 2, ..., N) and N electric signals $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N) in said monolayer zone, an ultrasound propagation lane $Z_{ia}$ existing between said finger-overlap zones $A_i$ and $C_i$, an ultrasound propagation lane $Z_{ib}$ existing between said finger-overlap zones $A_i$ and $C_{(i+1)}$, said output interdigital transducer delivering said electric signal $E_{ib}$ only when touching with a human finger or others on said lane $Z_{ia}$ of an upper- or a lower end surface of said monolayer zone, and delivering said electric signal $E_{ia}$ only when touching on said lane $Z_{ib}$ upper- or lower end surface of said monolayer zone.

27. An ultrasonic switching device as defined in claim 26, wherein said overlap length $L_{BP}$ is equal to the product of $\operatorname{cosec} \beta$ and said interdigital periodicity P divided by twice the number N of said finger-overlap zones $A_i$.

28. An ultrasonic switching device as defined in claim 26, wherein said first- and second piezoelectric substrate are made of a piezoelectric ceramic, respectively.

29. An ultrasonic switching device as defined in claim 26, wherein said electric signals $E_{ia}$ and $E_{ib}$ have radio frequencies.

30. An ultrasonic switching device as defined in claim 26, wherein the polarization axis of said first- and second piezoelectric substrates is parallel to the direction of said thickness d, said thickness h being smaller than said thickness d, said nonpiezoelectric plate being made of a material such that the phase velocity of the elastic wave traveling on said nonpiezoelectric plate alone is higher than that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

31. An ultrasonic switching device as defined in claim 26, wherein the polarization axis of said first- and second piezoelectric substrates is parallel to the direction of said thickness d, said thickness h being approximately equal to said thickness d, said nonpiezoelectric plate being made of a material such that the phase velocity of the elastic wave traveling on said nonpiezoelectric plate alone is approximately equal to that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

32. An ultrasonic switching device as defined in claim 26, wherein the polarization axis of said first- and second piezoelectric substrates is parallel to the direction of said thickness d, said thickness h being not only larger than said thickness d but also smaller than two times said thickness d, said nonpiezoelectric plate being made of a material such that the phase velocity of the elastic wave traveling on said nonpiezoelectric plate alone is lower than that traveling on said first- and second piezoelectric substrates alone, said input interdigital transducer receiving an electric signal with a frequency approximately corresponding to said interdigital periodicity P, exciting an elastic wave of the $S_0$ mode and the higher order modes in said bilayer zone $B_T$, and transmitting said elastic wave, having the wavelength approximately equal to said interdigital periodicity P, to said bilayer zone $B_R$ through said monolayer zone, the phase velocity of said elastic wave being approximately equal to the longitudinal wave velocity in said first- and second piezoelectric substrates.

33. An ultrasonic switching device as defined in claim 26, wherein said first- and second piezoelectric substrates are cemented on said upper- or lower end surface of said nonpiezoelectric plate through the other end surface of said first piezoelectric substrate and the other end surface of said second piezoelectric substrate, respectively, the boundary surface of said first- and second piezoelectric substrates to said nonpiezoelectric plate being not covered with a metal film, the polarization axis of said first- and second piezoelectric substrates being parallel to the finger direction of said input interdigital transducer, said thickness h being approximately equal to or smaller than said thickness d, said nonpiezoelectric plate being made of a material such that the shear wave velocity traveling on said nonpiezoelectric plate alone is approximately equal to or lower than that traveling on said first- and second piezoelectric substrates alone, said input interdigital transducer receiving an electric signal with a frequency approximately corresponding to said interdigital periodicity P, exciting an SH wave of the zeroth mode and the higher order modes in said bilayer zone $B_T$, and transmitting said SH wave, having the wavelength approximately equal to said interdigital periodicity P, to said bilayer zone $B_R$ through said monolayer zone, the phase velocity of said SH wave being approximately equal to the average value between the shear wave velocity traveling on said nonpiezoelectric plate alone and that traveling on said first- and second piezoelectric substrates alone.

34. An ultrasonic switching device as defined in claim 26, wherein said first- and second piezoelectric substrates are cemented on said upper end surface of said nonpiezoelectric plate through the other end surface of said first piezoelectric substrate and the other end surface of said second piezoelectric substrate, respectively, the boundary surface of said first- and second piezoelectric substrates to said nonpiezoelectric plate being covered with a metal film, the polarization axis of said first- and second piezoelectric substrates being parallel to the finger direction of said input interdigital transducer, said thickness h being not only larger than said thickness d but also smaller than two times said thickness d, said nonpiezoelectric plate being made of a material such that the shear wave velocity traveling on said nonpiezoelectric plate alone is higher than that traveling on said first- and second piezoelectric substrates alone, said input interdigital transducer receiving an electric signal with a frequency approximately corresponding to said interdigital periodicity P, exciting an SH wave of the zeroth mode and the higher order modes in said bilayer zone $B_T$, and transmitting said SH wave, having the wavelength approximately equal to said interdigital periodicity P, to said bilayer zone $B_R$ through an upper end surface of said monolayer zone, the phase velocity of said SH wave approximating to the average value between the shear wave velocity traveling on said nonpiezoelectric plate alone and that traveling on said first- and second piezoelectric substrates alone, said input- and output interdigital transducers forming N pairs of ultrasound propagation lanes $Z_{ia}$ and $Z_{ib}$ (i=1, 2, ..., N), on said upper end surface of said monolayer zone, said output interdigital transducer delivering said electric signal $E_{ib}$ only when touching on said lane $Z_{ia}$, and delivering said electric signal $E_{ia}$ only when touching on said lane $Z_{ib}$.

* * * * *